United States Patent
Manda et al.

(10) Patent No.: US 10,615,298 B2
(45) Date of Patent: Apr. 7, 2020

(54) PHOTOELECTRIC CONVERSION ELEMENT, METHOD FOR MANUFACTURING SAME, AND IMAGING APPARATUS

(71) Applicant: SONY CORPORATION, Tokyo (JP)

(72) Inventors: Shuji Manda, Kanagawa (JP); Atsushi Okuyama, Kanagawa (JP); Ryosuke Matsumoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/083,070

(22) PCT Filed: Feb. 8, 2017

(86) PCT No.: PCT/JP2017/004578
§ 371 (c)(1),
(2) Date: Sep. 7, 2018

(87) PCT Pub. No.: WO2017/159130
PCT Pub. Date: Sep. 21, 2017

(65) Prior Publication Data
US 2019/0081191 A1 Mar. 14, 2019

(30) Foreign Application Priority Data

Mar. 16, 2016 (JP) ................................ 2016-051950
Sep. 28, 2016 (JP) ................................ 2016-189568

(51) Int. Cl.
*H01L 31/0304* (2006.01)
*H01L 27/146* (2006.01)
(Continued)

(52) U.S. Cl.
CPC ...... *H01L 31/0304* (2013.01); *H01L 27/1463* (2013.01); *H01L 27/14621* (2013.01);
(Continued)

(58) Field of Classification Search
CPC ............... H01L 31/0304; H01L 31/109; H01L 31/03046; H01L 31/1884; H01L 31/02164;
(Continued)

(56) References Cited

U.S. PATENT DOCUMENTS

| 5,602,414 A | 2/1997 | Mitsui et al. |
| 2008/0006894 A1* | 1/2008 | Tanaka .................. H01L 23/481 257/432 |

(Continued)

FOREIGN PATENT DOCUMENTS

| JP | H02-058878 | 2/1990 |
| JP | H06-326342 | 11/1994 |

(Continued)

OTHER PUBLICATIONS

International Search Report prepared by the Japan Patent Office dated Apr. 24, 2017, for International Application No. PCT/JP2017/004578.

*Primary Examiner* — Victor A Mandala
(74) *Attorney, Agent, or Firm* — Sheridan Ross P.C.

(57) ABSTRACT

A photoelectric conversion element includes: a first compound semiconductor layer 31 made of a first compound semiconductor material having a first conductivity type; a photoelectric conversion layer 34 formed on the first compound semiconductor layer 31; a second compound semiconductor layer 32 covering the photoelectric conversion layer 34 and made of a second compound semiconductor material having the first conductivity type; a second conductivity type region 35 formed at least in a part of the second compound semiconductor layer 32, having a second conductivity type different from the first conductivity type, and reaching the photoelectric conversion layer; an element isolation layer 34 surrounding a lateral surface of the photoelectric conversion layer; a first electrode 51 formed on the (Continued)

second conductivity type region; and a second electrode 52 electrically connected to the first compound semiconductor layer 31.

14 Claims, 44 Drawing Sheets

(51) Int. Cl.
| | | |
|---|---|---|
| *H01L 31/109* | (2006.01) | |
| *H01L 31/0216* | (2014.01) | |
| *H01L 31/0224* | (2006.01) | |
| *H01L 31/18* | (2006.01) | |
| *H04N 5/374* | (2011.01) | |
| *H04N 5/378* | (2011.01) | |
| *H01L 51/42* | (2006.01) | |

(52) U.S. Cl.
CPC .. *H01L 27/14623* (2013.01); *H01L 27/14645* (2013.01); *H01L 27/14649* (2013.01); *H01L 27/14689* (2013.01); *H01L 27/14694* (2013.01); *H01L 31/02164* (2013.01); *H01L 31/022408* (2013.01); *H01L 31/022466* (2013.01); *H01L 31/03046* (2013.01); *H01L 31/109* (2013.01); *H01L 31/1844* (2013.01); *H01L 31/1884* (2013.01); *H04N 5/374* (2013.01); *H04N 5/378* (2013.01); *H01L 27/14627* (2013.01); *H01L 51/4253* (2013.01)

(58) Field of Classification Search
CPC ......... H01L 31/1844; H01L 31/022408; H01L 31/022466; H01L 27/14694; H01L 27/14689; H01L 27/14649; H01L 27/14645; H01L 27/1463; H01L 27/14623; H01L 27/14621; H01L 51/4253; H01L 27/14627; H04N 5/374; H04N 5/378

See application file for complete search history.

(56) References Cited

U.S. PATENT DOCUMENTS

| | | |
|---|---|---|
| 2012/0068207 A1 | 3/2012 | Hata et al. |
| 2014/0110762 A1* | 4/2014 | Ha ................... H01L 27/14616 257/225 |
| 2014/0291793 A1* | 10/2014 | Tanaka ............. H01L 27/14623 257/435 |
| 2016/0064429 A1* | 3/2016 | Iida .................... H01L 27/1461 348/311 |
| 2017/0229493 A1* | 8/2017 | Harada ................. H01L 27/098 |
| 2018/0081099 A1* | 3/2018 | Toda ....................... G02B 5/28 |

FOREIGN PATENT DOCUMENTS

| | | |
|---|---|---|
| JP | H07-014996 | 1/1995 |
| JP | 2005-286004 | 10/2005 |
| JP | 2011-014896 | 1/2011 |
| JP | 2012-244124 | 12/2012 |

* cited by examiner

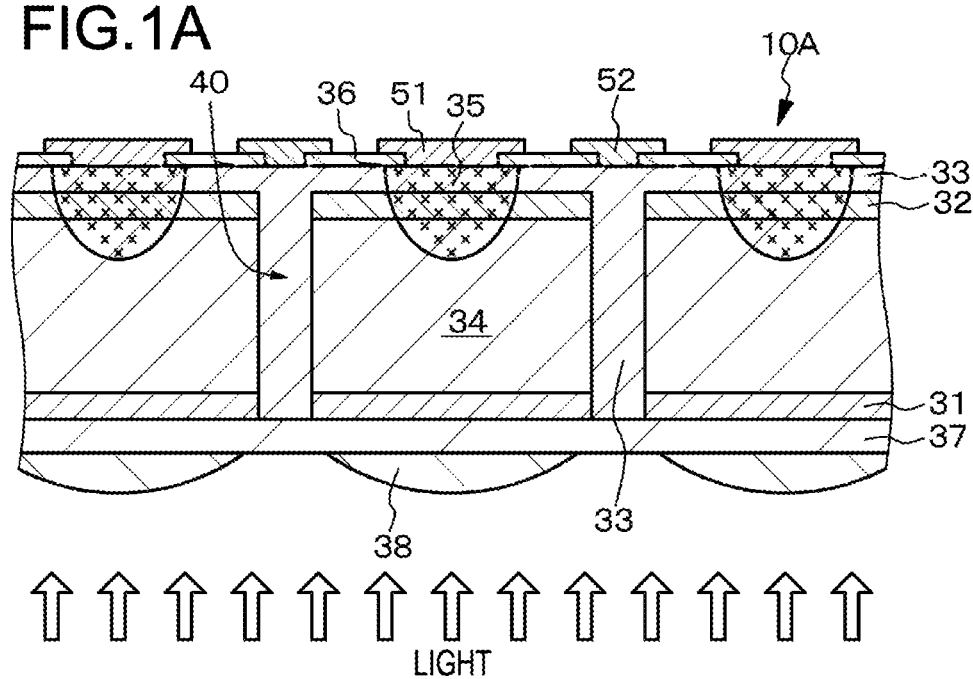
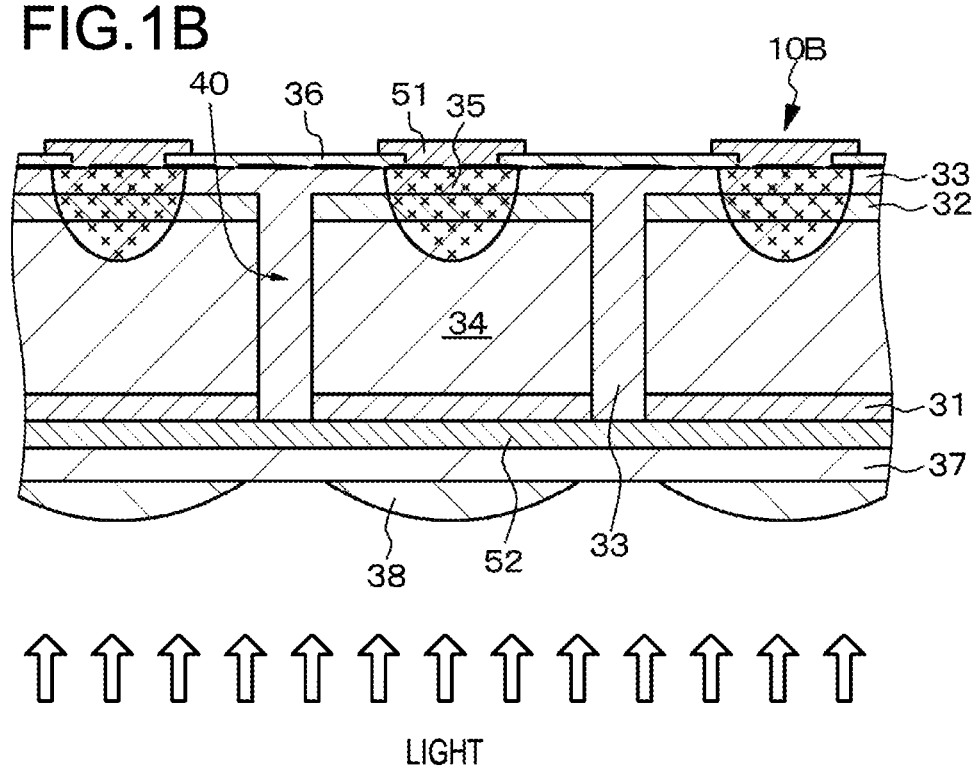

FIG.2A
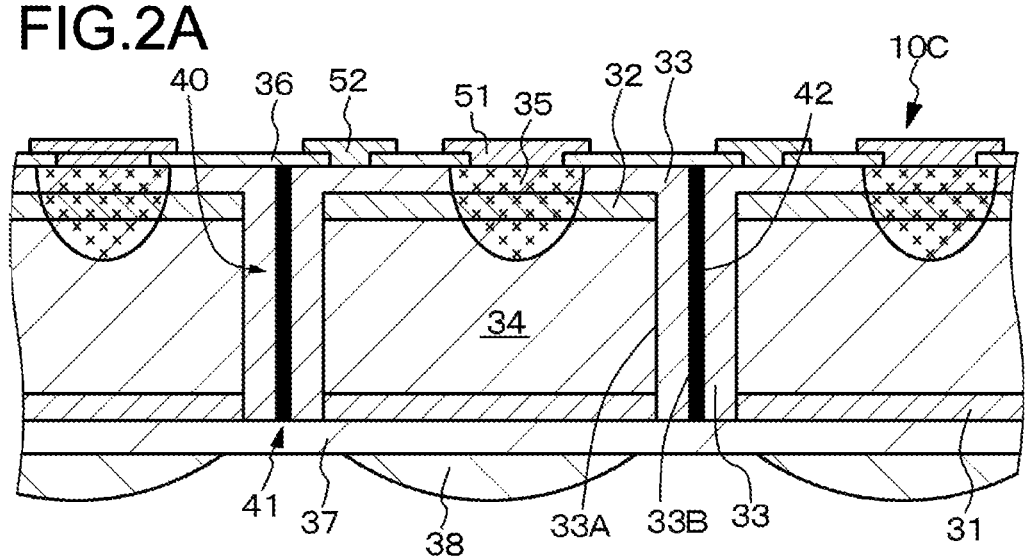
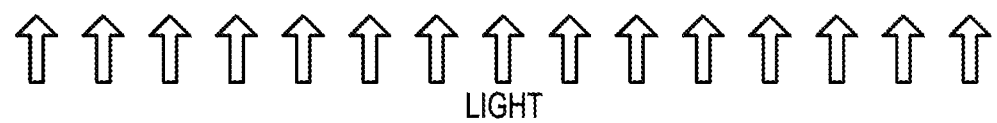
LIGHT
FIG.2B
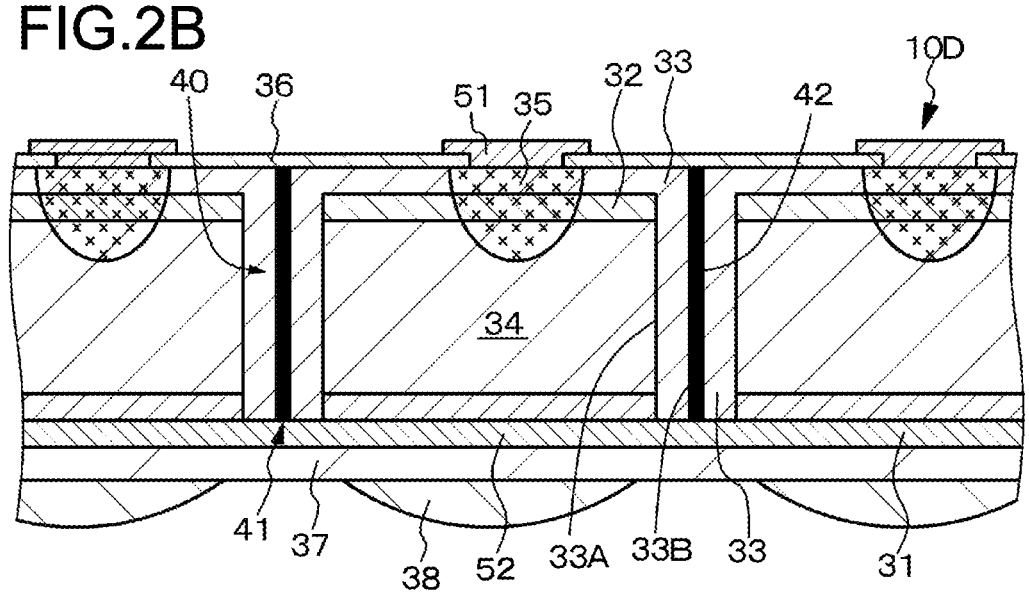
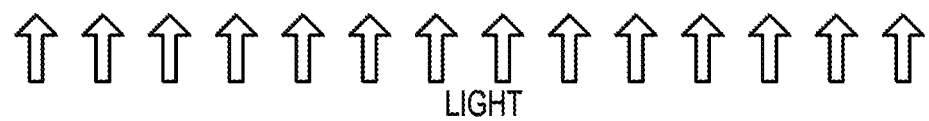
LIGHT

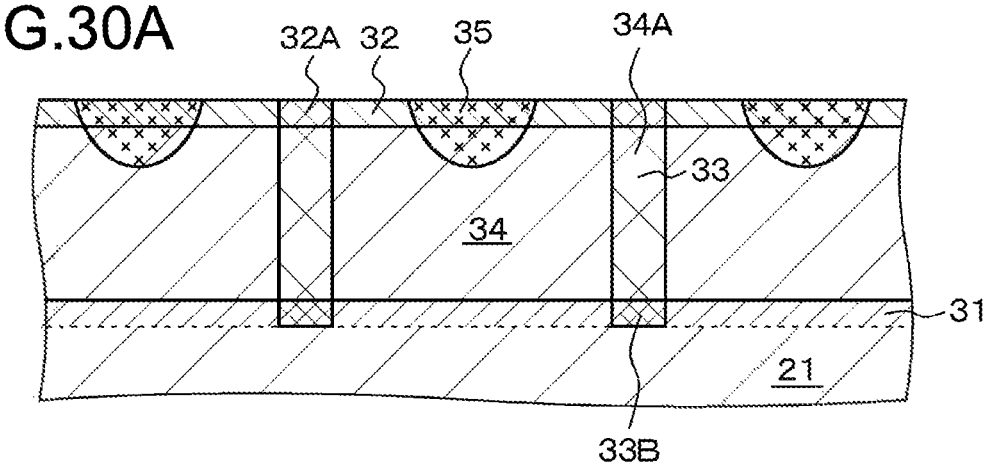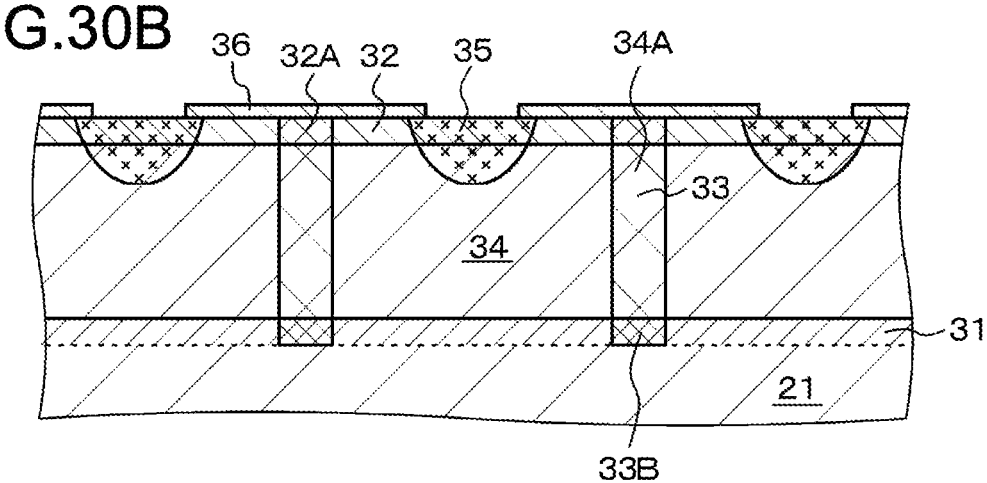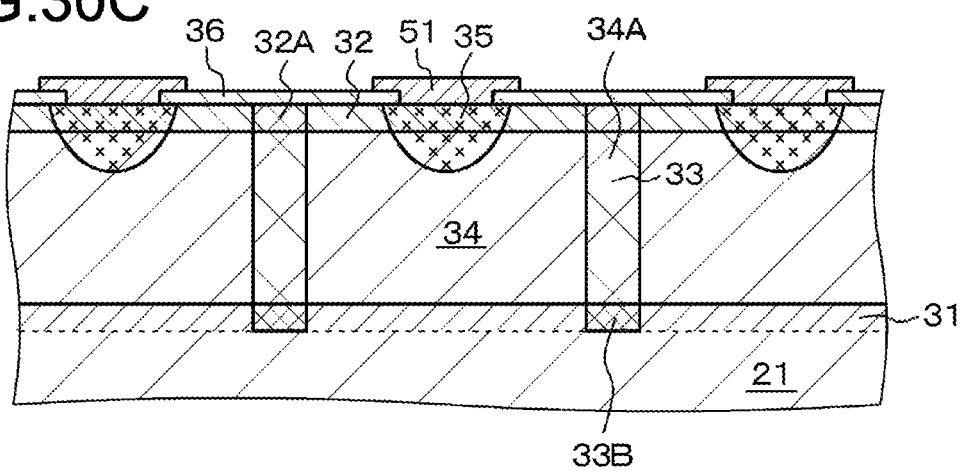

PHOTOELECTRIC CONVERSION ELEMENT, METHOD FOR MANUFACTURING SAME, AND IMAGING APPARATUS

CROSS REFERENCE TO RELATED APPLICATIONS

This application is a national stage application under 35 U.S.C. 371 and claims the benefit of PCT Application No. PCT/JP2017/004578 having an international filing date of 8 Feb. 2017, which designated the United States, which PCT application claimed the benefit of Japanese Patent Application No. 2016-051950 filed 16 Mar. 2016, and Japanese Patent Application No. 2016-189568 filed 28 Sep. 2016, the entire disclosures of each of which are incorporated herein by reference.

TECHNICAL FIELD

The present technology relates to a photoelectric conversion element, a method for manufacturing the same, and an imaging apparatus.

BACKGROUND ART

In general, an imaging apparatus includes photoelectric conversion elements (light-receiving elements, photodiodes, or imaging elements) formed on a silicon semiconductor substrate. Meanwhile, the light absorption coefficient of silicon (Si) is uniquely determined when the wavelength of incident light is determined. Accordingly, in order to cause light, particularly light of red to a near-infrared wavelength region to be efficiently absorbed in the silicon semiconductor substrate, the photoelectric conversion elements are required to be formed in a region of the silicon semiconductor substrate in a place deep (specifically, for example, about 10 µm) from a light incident surface. This represents that the aspect ratio of the photoelectric conversion elements increases as pixels in the imaging apparatus are miniaturized.

However, the increase in the aspect ratio of the photoelectric conversion elements causes a problem such as inter-pixel color mixture in which light incident on another photoelectric conversion element adjacent to one photoelectric conversion element is also incident on the one photoelectric conversion element. When the aspect ratio of the photoelectric conversion elements is decreased to reduce the inter-pixel color mixture, a problem such as reduction in the sensitivity of the photoelectric conversion elements from red to the near-infrared wavelength region is caused. In addition, Si cannot detect infrared light having a wavelength of 1.1 µm or greater in principle since its band gap energy is 1.1 eV. It is possible to detect infrared light with, for example, a photoelectric conversion layer having the laminated structure of an InP layer and an InGaAs layer instead of Si (see, for example, Japanese Patent Application Laid-open No. 2012-244124). That is, a light-receiving element array disclosed in the publication of the patent application is a light-receiving element array having light-receiving sensitivity in a near-infrared wavelength region and formed in the laminated body of a group III-V compound semiconductor, the light-receiving element array having arranged therein a plurality of light-receiving parts having band gap energy corresponding to the near-infrared wavelength region. Further, the light-receiving parts have a pn-junction at the tip end of a first conductivity type region formed by selective diffusion. In addition, a second conductivity type region is positioned between the light-receiving parts so as to divide the light-receiving parts. Here, the second conductivity type region is formed on the basis of an ion injection method or a selective diffusion method.

CITATION LIST

Patent Literature

Patent Literature 1: Japanese Patent Application Laid-open No. 2012-244124

DISCLOSURE OF INVENTION

Technical Problem

In the light-receiving element array disclosed in the publication of the patent application, the adjacent light-receiving parts are divided by the second conductivity type region, and the second conductivity type region is formed by the ion injection method or the diffusion method. However, these methods are likely to cause a crystal defect in the laminated body of a group III-V compound semiconductor and have a limitation in miniaturizing light-receiving parts in controlling the diffusion of an impurity having a second conductivity type.

Accordingly, it is an object of the present technology to provide a photoelectric conversion element having a region that divides adjacent photoelectric conversion elements, the photoelectric conversion element having no fear (or having less likelihood) of causing a crystal defect or the like during its formation and capable of reliably addressing miniaturization, a method for manufacturing the photoelectric conversion element, and an imaging apparatus including the photoelectric conversion element.

Solution to Problem

In order to accomplish the above-mentioned object, a photoelectric conversion element of the present technology includes:

a first compound semiconductor layer made of a first compound semiconductor material having a first conductivity type;

a photoelectric conversion layer formed on the first compound semiconductor layer;

a second compound semiconductor layer covering the photoelectric conversion layer and made of a second compound semiconductor material having the first conductivity type;

a second conductivity type region formed at least in a part of the second compound semiconductor layer, having a second conductivity type different from the first conductivity type, and reaching the photoelectric conversion layer;

an element isolation layer surrounding a lateral surface of the photoelectric conversion layer;

a first electrode formed on the second conductivity type region; and a second electrode electrically connected to the first compound semiconductor layer.

Here, the element isolation layer may be formed also on the second compound semiconductor layer in some cases depending on a material constituting the element isolation layer. In addition, the second conductivity type region is formed at least in a part of the second compound semiconductor layer. Specifically, the second conductivity type region is formed in a part of the second compound semiconductor layer or formed in a part of the second compound semiconductor layer and a part of the element isolation layer depending on a material constituting the element isolation layer. The second compound semiconductor layer covers the photoelectric conversion layer but may also cover the element isolation layer depending on a material constituting the element isolation layer in some cases.

In order to accomplish the above-mentioned object, an imaging apparatus of the present technology is constituted by a plurality of photoelectric conversion elements each of which is the photoelectric conversion element of the present technology, the plurality of photoelectric conversion elements being arranged in a two-dimensional matrix form.

In order to accomplish the above-mentioned object, a method for manufacturing a photoelectric conversion element according to a first aspect of the present technology includes the steps of:

(A) sequentially forming, on a substrate,
a first compound semiconductor layer made of a first compound semiconductor material having a first conductivity type,
a photoelectric conversion layer, and
a second compound semiconductor layer made of a second compound semiconductor material having the first conductivity type;
(B) forming a recess part at least in the second compound semiconductor layer and the photoelectric conversion layer;
(C) forming an element isolation layer at least inside the recess part;
(D) forming a second conductivity at least in a part of the second compound semiconductor layer, the second conductivity type region having a second conductivity type different from the first conductivity type and reaching the photoelectric conversion layer; and
(E) forming a first electrode on the second conductivity type region and forming a second electrode electrically connected to the first compound semiconductor layer.

In the method for manufacturing the photoelectric conversion element according to the first aspect of the present technology, the recess part is formed at least in the second compound semiconductor layer and the photoelectric conversion layer in the above step (B). Specifically, the recess part may be formed in the second compound semiconductor layer and the photoelectric conversion layer or may be formed in the second compound semiconductor layer, the photoelectric conversion layer, and the first compound semiconductor layer. In addition, the element isolation layer is formed at least inside the recess part in the above step (C). Specifically, the element isolation layer may be formed inside the recess part or may be formed inside the recess part and on the second compound semiconductor layer depending on a material constituting the element isolation layer. Moreover, the second conductivity type region is formed at least in a part of the second compound semiconductor layer in the above step (D). Specifically, the second conductivity type region may be formed in a part of the second compound semiconductor layer or may be formed in a part of the second compound semiconductor layer and a part of the element isolation layer depending on a material constituting the element isolation layer.

In order to accomplish the above-mentioned object, a method for manufacturing a photoelectric conversion element according to a second aspect of the present technology includes the steps of:

(A) sequentially forming, on a substrate,
a first compound semiconductor layer made of a first compound semiconductor material having a first conductivity type and
a photoelectric conversion layer;
(B) forming a recess part at least in the photoelectric conversion layer;
(C) forming an element isolation layer at least inside the recess part and further forming a second compound semiconductor layer made of a second compound semiconductor material having the first conductivity type so as to cover the photoelectric conversion layer;
(D) forming a second conductivity at least in a part of the second compound semiconductor layer, the second conductivity type region having a second conductivity type different from the first conductivity type and reaching the photoelectric conversion layer; and
(E) forming a first electrode on the second conductivity type region and forming a second electrode electrically connected to the first compound semiconductor layer.

In the method for manufacturing the photoelectric conversion element according to the second aspect of the present technology, the photoelectric conversion layer is formed at least in the photoelectric conversion layer in the above step (B). Specifically, the recess part may be formed in the photoelectric conversion layer or may be formed in the photoelectric conversion layer and the first compound semiconductor layer. In addition, the element isolation layer is formed at least inside the recess part in the above step (C). However, the element isolation layer may be formed inside the recess part and on the photoelectric conversion layer depending on a material constituting the element isolation layer. In this case, the second compound semiconductor layer is formed so as to cover the photoelectric conversion layer. Specifically, the second compound semiconductor layer is formed on the element isolation layer. Alternatively, the element isolation layer may be formed inside the recess part and on the photoelectric conversion layer depending on a material constituting the element isolation layer. In this case, the portion of the element isolation layer formed on the photoelectric conversion layer may be configured to correspond to the second compound semiconductor layer. Moreover, the second conductivity type region is formed at least in a part of the second compound semiconductor layer in the above step (D). Specifically, the second conductivity type region may be formed in a part of the second compound semiconductor layer or may be formed in a part of the second compound semiconductor layer and a part of the element isolation layer depending on a material constituting the element isolation layer.

In order to accomplish the above-mentioned object, a method for manufacturing a photoelectric conversion element according to a third aspect of the present technology includes the steps of:

(A) sequentially forming, on a substrate,
a first compound semiconductor layer made of a first compound semiconductor material having a first conductivity type,
a photoelectric conversion layer, and
a second compound semiconductor layer made of a second compound semiconductor material having the first conductivity type;
(B) forming a second conductivity type region in a part of the second compound semiconductor layer, the second conductivity type region having a second conductivity type different from the first conductivity type and reaching the photoelectric conversion layer;

(C) forming a first electrode on the second conductivity type region;

(D) forming a recess part at least in the photoelectric conversion layer; and (E) forming an element isolation layer at least inside the recess part.

In the method for manufacturing the photoelectric conversion element according to the third aspect of the present technology, the recess part is formed at least in the photoelectric conversion layer in the above step (D). Specifically, the recess part may be formed in the second compound semiconductor layer and the photoelectric conversion layer, may be formed in the first compound semiconductor layer and the photoelectric conversion layer, or may be formed in the second compound semiconductor layer, the photoelectric conversion layer, and the first compound semiconductor layer. In addition, the element isolation layer is formed inside the recess part in the above step (E). However, the element isolation layer may be formed inside the recess part or may be formed inside the recess part and on the first compound semiconductor layer depending on a material constituting the element isolation layer.

In order to accomplish the above-mentioned object, a method for manufacturing a photoelectric conversion element according to a fourth aspect of the present technology includes the steps of:

(A) forming an element isolation layer on a substrate having a first conductivity type to obtain a first compound semiconductor layer surrounded by the element isolation layer and constituted by a surface region of the substrate;

(B) forming a photoelectric conversion layer surrounded by the element isolation layer on the first compound semiconductor layer;

(C) forming a second compound semiconductor layer made of a second compound semiconductor material having the first conductivity type on the photoelectric conversion layer;

(D) forming a second conductivity at least in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

In order to accomplish the above-mentioned object, a method for manufacturing a photoelectric conversion element according to a fifth aspect of the present technology includes the steps of:

(A) forming an element isolation layer forming region on a substrate having a first conductivity type to obtain a first compound semiconductor layer surrounded by the element isolation layer forming region and constituted by a surface region of the substrate;

(B) forming a photoelectric conversion layer on the first compound semiconductor layer and the element isolation layer forming region;

(C) forming a second compound semiconductor layer made of a second compound semiconductor material having the first conductivity on the photoelectric conversion layer;

(D) removing portions of the second compound semiconductor layer and the photoelectric conversion layer, which are positioned above the element isolation layer forming region, and embedding an element isolation layer forming material in the removed portions to obtain an element isolation layer;

(E) forming a second conductivity type region in the second compound semiconductor layer, the second conductivity type region having a second conductivity type different from the first conductivity type and reaching the photoelectric conversion layer; and (F) forming a first electrode on the second conductivity type region and forming a second electrode electrically connected to the first compound semiconductor layer.

In order to accomplish the above-mentioned object, a method for manufacturing a photoelectric conversion element according to a sixth aspect of the present technology includes the steps of:

(A) forming selective a growth blocking part in a substrate having a first conductivity type;

(B) forming, on the basis of a longitudinal-direction selective epitaxial growth method, a photoelectric conversion layer in a region of the substrate, the region being positioned between the selective growth blocking part and the selective growth blocking part and corresponding to the first compound semiconductor layer;

(C) forming a second compound semiconductor layer made of a second compound semiconductor material having the first conductivity type on an entire surface to obtain an element isolation layer made of a portion of the second compound semiconductor layer, the portion being positioned above the selective growth blocking part;

(D) forming a second conductivity type region in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

Advantageous Effects of Invention

In the photoelectric conversion elements of the present technology, the photoelectric conversion elements constituting the imaging apparatus of the present technology, and the photoelectric conversion elements manufactured by the methods for manufacturing the photoelectric conversion elements according to the first to sixth aspects of the present technology, the element isolation layer surrounds the lateral surface of the photoelectric conversion layer. Therefore, there is no fear (less likelihood) of causing a crystal defect or the like when forming a region that divides the adjacent photoelectric conversion elements, and miniaturization can be reliably addressed. Note that effects described in the present specification are given only for exemplification purpose and the present specification is not limited to the effects but may include additive effects.

BRIEF DESCRIPTION OF DRAWINGS

FIGS. 1A and 1B are a schematic partial cross-sectional view of the photoelectric conversion elements of a first embodiment and a schematic partial cross-sectional view of a modified example of the photoelectric conversion elements of the first embodiment, respectively.

FIGS. 2A and 2B are a schematic partial cross-sectional view of the photoelectric conversion elements of a second embodiment and a schematic partial cross-sectional view of a modified example of the photoelectric conversion elements of the second embodiment, respectively.

FIGS. 30A, 30B, and 30C are schematic partial end views of the first compound semiconductor layer or the like for describing the method for manufacturing the photoelectric conversion element of the ninth embodiment in succession to FIG. 29C.

MODE(S) FOR CARRYING OUT THE INVENTION

Figure 3A:
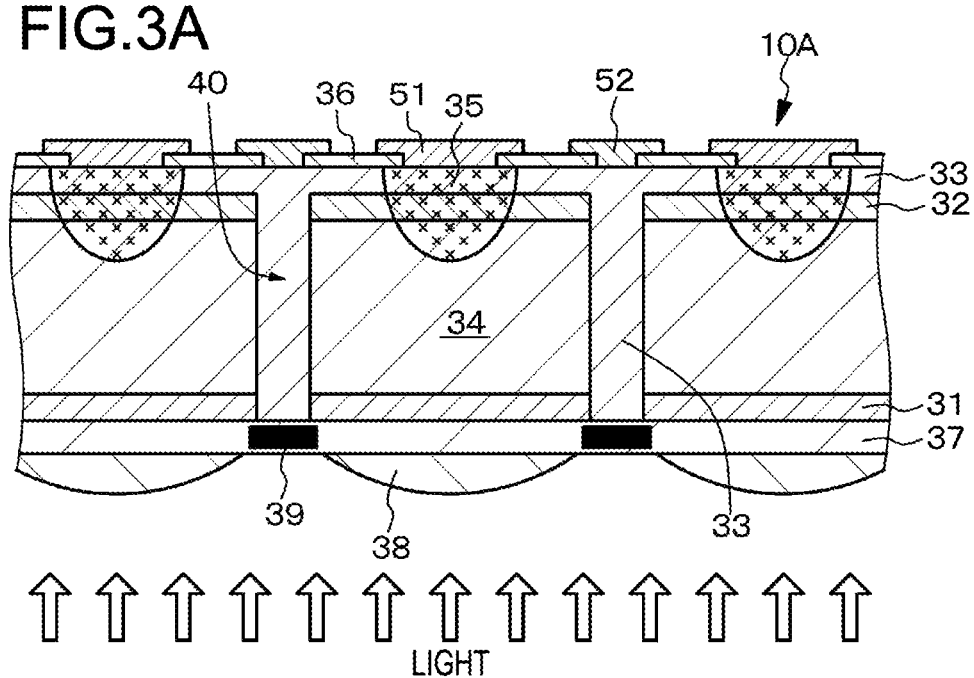
FIGS. 3A and 3B are schematic partial cross-sectional views of another modified example of the photoelectric conversion elements of the first embodiment.

Hereinafter, a description will be given of the present technology on the basis of embodiments with reference to the drawings. However, the present technology is not limited to the embodiments, and various numerical values or materials in the embodiments are given only for exemplification purpose. Note that the description will be given in the following order.
1. Descriptions of All Aspects of Photoelectric Conversion Elements of Present Technology, Method for Manufacturing Photoelectric Conversion Elements According to First to Sixth Aspects of Present Technology, and Imaging Apparatus of Present Technology
2. First Embodiment (Photoelectric Conversion Element of Present Technology, Method for Manufacturing Photoelectric Conversion Element According to First Aspect of Present Technology, and Imaging Apparatus of Present Technology)
3. Second Embodiment (Modification of First Embodiment)
4. Third Embodiment (Modification of Photoelectric Conversion Elements of First and Second Embodiments and Method for Manufacturing Photoelectric Conversion Element According to Second Aspect of Present Technology)
5. Fourth Embodiment (Modification of Photoelectric Conversion Elements of First and Second Embodiments and Method for Manufacturing Photoelectric Conversion Element According to Third Aspect of Present Technology)
6. Fifth Embodiment (Modification of Photoelectric Conversion Elements of First and Second Embodiments and Method for Manufacturing Photoelectric Conversion Element According to Fourth Aspect of Present Technology)
7. Sixth Embodiment (Modification of Method for Manufacturing Photoelectric Conversion Element of Fifth Embodiment)
8. Seventh Embodiment (Another Modification of Method for Manufacturing Photoelectric Conversion Element of Fifth Embodiment)
9. Eighth Embodiment (Still Another Modification of Method for Manufacturing Photoelectric Conversion Element of Fifth Embodiment)
10. Ninth Embodiment (Modification of Eighth Embodiment)
11. Tenth Embodiment (Modification of Photoelectric Conversion Elements of First and Second Embodiments and Method for Manufacturing Photoelectric Conversion Element According to Fifth Aspect of Present Technology)
12. Eleventh Embodiment (Modification of Tenth Embodiment)
13. Twelfth Embodiment (Modification of Photoelectric Conversion Elements of First and Second Embodiments and Method for Manufacturing Photoelectric Conversion Element According to Sixth Aspect of Present Technology)
14. Thirteenth Embodiment (Modification of Twelfth Embodiment)
15. Fourteenth Embodiment (Modification of Imaging Apparatus of Present Technology)
16. Other <Descriptions of All Aspects of Photoelectric Conversion Elements of Present Technology, Methods for Manufacturing Photoelectric Conversion Elements According to First to Sixth Aspects of Present Technology, and Imaging Apparatus of Present Technology>

An imaging apparatus of the present technology further includes a driving substrate, for example a read-only IC (ROIC) substrate, and a first electrode constituting each photoelectric conversion element can be connected to a first electrode connection part provided on the driving substrate. Further, in this case, a second electrode constituting each photoelectric conversion element can be connected to a second electrode connection part provided on the driving substrate.

In methods for manufacturing photoelectric conversion elements according to first to third aspects of the present technology, an element isolation layer is made of a third compound semiconductor material having a first conductivity type. The methods can further include the step of embedding an insulating material or a light shielding material in a groove part after forming the groove part in the element isolation layer formed inside a recess part. Here, the groove part may be formed in the element isolation layer inside the recess part after the element isolation layer is formed inside the recess part, or the groove part may be formed simultaneously when the element isolation layer is formed inside the recess part. Further, in the methods for manufacturing photoelectric conversion elements according to the first to third aspects of the present technology including such a configuration or in methods for manufacturing photoelectric conversion elements according to fourth to sixth aspects of the present technology, the substrate can be finally removed.

The groove part may be formed in the entire region of the recess part or may be formed in a partial region of the recess part along the depth direction of the recess part. Specifically, when the recess part is formed in a second compound semiconductor layer and a photoelectric conversion layer in a method for manufacturing a photoelectric conversion element according to the first aspect of the present technology, the groove part may only be formed in

[1-1] the entire second compound semiconductor layer and the entire photoelectric conversion layer or

[1-2] the entire second compound semiconductor layer and a part of the photoelectric conversion layer.

Further, when the recess part is formed in the second compound semiconductor layer, the photoelectric conversion layer, and a first compound semiconductor layer, the groove part may only be formed in

[1-3] the entire second compound semiconductor layer, the entire photoelectric conversion layer, and the entire first compound semiconductor layer or

[1-4] the entire second compound semiconductor layer, the entire photoelectric conversion layer, and a part of the first compound semiconductor layer.

When a recess part is formed in a photoelectric conversion layer in a method for manufacturing a photoelectric conversion element according to the second aspect of the present technology, a groove part may only be formed in

[2-1] the entire photoelectric conversion layer or

[2-2] a part of the photoelectric conversion layer.

Further, when the recess part is formed in the photoelectric conversion layer and a first compound semiconductor layer, the groove part may only be formed in

[2-3] the entire photoelectric conversion layer and the entire first compound semiconductor layer or

[2-4] the entire photoelectric conversion layer and a part of the first compound semiconductor layer.

When a recess part is formed in a second compound semiconductor layer and a photoelectric conversion layer in a method for manufacturing a photoelectric conversion element according to the third aspect of the present technology, a groove part may only be formed in

[3-1] the entire second compound semiconductor layer and a part of the photoelectric conversion layer or

[3-2] the entire second compound semiconductor layer and a part of the photoelectric conversion layer.

Further, when the recess part is formed in a first compound semiconductor layer and the photoelectric conversion layer, a groove part may only be formed in

[3-3] the entire photoelectric conversion layer and the entire first compound semiconductor layer or

[3-4] the entire photoelectric and a part of the first compound semiconductor layer.

Further, when the recess part is formed in the second compound semiconductor layer, the photoelectric conversion layer, and first compound semiconductor layer, the groove part may only be formed at least in the photoelectric conversion layer (at least in a part of the photoelectric conversion layer in some cases).

In the imaging apparatus of the present technology, the photoelectric conversion elements in the imaging apparatus of the present technology including the above preferred embodiments, and the photoelectric conversion elements manufactured on the basis of the methods for manufacturing the photoelectric conversion elements according to the first to sixth aspects of the present technology including the above preferred embodiments (hereinafter the photoelectric conversion elements will be collectively called the "photoelectric conversion element or the like of the present technology" in some cases), the second electrode can be formed on the same side as the first electrode or the second electrode can be formed on the surface on the light incident side of the first compound semiconductor layer.

In the photoelectric conversion elements or the like of the present technology including the above preferred embodiments, the first compound semiconductor layer, the second compound semiconductor layer, and the element isolation layer can be made of different materials or can be made of the same material. Note that in the latter case, the element isolation layer has the first conductivity type and is made of a compound semiconductor material (third compound semiconductor material) different from a material constituting the photoelectric conversion layer. The element isolation layer having such a configuration may be called an "element isolation layer made of the third compound semiconductor material" in some cases. Further, in the latter case, in the photoelectric conversion elements or the like of the present technology including the various preferred embodiments and configurations described above, the first compound semiconductor layer, the second compound semiconductor layer, the element isolation layer (element isolation layer made of the third compound semiconductor material), and a photoelectric conversion layer can be made of a group III-V compound semiconductor material. In this case, the photoelectric conversion layer can be made of InGaAs, and the first compound semiconductor layer, the second compound semiconductor layer, and the element isolation layer (the element isolation layer made of the third compound semiconductor material) can be made of InP. However, without being limited to this, the materials of the first compound semiconductor layer, the second compound semiconductor layer, and the photoelectric conversion layer may be selected so that the band gap energy of the photoelectric conversion layer becomes the smallest. Further, when the first compound semiconductor layer, the second compound semiconductor layer, and the element isolation layer are made of different materials, examples of a material constituting the element isolation layer can include an insulating material and the combination of a light shielding material and an insulating material. That is, in the latter case, the element isolation layer can be made of an insulating material layer, or a portion of the element isolation layer, which is held in contact with the lateral surface of the photoelectric conversion layer, can be made of an insulating material layer and the remaining portion thereof can be made of a light shielding material layer. In addition, the compound semiconductor layer constituting the photoelectric conversion layer is made of a crystalline compound semiconductor material, and the element isolation layer is made of the same compound semiconductor material as the compound semiconductor material constituting the photoelectric conversion layer. However, the compound semiconductor layer and the element isolation layer can also be configured to be polycrystalline.

In a configuration in which the first compound semiconductor layer, the second compound semiconductor layer, and the element isolation layer (the element isolation layer made of the third compound semiconductor material) are made of the same material, the material may be completely the same material, may have a different composition, or may have the same composition but have a different impurity concentration. Here, the material having the same composition represents that the atomic percentage of atoms constituting the material is the same value, and the material having a different composition represents that the atomic percentage of atoms constituting the material is a different value. Further, the first compound semiconductor layer, the second compound semiconductor layer, and the element isolation layer (the element isolation layer made of the third compound semiconductor material) are not necessarily made of InP. However, as a compound semiconductor material constituting the first compound semiconductor layer, the second compound semiconductor layer, or the element isolation layer (the element isolation layer made of the third compound semiconductor material), other materials such as Si, InGaAsP, and AlInAs can be exemplified.

In addition, in the photoelectric conversion elements or the like of the present technology including the various preferred embodiments and configurations described above, the compound semiconductor material (the third compound semiconductor material) constituting the element isolation layer can have wider band gap energy than the material constituting the photoelectric conversion layer. Moreover, in the photoelectric conversion elements or the like of the present technology including the various preferred embodiments and configurations described above, the element isolation layer can have a higher impurity concentration than the photoelectric conversion layer.

Here, when the band gap energy of the third compound semiconductor material is represented by $BG_3$ and the band gap energy of the material constituting the photoelectric conversion layer is represented by $BG_0$, the band gap energy of the third compound semiconductor material and the band gap energy of the material constituting the photoelectric conversion layer are not limited to but can be exemplified as $0.3\ eV \leq BG_3 - BG_0 \leq 0.85\ eV$.

In addition, when the refractive index of the third compound semiconductor material is represented by $n_3$ and the refractive index of the material constituting the photoelectric conversion layer is represented by no, the refractive index of the third compound semiconductor material and the refractive index of the material constituting the photoelectric conversion layer are not limited to but can be exemplified as $0.3 \leq n_0 - n_3 \leq 0.5$. Moreover, when the impurity concentration of the element isolation layer made of the third compound semiconductor material is represented by $Im_3$ and the impurity concentration of the photoelectric conversion layer is represented by $Im_0$, the impurity concentration of the element isolation layer and the impurity concentration of the photoelectric conversion layer are not limited to but can be exemplified as $1\times10 \leq Im_3/Im_0 \leq 1\times10^5$. Alternatively, $5\times10^{16}$ $cm^{-3}$ or less (for example, $1\times10^{14}\ cm^{-3}$ to $5\times10^{15}\ cm^{-3}$) can be exemplified as a value of $Im_0$, and $5\times10^{17}\ cm^{-3}$ to $5\times10^{18}\ cm^{-3}$ or less can be exemplified as a value of $Im_3$.

Moreover, in the photoelectric conversion elements or the like of the present technology including the various preferred embodiments and configurations described above, the portion of the element isolation layer, which is held in contact with the lateral surface of the photoelectric conversion layer, can be made of the third compound semiconductor material, and the remaining portion thereof can be made of the light shielding material.

Examples of the specific plane shape of the recess part can include a shape in which the recess part is formed between the adjacent photoelectric conversion elements (specifically, for example, at the portion of the element isolation layer (the element isolation layer made of the third compound semiconductor material) corresponding to the boundary region between the adjacent photoelectric conversion elements). In other words, the recess part is provided in, for example, a parallel cross shape. That is, the photoelectric conversion element is surrounded by the recess part. In addition, a groove part is formed in the portion of the element isolation layer (the element isolation layer made of the third compound semiconductor material) positioned inside the recess part so as to surround the photoelectric conversion element, and the insulating material layer made of the insulating material or the light shielding material layer made of the light shielding material is specifically formed in the groove part.

In a method for manufacturing a photoelectric conversion element according to a fifth aspect of the present technology, examples of a material constituting an element isolation layer forming region can include various insulating materials that will be described later. In addition, examples of an element isolation layer forming material can include various insulating materials that will be described later. Alternatively, a portion of the element isolation layer forming material, which is held in contact with the lateral surfaces of the second compound semiconductor layer, the photoelectric conversion layer, and the first compound semiconductor layer, can be made of various insulating materials that will be described later, and the remaining portion thereof can be made of a light shielding material that will be described later.

Examples of a material constituting an insulating material layer or an insulating material can include an inorganic-based insulating material as exemplified by a metal oxide high dielectric insulating film such as a silicon-oxide-based material, silicon nitride (SiNr), aluminum oxide ($Al_2O_3$), and $HfO_2$, an organic-based insulating material (organic polymer) as exemplified by direct-chain hydrocarbons having a functional group capable of being bonded to a control electrode at its one end such as polymethyl methacrylate (PMMA), polyvinyl phenol (PVP), polyvinyl alcohol (PVA), polyimide, polycarbonate (PC), polyethylene terephthalate (PET), polystyrene, a silanol derivative (silane coupling agent) such as N-2(aminoethyl)3-aminopropyltrimethoxysilane (AEAPTMS), 3-mercaptopropyltrimethoxysilane (MPTMS), and octadecyltrichlorosilane (OTS), novolak type phenol resin, fluorine-based resin, and octadecanethiol, and the combination of these materials. Note that as the silicon-oxide-based material, silicon oxide (SiOx), BPSG, PSG, BSG, AsSG, PbSG, silicon oxynitride (SiON), SOG (spin-on glass), and a low dielectric constant material (for example, polyaryl ether, cycloperfluoro carbon polymer and benzocyclobutene, cyclic fluororesin, polytetrafluoroethyrene, aryl fluoride ether, fluorinated polyimide, amorphous carbon, and organic SOG) can be exemplified. In addition, as a material constituting the light shielding material layer (inter-element light shielding layer), chrome (Cr), copper (Cu), aluminum (Al), tungsten (W), titanium (Ti), molybdenum (Mo), and manganese (Mn) can be exemplified. By the provision of the light shielding material layer (inter-pixel light shielding layer), the leakage of light to an adjacent photoelectric conversion element (optical crosstalk) can be further effectively prevented and an improvement in sensitivity can be attained. The insulating material layer can be formed on the basis of various physical vapor deposition methods (PVD methods) or chemical vapor deposition methods (CVD methods). In addition, the light shielding material layer can be formed on the basis of various PVD methods.

Examples of a film forming method using the principle of a PVD method can include a vacuum vapor deposition method using resistance heating or high-frequency heating, an EB (electron beam) vapor deposition method, various sputtering methods (such as a magnetron sputtering method, an RF-DC combined bias sputtering method, an ECR sputtering method, a facing target sputtering method, and a high-frequency sputtering method), an ion plating method, a laser ablation method, a molecular beam epitaxy method, and a laser transfer method. In addition, examples of a CVD method can include a plasma CVD method, a thermal CVD method, an organic metal (MO)CVD method, and a photo-induced-CVD method.

Moreover, in the photoelectric conversion elements or the like of the present technology including the various preferred embodiments and configurations described above, light can be incident via the first compound semiconductor layer.

In the photoelectric conversion elements or the like of the present technology including the various preferred embodiments described above, a second conductivity type is a p-type when a first conductivity type is an n-type, and the second conductivity type is the n-type when the first conductivity type is p-type.

In the photoelectric conversion elements or the like of the present technology including the various preferred embodiments described above, light is irradiated, photoelectric conversion is performed in the photoelectric conversion layer, and the carriers of holes and electrons are separated from each other. Further, an electrode from which the holes are extracted is an anode, and an electrode from which the electrons are extracted is a cathode. The first electrode may constitute the anode, and the second electrode may constitute the cathode. Conversely, the first electrode may constitute the cathode, and the second electrode may constitute the anode. When the first conductivity type is the n-type and the second conductivity type is the p-type, the first electrode constitutes the cathode and the second electrode constitutes the anode.

As a material constituting the first electrode or the second electrode formed on the same side as the first electrode, molybdenum (Mo), tungsten (W), tantalum (Ta), vanadium (V), palladium (Pd), zinc (Zn), nickel (Ni), titanium (Ti), platinum (Pt), aurum-zinc (Au—Zn), aurum-germanium (AuGe), chromium (Cr), aurum (Au), aluminum (Al), and the laminated structure of Ti/W or Ti/W/Cu can be exemplified.

The second electrode formed on the surface on the light incident side of the first compound semiconductor layer can be made of a transparent conductive material. Note that the electrode made of the transparent conductive material may be called a "transparent electrode" in some cases. Here, examples of the transparent conductive material constituting the transparent electrode can include a metal oxide. Specifically, indium oxide, an indium-tin oxide (ITO including Sn-doped $In_2O_3$, crystalline ITO, and amorphous ITO), ITiO (Ti-doped $In_2O_3$), IFO (F-doped $In_2O_3$), zinc oxide (including other elements-doped ZnO), an indium-zinc oxide (IZO) in which indium is added to zinc oxide as a dopant, an indium-gallium-zinc oxide (IGZO, In—$GaZnO_4$) in which indium and gallium are added to zinc oxide as dopants, AlMgZnO (aluminum oxide and magnesium oxide-doped zinc oxide), AlMgZnO (aluminum oxide and magnesium-doped zinc oxide), aluminum-zinc oxide (AZO) in which aluminum is added to zinc oxide as a dopant, a gallium-zinc oxide (GZO) in which gallium is added to zinc oxide as a dopant, titanium oxide ($TiO_2$), B-doped ZnO, tin oxide ($SnO_2$), ATO (Sb-doped $SnO_2$), FTO (F-doped $SnO_2$), an indium-gallium oxide (IGO) in which indium is added to gallium oxide as a dopant, InSnZnONiOa, a niobium titanium oxide (TNO) in which niobium is added to titanium oxide as a dopant, antimony oxide, a spinel type oxide, and an oxide having a $YbFe_2O_4$ structure can be exemplified. Alternatively, a transparent electrode having a gallium oxide, a titanium oxide, a niobium oxide, a nickel oxide, or the like as a mother layer can be exemplified. Examples of the thickness of the transparent electrode can include $2\times10^{-8}$ m to $2\times10^{-7}$ m and preferably $3\times10^{-8}$ m to $3\times10^{-7}$ m. The second electrode can be so-called a sold film. Moreover, a sub-electrode may be formed on the light incident surface of the second electrode. The sub-electrode can have a lattice shape (parallel cross shape) as its plane shape, or can have a shape in which a plurality of branch sub-electrodes extend in parallel to each other and one ends or both ends of the plurality of branch sub-electrodes are connected to each other. The sub-electrode can be constituted by, for example, an AuGe layer/a Ni layer/an Au layer, a Mo layer/a Ti layer/a Pt layer/an Au layer, a Ti layer/a Pt layer/an Au layer, a Ti layer/a Pt layer/an Au layer, a Ni layer/an Au layer, or the like, and can be formed on the basis of, for example, a PVD method such as a sputtering method and a vacuum vapor deposition method. Note that each of the layers described before the first slashes "/" occupies the side of the second electrode.

Examples of a method for forming the first electrode and the second electrode (the anode and the cathode) can include the various PVD methods (such as the sputtering method and the vacuum vapor deposition method) described above and various CVD methods.

On the light incident surface of the photoelectric conversion element (for example, the light incident surface of the first compound semiconductor layer), an anti-reflection film can be formed. As a material constituting the anti-reflection film, it is preferable to use a material having a smaller refractive index than that of a compound semiconductor material constituting the compound semiconductor layer of a top layer. Specifically, the material can have, for example, a layer made of $TiO_2$, $Al_2O_3$, ZnS, $MgF_2$, $Ta_2O_5$, $SiO_2$, $Si_3N_4$, $ZrO_2$, and $HfO_2$, or can have the laminated structure of these layers. For example, the material can be formed on the basis of a PVD method such as a sputtering method.

The photoelectric conversion layer may be regarded as a first conductivity type layer or an i-layer in some cases depending on an impurity concentration contained in the photoelectric conversion layer. That is, the photoelectric conversion layer also contains an intrinsic semiconductor layer.

As a method for forming a second conductivity type region, a vapor phase diffusion method or a solid phase diffusion method for an impurity having a second conductivity type can be exemplified. When the second conductivity type is a p-type, zinc (Zn) or magnesium (Mg) can be exemplified as an impurity. In addition, zinc (Zn) or magnesium (Mg) may be introduced by an ion injection method.

The formation of various compound semiconductor layers can be performed on the basis of, for example, a metal organic chemical vapor growth method (a metal organic-chemical vapor deposition method, a metal organic-vapor phase epitaxy method) or a molecular beam epitaxy method (MBE method), a hydride vapor phase epitaxy method (HVPE method) in which halogen contributes to transport or reaction, an atomic layer deposition method (ALD method), a migration-enhanced epitaxy method (MEE method), a plasma assisted physical vapor deposition method (PPD method), or the like.

The recess part or the groove part can be formed on the basis of a wet etching method or a dry etching method. Alternatively, the groove part can be formed simultaneously when the recess part is embedded with the element isolation layer.

On the light incident side of the photoelectric conversion element, a filter (for example, a color filter, a visible-light cut filter, or an infrared cut filter that cuts undesired infrared light) that causes light having a desired wavelength to pass therethrough can be provided or a condensing lens (on-chip micro lens, OCL) can be provided. That is, for example, a flattening film may be formed on the first compound semiconductor layer, and the filter and the condensing lens may be further formed on the flattening film.

The top surface of the second compound semiconductor layer (in some cases, the top surface of the element isolation layer depending on a material constituting the element isolation layer) may be covered with a covering layer. Examples of a material constituting the covering layer can include the material constituting the insulating material layer described above.

Examples of the substrate (film forming substrate) can include a substrate made of a group III-V compound semiconductor. Specifically, examples of the substrate made of the group III-V compound semiconductor can include a GaAs substrate, an InP substrate, a GaN substrate, an AlN substrate, a GaP substrate, a GaSb substrate, an InSb substrate, and InAs substrate. Alternatively, examples of the substrate made of the group III-V compound semiconductor can include a silicon semiconductor substrate, a sapphire substrate, a SiC substrate, a quartz glass substrate, and a sapphire substrate. The driving substrate can be constituted by, for example, a silicon semiconductor substrate. Further, various circuits for driving the photoelectric conversion element may only be formed in the driving substrate. The removal of the substrate (film forming substrate) may only be performed by an etching method, a grinding method, a CMP method, a laser ablation method, a heating method, or the like.

The first electrode connection part and the second electrode connection part formed on the driving substrate can be constituted by, for example, a bump part for connection with the first electrode and the second electrode of the photoelectric conversion element. Further, the first electrode, the second electrode, or a contact part is connected to the bump part provided in the silicon semiconductor substrate. Alternatively, the driving substrate on which the first electrode connection part and the second electrode connection part are formed and the photoelectric conversion element having connection parts (made of copper) provided on the first electrode and the second electrode can be laminated together in such a way that the connection parts are overlapped together so as to be held in contact with each other and bonded together. Alternatively, in order to bond the connection parts together, a TCV (Through Contact VIA) can also be used.

In some cases, the photoelectric conversion element may be fixed to a support substrate. In this case, after forming the photoelectric conversion element on a film forming substrate, it may only be required to fix or bond the photoelectric conversion element to the support substrate and then remove the film forming substrate from the photoelectric conversion element. Examples of a method for removing the film forming substrate from the photoelectric conversion element can include the above method. In addition, examples of a method for fixing or bonding the photoelectric conversion element to the support substrate can include, besides a method using an adhesive, a metal bonding method, a semiconductor bonding method, and a metal and semiconductor bonding method. Examples of the support substrate can include, besides the substrate exemplified as the film forming substrate, a glass substrate, a transparent inorganic substrate such as a quartz substrate, and a transparent plastic substrate or a film made of polyester resin such as polyethylene terephthalate (PET) and polyethylene naphthalate (PEN), polycarbonate (PC) resin, polyether sulfone (PES) resin, polyolefin resin such as polystyrene, polyethylene, and polypropylene, polyphenylene sulfide resin, polyvinylidene difluoride resin, tetra acetylcellulose resin, brominated phenoxy resin, aramid resin, polyimide resin, polystyrene resin, polyarylate resin, polysulfone resin, acrylic resin, epoxy resin, fluorocarbon resin, silicon resin, diacetate resin, triacetate resin, polychlorinated vinyl resin, and cyclic polyolefin resin. Examples of the glass substrate can include a soda glass substrate, a heat-resistant glass substrate, and a quartz glass substrate.

In the imaging apparatus of the present technology, examples of the array of the photoelectric conversion element can include, besides a Bayer array, an interline array, a G stripe RB checkered array, a G stripe RB complete checkered array, a checkered complementary color array, a stripe array, a slanting stripe array, a primary-color color difference array, a field color difference sequential array, a MOS type array, an improved MOS type array, a frame interleave array, and a field interleave array. Here, one pixel is constituted by one photoelectric conversion element. The photoelectric conversion element can be arranged at a pitch of 5 μm or less. By the imaging apparatus of the present technology, a single plate type color solid-state imaging apparatus can be constituted. In the imaging apparatus, a control unit, a driving circuit, and wiring for driving the photoelectric conversion element are provided. A shutter for controlling the incidence of light to the photoelectric conversion element may be disposed as required.

In the imaging apparatus of the present technology, a pixel region in which a plurality of photoelectric conversion elements each of which is the photoelectric conversion element are arranged is constituted by a plurality of pixels regularly arranged in a two-dimensional matrix form (two-dimensional array form). Generally, the pixel region is constituted by an effective pixel region that actually receives light and reads out signal charges generated by photoelectric conversion to a driving circuit after amplifying the same and a black reference pixel region that outputs optical black as a black level reference. The black reference pixel region is generally arranged on the periphery of the effective pixel region.

By the photoelectric conversion element, a CCD device (Charge Coupled Device), a CMOS (Complementary Metal Oxide Semiconductor) image sensor, a CIS (Contact Image Sensor), and a CMD (Charge Modulation Device) signal amplification type image sensor can be constituted. In addition, by the imaging apparatus, a digital still camera, a video camera, a camcorder, an in-vehicle camera, a monitoring camera, and an electronic apparatus having an imaging function such as a mobile telephone can be constituted. The configuration and the structure of the imaging apparatus other than the photoelectric conversion element can be the same as those of a well-known imaging apparatus, and various processing of signals obtained by the photoelectric conversion element can be performed on the basis of well-known circuits.

First Embodiment

Figure 4A:
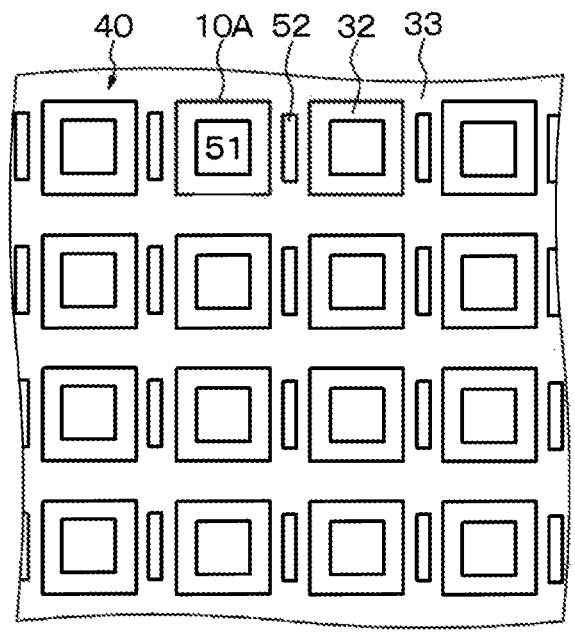
FIGS. 4A and 4B are a view schematically showing the arrangement of first electrodes or the like in the photoelectric conversion elements of the first embodiment and a view schematically showing the arrangement of first electrodes or the like in the photoelectric conversion elements of the second embodiment, respectively.
Figure 5:
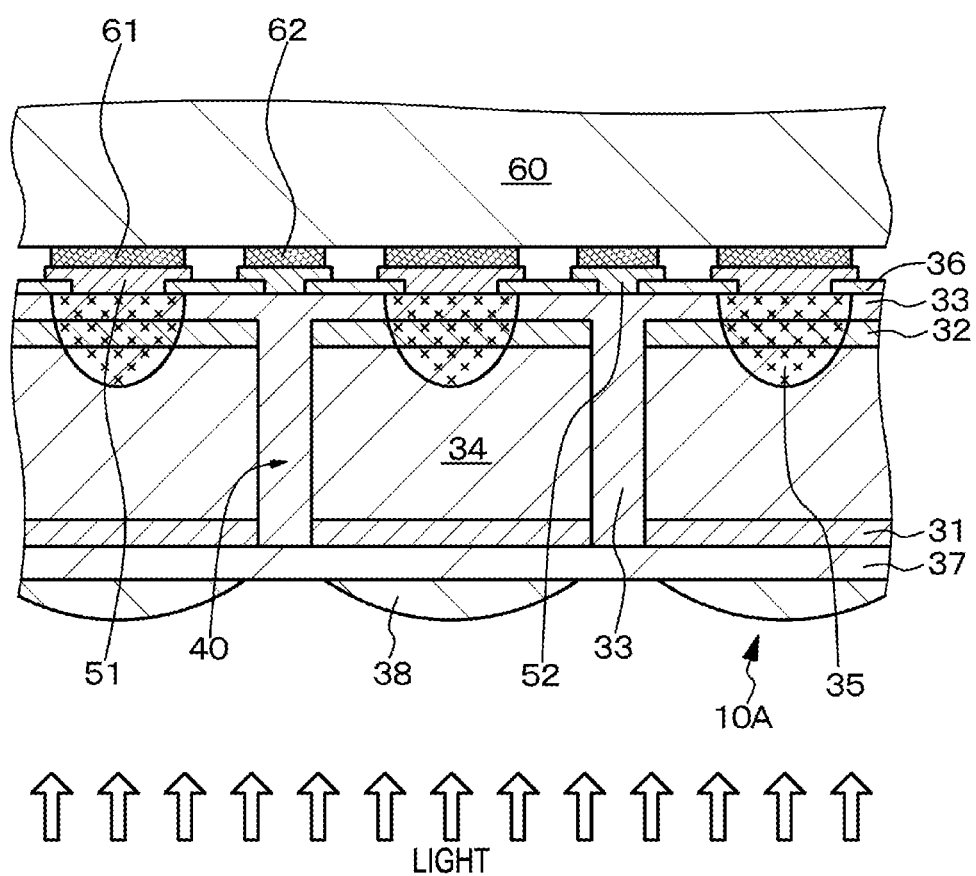
FIG. 5 is a view schematically showing the connection between the photoelectric conversion elements of the first embodiment and a driving substrate.
Figure 6:
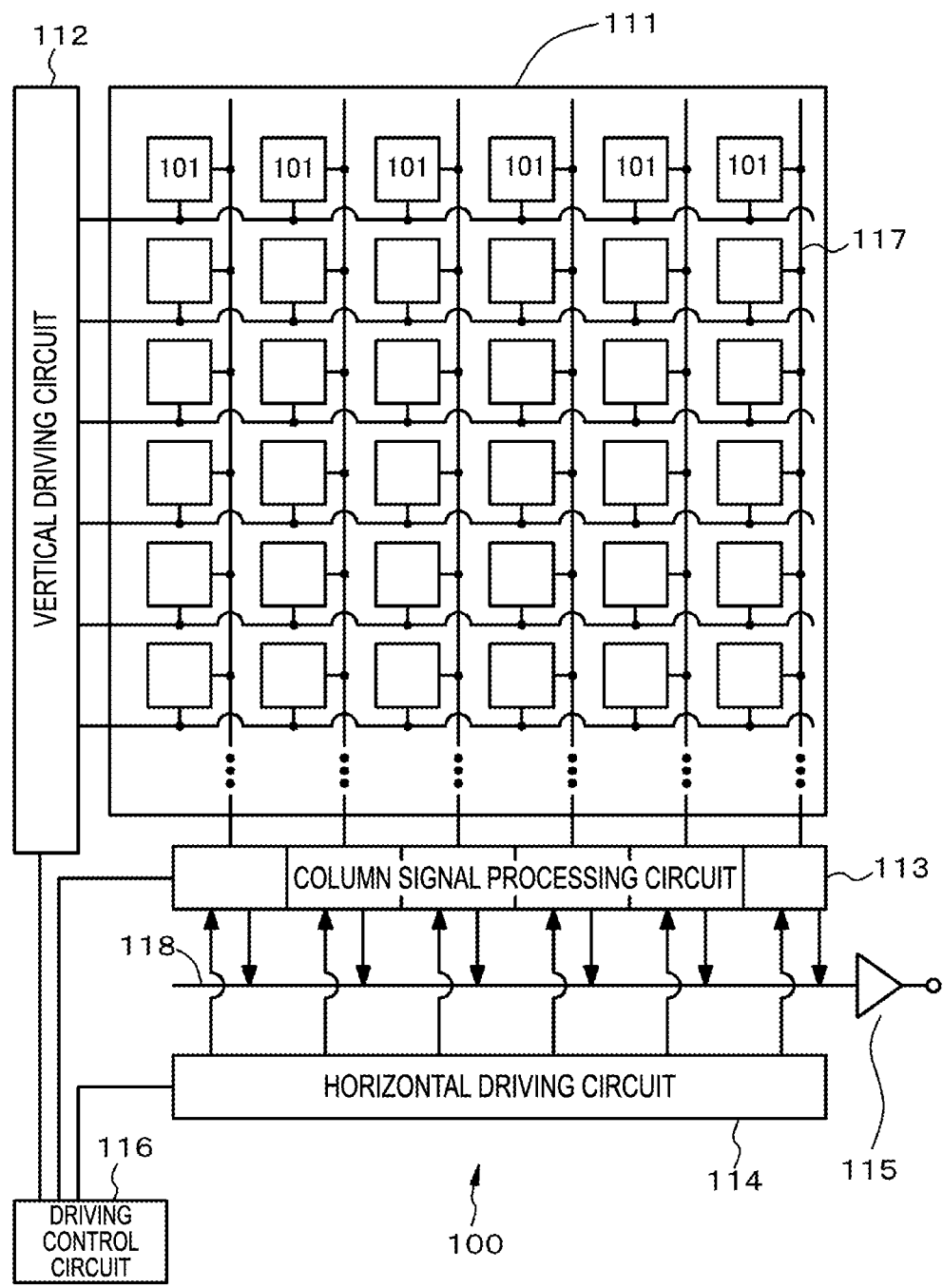
FIG. 6 is a conceptual diagram of an imaging apparatus of the first embodiment.

A first embodiment relates to a photoelectric conversion element (a light-receiving element, a photodiode, or an imaging element) of the present technology, a method for manufacturing a photoelectric conversion element according to a first aspect of the present technology, and an imaging apparatus of the present technology. FIG. 1A shows a schematic partial cross-sectional view of the photoelectric conversion element of the first embodiment. In addition, FIG. 4A schematically shows the arrangement of a first electrode, a second electrode, a second compound semiconductor layer, an element isolation layer, and a recess part in the photoelectric conversion element of the first embodiment, FIG. 5 schematically shows the connection between the photoelectric conversion element of the first embodiment and a driving substrate, and FIG. 6 shows a conceptual diagram of the imaging apparatus of the first embodiment.

A photoelectric conversion element 10A of the first embodiment includes:

a first compound semiconductor layer 31 made of a first compound semiconductor material having a first conductivity type;

a photoelectric conversion layer 34 formed on the first compound semiconductor layer 31;

a second compound semiconductor layer 32 covering the photoelectric conversion layer 34 and made of a second compound semiconductor material having the first conductivity type;

a second conductivity type region 35 formed at least in a part of the second compound semiconductor layer 32, having a second conductivity type different from the first conductivity type, and reaching the photoelectric conversion layer 34;

an element isolation layer 33 surrounding the lateral surface of the photoelectric conversion layer 34;

a first electrode 51 formed on the second conductivity type region 35; and a second electrode 52 electrically connected to the first compound semiconductor layer 31.

Here, the element isolation layer 33 is specifically made of a third compound semiconductor material having the first conductivity type and different from a material constituting the photoelectric conversion layer 34. Further, the element isolation layer (the element isolation layer made of the third compound semiconductor material) 33 is formed also on the second compound semiconductor layer 32. In addition, the second conductivity type region 35 is formed at least in a part of the second compound semiconductor layer 32 but is specifically formed in a part of the second compound semiconductor layer 32 and a part of the element isolation layer 33 depending on a material constituting the element isolation layer. Note that the second compound semiconductor layer 32 may cover the top of the element isolation layer 33 depending on the material constituting the element isolation layer.

The imaging apparatus of the first embodiment is constituted by a plurality of photoelectric conversion elements each of which is the photoelectric conversion element 10A of the first embodiment, the plurality of photoelectric conversion elements being arranged in a two-dimensional matrix form. In addition, the imaging apparatus of the first embodiment further includes a driving substrate 60, specifically a readout integrated circuit substrate (ROIC substrate). The first electrode 51 constituting each of the photoelectric conversion elements 10A is connected to a first electrode connection part 61 provided on the driving substrate 60. In addition, the second electrode 52 constituting each of the photoelectric conversion elements 10A is connected to a second electrode connection part 62 provided on the driving substrate 60. The driving substrate 60 is provided with various circuits for driving the photoelectric conversion elements 10A, but their diagrammatic representations are omitted. The imaging elements 10A are more specifically constituted by CMOS image sensors. In addition, an in-vehicle camera or a monitoring camera is, for example, constituted by the imaging apparatus.

In the first embodiment, the second electrode 52 is formed on the same side as the first electrode 51. In addition, light is incident via the first compound semiconductor layer 31. The first conductivity type is an n-type, and the second conductivity type is a p-type. The first compound semiconductor layer 31, the second compound semiconductor layer 32, and the element isolation layer (the element isolation layer made of the third compound semiconductor layer) are made of the same material. Specifically, the first compound semiconductor layer 31, the second compound semiconductor layer 32, the element isolation layer 33, and the photoelectric conversion layer 34 are made of a group III-V compound semiconductor material. Further, the photoelectric conversion layer 34 is made of InGaAs (specifically n-InGaAs, more specifically n-In$_{0.57}$Ga$_{0.43}$As), and the first compound semiconductor layer 31, the second compound semiconductor layer 32, and the element isolation layer 33 are made of InP (specifically n$^+$-InP). In addition, the third compound semiconductor material constituting the element isolation layer 33 has wider band gap energy than the material constituting the photoelectric conversion layer 34, and the element isolation layer 33 has a higher impurity concentration than the photoelectric conversion layer 34. Specifically, the values of band gap energy BG, impurity concentrations Im, and refractive indexes n of the photoelectric conversion layer 34 and the element isolation layer 33 are shown in the following table 1. Note that the photoelectric conversion layer 34 preferably has an impurity concentration Im$_0$ of $5 \times 10^{16}$ cm$^{-3}$ or less, and that the element isolation layer 33 preferably has an impurity concentration Im$_3$ of $5 \times 10^{17}$ cm$^{-3}$ to $5 \times 10^{18}$ cm$^{-3}$. The first compound semiconductor layer 31 and the second compound semiconductor layer 32 also preferably have an impurity concentration Im$_1$ of $5 \times 10^{17}$ cm$^{-3}$ to $5 \times 10^{18}$ cm$^{-3}$ and an impurity concentration Im$_2$ of $5 \times 10^{17}$ cm$^{-3}$ to $5 \times 10^{18}$ cm$^{-3}$, respectively. In the first embodiment, the first compound semiconductor material, the second compound semiconductor material, and the third compound semiconductor material constituting the first compound semiconductor layer 31, the second compound semiconductor layer 32, and the element isolation layer 33, respectively, are completely the same in terms of design. Moreover, the second conductivity type region 35 has an impurity concentration of $2 \times 10^{18}$ cm$^{-3}$.

TABLE 1

|  | BG (eV) | Im (cm$^{-3}$) | N |
|---|---|---|---|
| Photoelectric conversion layer | 0.75 | $1.0 \times 10^{14}$ to $1.0 \times 10^{16}$ | 3.9 |
| Element isolation layer | 1.35 | $1.0 \times 10^{16}$ to $1.0 \times 10^{18}$ | 3.5 |

As in the conceptual diagram of the imaging apparatus of the first embodiment shown in FIG. 6, an imaging apparatus 100 of the first embodiment is constituted by an imaging region 111 in which the photoelectric conversion elements 10A (represented by imaging elements 101 in FIG. 6) are arranged in a two-dimensional matrix form (two-dimensional array form) and a vertical driving circuit 112, a column signal processing circuit 113, a horizontal driving circuit 114, an output circuit 115, and a driving control circuit 116 serving as its driving circuits (peripheral circuits), or the like. Needless to say, the circuits can be constituted by well-known circuits or can be configured using other circuit configurations (for example, various circuits used in conventional CCD imaging apparatuses or CMOS imaging apparatuses). Note that in FIG. 6, only the imaging elements 101 in the first row are represented by reference numeral "101."

The driving control circuit 116 generates, on the basis of a vertical synchronization signal, a horizontal synchronization signal, and a master clock, a clock signal or a control signal based on which the vertical driving circuit 112, the column signal processing circuit 113, and the horizontal driving circuit 114 are operated. Further, the generated clock signal or the control signal is input to the vertical driving circuit 112, the column signal processing circuit 113, and the horizontal driving circuit 114.

The vertical driving circuit 112 is constituted by, for example, a shift register and sequentially selectively scans each of the imaging elements 101 in the imaging region 111 on a row-by-row basis in a vertical direction. Further, a pixel signal (image signal) based on a current (signal) generated according to a light-receiving amount in each of the imaging elements 101 is supplied to the column signal processing circuit 113 via a signal line (data output line) 117.

The column signal processing circuit 113 is arranged for, for example, each of the columns of the imaging elements 101 and performs signal processing such as noise elimination and signal amplification on an image signal output from the imaging elements 101 of one row for each of the imaging elements based on a signal from black reference pixels (formed around an effective pixel region although not shown). At the output stage of the column signal processing circuit 113, a horizontal selection switch (not shown) is connected and provided between the column signal processing circuit 113 and the horizontal signal line 118.

The horizontal driving circuit 114 is constituted by, for example, a shift register, sequentially outputs a horizontal scanning pulse to sequentially select each of the column signal processing circuits 113, and outputs a signal from each of the column signal processing circuits 113 to the horizontal signal line 118.

The output circuit 115 performs signal processing on the signal sequentially supplied from each of the column signal processing circuits 113 via the horizontal signal line 118 and outputs the processed signal.

When infrared light is incident on the photoelectric conversion element from the side of the first compound semiconductor layer 31, holes and electrons are generated in the photoelectric conversion layer 34. In a state in which a potential higher than a potential applied to the second electrode 52 is applied to the first electrode 51 in advance, the electros are extracted from the second conductivity type region 35 to an outside via the first electrode 51. On the other hand, the holes are extracted from any of the first compound semiconductor layer 31, the element isolation layer 33, and the second compound semiconductor layer 32 to the outside via the second electrode 52.

Hereinafter, a description will be given of a method for manufacturing the photoelectric conversion element 10A of the first embodiment with reference to FIGS. 11A, 11B, 12A, 12B, and 13 each showing a schematic partial end view of a first compound semiconductor layer or the like.

[Step 100]

On a substrate, a first compound semiconductor layer 31 made of a first compound semiconductor material having a first conductivity type, a photoelectric conversion layer 34, and a second compound semiconductor layer 32 made of a second compound semiconductor material having the first conductivity type are sequentially formed. Specifically, an InP substrate (film forming substrate) 21 made of InP and having a buffer layer 22 having a thickness of 0.1 µm to 1 µm is prepared. Further, the first compound semiconductor layer 31 having a thickness of 0.1 µm to 1 µm, the photoelectric conversion layer 34 having a thickness of 3 µm to 5 µm, and the second compound semiconductor layer 32 having a thickness of 0.1 µm to 1 µm are sequentially formed on the buffer layer 22 on the basis of a well-known MOCVD method (see FIG. 11A).

[Step 110]

Figure 11A:
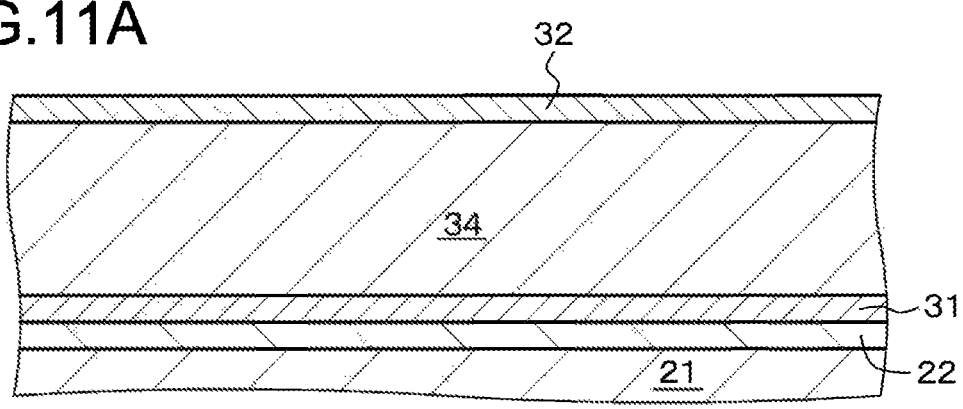
FIGS. 11A, 11B, and 11C are schematic partial end views of a first compound semiconductor layer or the like for describing a method for manufacturing a photoelectric conversion element of the first embodiment.
Figure 11B:
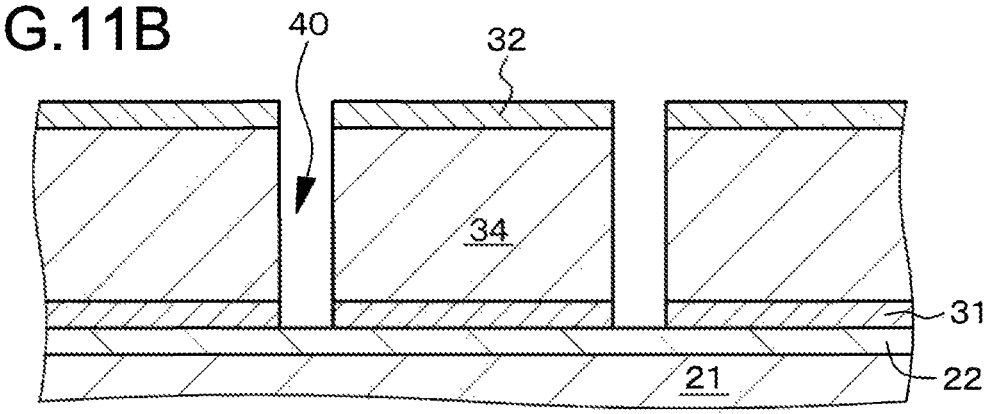

Then, a recess part 40 is formed at least in the second compound semiconductor layer 32 and the photoelectric conversion layer 34 (see FIG. 11B). Specifically, an etching resist layer is formed on the second compound semiconductor layer 32, and the second compound semiconductor layer 32, the photoelectric conversion layer 34, and the first compound semiconductor layer 31 are etched by the etching resist layer serving as an etching mask on the basis of, for example, a dry etching method or a wet etching method, whereby the recess part 40 can be formed in the second compound semiconductor layer 32, the photoelectric conversion layer 34, and the first compound semiconductor layer 31. Then, the etching resist layer is removed. In some cases, the recess part 40 may be formed in the second compound semiconductor layer 32 and the photoelectric conversion layer 34. Here, the recess part 40 is formed between adjacent photoelectric conversion elements 10A, specifically, for example, at the portion of the second compound semiconductor layer 32 or the like corresponding to the boundary region between the adjacent photoelectric conversion elements 10A. In other words, the recess part 40 is provided in, for example, a parallel cross shape. That is, the photoelectric conversion element 10A is surrounded by the recess part 40.

[Step 120]

Figure 11C:
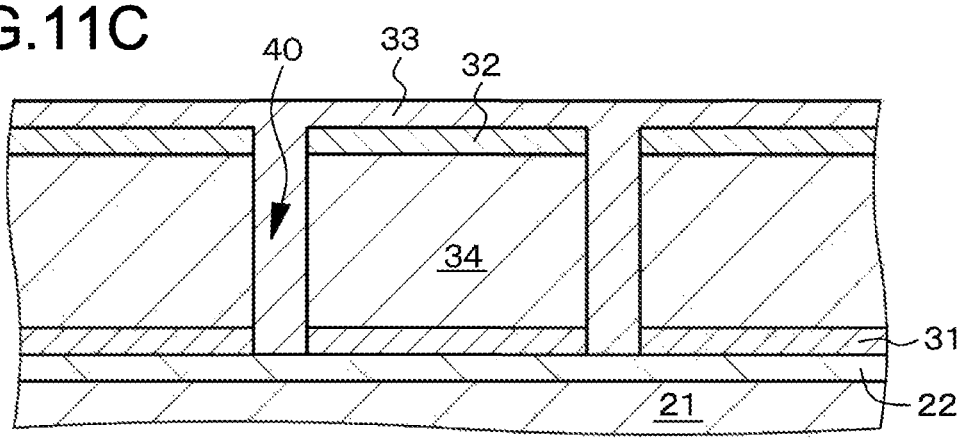

Next, an element isolation layer 33 (specifically, an element isolation layer 33 made of a third compound semiconductor material having the first conductivity type and different from a material constituting the photoelectric conversion layer 34 in the first embodiment) is formed at least inside the recess part 40 on the basis of a well-known MOCVD method (see FIG. 11C). Note that although the element isolation layer 33 is formed also on the second compound semiconductor layer 32 in the illustrated example, the element isolation layer 33 may be formed only inside recess part 40. Specifically, for example, a selective growth mask layer may only be formed on the second compound semiconductor layer 32 to prevent the element isolation layer 33 from being undesirably formed on the second compound semiconductor layer 32 and removed after the element isolation layer 33 is formed on the basis of the well-known MOCVD method.

[Step 130]

Figure 12A:
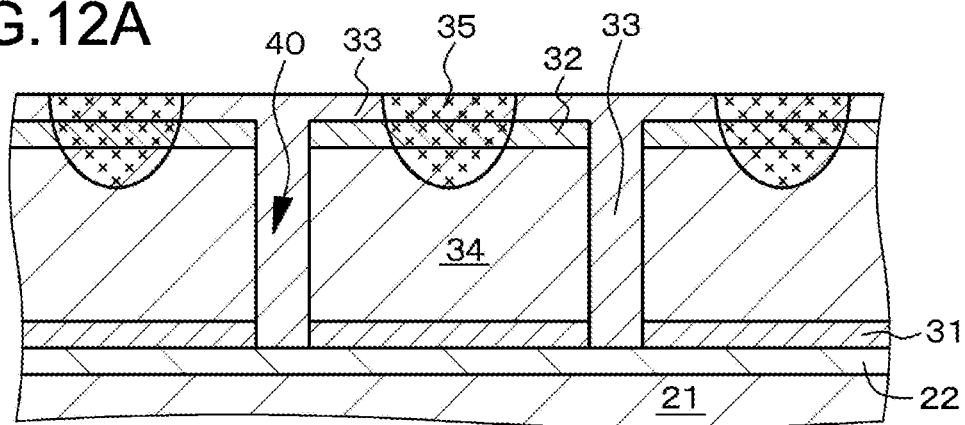
FIGS. 12A, 12B, and 12C are schematic partial end views of the first compound semiconductor layer or the like for describing the method for manufacturing the photoelectric conversion element of the first embodiment in succession to FIG. 11C.
Figure 12B:
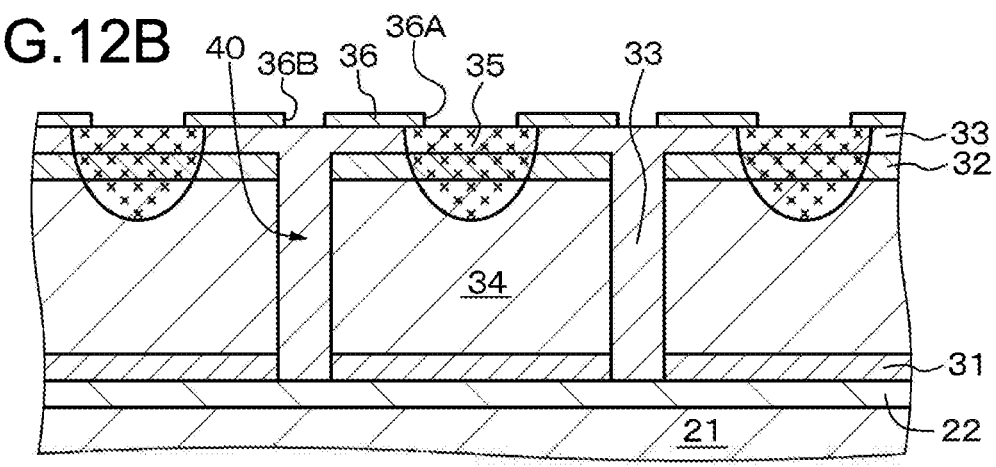

Then, a second conductivity type region 35 having a second conductivity type different from the first conductivity type and reaching the photoelectric conversion layer 34 is formed at least in a part of the second compound semiconductor layer 32 (see FIG. 12A). Note that the second conductivity type region 35 is represented by "×" marks. The same applies to the following. In the illustrated example, since the element isolation layer 33 is formed on the second compound semiconductor layer 32, a mask layer is formed on the element isolation layer 33 and an impurity (specifically zinc, Zn) having the second conductivity type (p-type) are, for example, vapor-phase diffused or solid-phase diffused, whereby the conductivity type region 35 can be formed. Then, the mask layer is removed. Note that when the element isolation layer 33 is formed only inside the recess part 40, the second conductivity type region 35 reaching the photoelectric conversion layer 34 may only be formed in a part of the second compound semiconductor layer 32.

[Step 140]

Figure 12C:
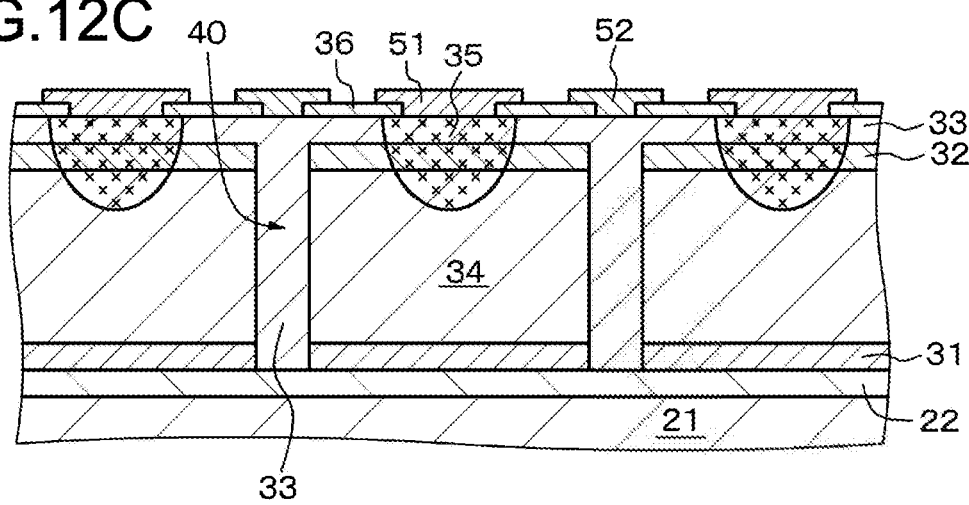

Then, a first electrode 51 is formed on the second conductivity type region 35. In addition, a second electrode 52 electrically connected to the first compound semiconductor layer 31 is formed. Specifically, a covering layer 36 made of SiN is formed on the second conductivity type region 35 and the element isolation layer 33, and then opening parts 36A and 36B are formed in the covering layer 36 at parts, at which the first electrode 51 and the second electrode 52 are to be formed, on the basis of a photolithography technique and an etching technique (see FIG. 12B). Then, the first electrode 51 is formed from a position above the second conductivity type region 35 exposed at the bottom part of the opening part 36A to a position above the covering layer 36, and the second electrode 52 is formed from a position above the element isolation layer 33 exposed at the bottom part of the opening part 36B to a position above the covering layer 36. Thus, the photoelectric conversion element 10A having a structure shown in FIG. 12C can be obtained. The first electrode 51 and the second electrode 52 have, for example, the laminated structure of a Ti layer and a W layer. Here, the Ti layer functions as a barrier metal layer. Note that copper layers (not shown) are formed on the top surfaces of the first electrode 51 and the seconds electrode 52 as connection parts.

[Step 150]

Figure 13:
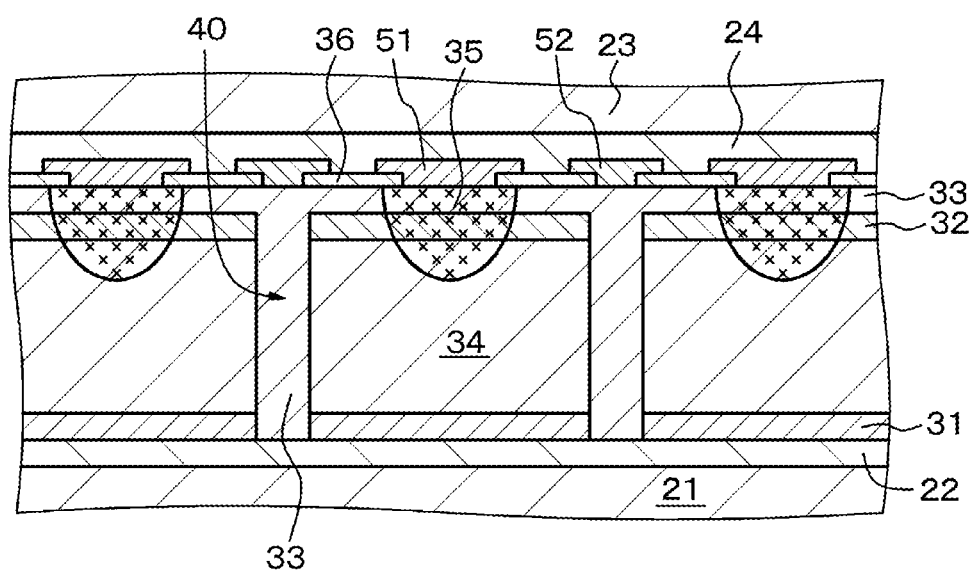
FIG. 13 is a schematic partial end view of the first compound semiconductor layer or the like for describing the method for manufacturing the photoelectric conversion element of the first embodiment in succession to FIG. 12C.

Next, a substrate 21 and a support substrate 23 are bonded together via the photoelectric conversion element and an insulating film 24 on the basis of a well-known method (see FIG. 13). Further, the substrate 21 and a buffer layer 22 are removed, a flattening film 37 is formed on the exposed first compound semiconductor layer 31, and a condensing lens (on-chip micro lens, OCL) 38 is formed on the flattening film 37 on the basis of a well-known method, whereby the photoelectric conversion element 10A having a structure shown in FIG. 1A can be obtained. Note that the support substrate 23 or the like is omitted in FIG. 1A and FIGS. 1B, 2A, and 2B that will be described later. Then, dicing is performed to divide the photoelectric conversion elements into a group of photoelectric conversion elements (a group of imaging elements) for imaging apparatuses.

[Step 160]

A driving substrate 60, specifically a readout integrated circuit substrate is prepared. On the driving substrate 60, a first electrode connection part 61 and a second electrode connection part 62 made of copper are formed. Further, the group of the photoelectric conversion elements for the imaging apparatus is moved from the support substrate 23 onto the driving substrate 60. Next, the copper layer of the connection part of the first electrode 51 of the photoelectric conversion element 10A and the copper layer of the first electrode connection part 61 are bonded together, and the copper layer of the connection part of the second electrode 52 of the photoelectric conversion element 10A and the copper layer of the second electrode connection part 62 are bonded together. Thus, the photoelectric conversion element 10A can be mounted on the driving substrate 60 (see FIG. 5).

Note that a filter for causing light having a desired wavelength to pass therethrough (for example, a color filter, a visible-light cut filter, or an infrared cut filter for cutting undesired infrared light) may be, for example, provided on the light incident side of the photoelectric conversion element. A light shielding film for preventing unnecessary external light from being incident on a photoelectric conversion part may also be provided. As a material constituting the light shielding film, chrome (Cr), copper (Cu), aluminum (Al), and tungsten (W) can be exemplified.

In the first embodiment, the lateral surface of the photoelectric conversion layer is surrounded by the element isolation layer made of the material (the third compound semiconductor material having the first conductivity type) different from the material constituting the photoelectric conversion layer. Therefore, when the region (specifically the element isolation layer in the first embodiment) for isolating the adjacent photoelectric conversion elements from each other is formed, the possibility of a crystal defect or the like is prevented and fineness can be reliably addressed. In addition, a difficulty in controlling the diffusion of an impurity, that is, a difficulty in controlling an impurity concentration in the depth direction of the laminated body made of a group III-V compound semiconductor that has not been addressed in conventional technologies can be avoided, and a pn-junction profile is likely to spread, which prevents the occurrence of a problem such as reduction in sensitivity.

FIG. 1B shows a schematic partial cross-sectional view of a modified example of the photoelectric conversion element of the first embodiment. In a photoelectric conversion element (imaging element) 10B of the modified example, a second electrode 52 is formed on the surface on the light incident side of a first compound semiconductor layer 31. Specifically, for example, the formation of the second electrode 52 is omitted in the same step as [Step 140] of the first embodiment. Then, in the same step as [Step 150] of the first embodiment, a substrate 21 and a buffer layer 22 are removed, the second electrode 52 made of a transparent conductive material such as ITO and a flattening film 37 are formed on the exposed first compound semiconductor layer 31, and a condensing lens 38 is formed on the flattening film 37. Note that the second electrode 52 can be a solid film. That is, the second electrode 52 can be an electrode common to the photoelectric conversion element.

Second Embodiment

Figure 4B:
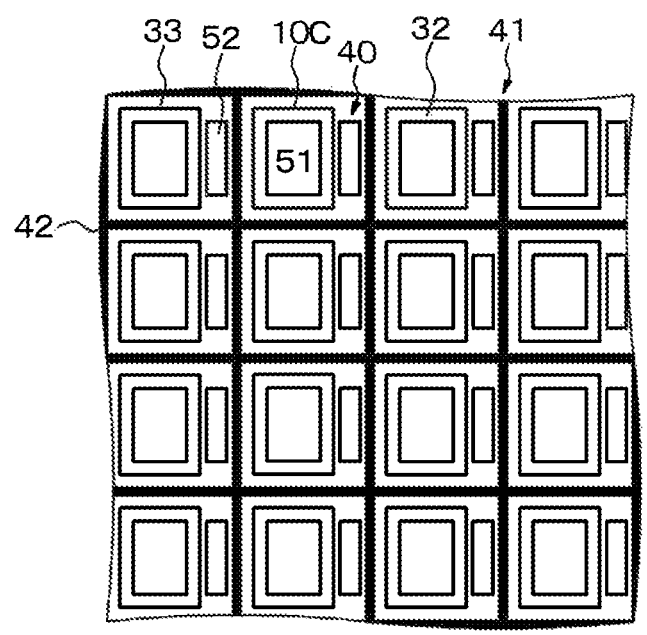

A second embodiment is a modification of the first embodiment. FIG. 2A shows a schematic partial cross-sectional view of the photoelectric conversion element of the second embodiment. FIG. 4B schematically shows the arrangement of a first electrode, a second electrode, a second compound semiconductor layer, an element isolation layer, a recess part, and a groove part in the photoelectric conversion element of the second embodiment.

In a photoelectric conversion element 10C of the second embodiment, a portion of an element isolation layer 33, which is held in contact with the lateral surface of a photoelectric conversion layer 34, is made of a third compound semiconductor material, and the other part of the element isolation layer 33 is made of an insulating material layer or a light shielding material layer 42. That is, a groove part 41 is formed in the portion of the element isolation layer 33 positioned inside a recess part 40 so as to surround the photoelectric conversion element 10C. Further, the insulating material layer or the light shielding material layer 42 is formed inside the groove part 41.

In the photoelectric conversion element 10C of the second embodiment, the groove part 41 is formed in the element isolation layer 33 (specifically the element isolation layer 33 made of the third compound semiconductor material having a first conductivity type) formed inside the recess part 40 in the step between [Step 120] and [Step 130], the step between [Step 130] and [Step 140], or the step between [Step 140] and [Step 150] in the first embodiment. Then, the groove part 41 is embedded with an insulating material or a light shielding material to form the insulating material layer or the light shielding material layer 42. Note that in the illustrated example, the insulating material layer or the light shielding material layer 42 is formed in the step between [Step 120] and [Step 130].

Figure 14A:
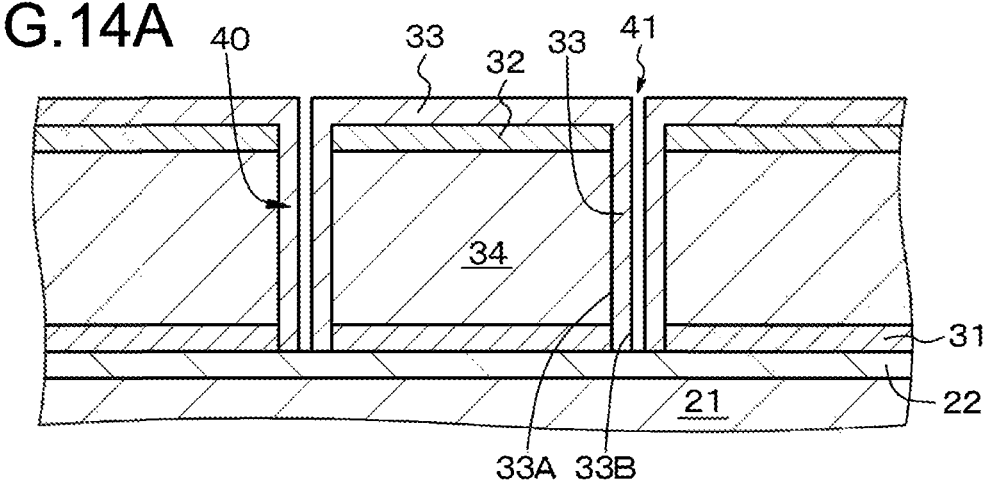
FIGS. 14A and 14B are schematic partial end views of a first compound semiconductor layer or the like for describing a method for manufacturing a photoelectric conversion element of the second embodiment.
Figure 14B:
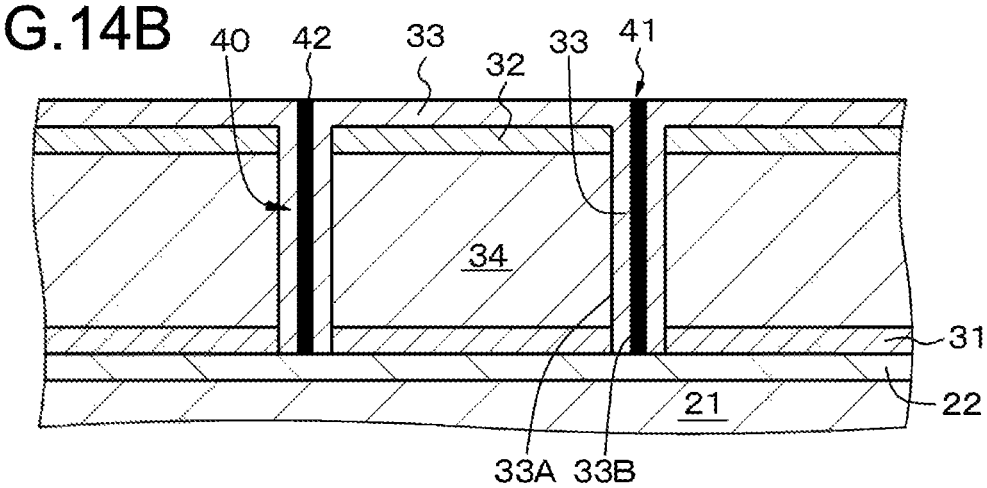

Specifically, after the completion of [Step 120] of the first embodiment (see FIG. 11C), an etching resist layer is formed on the element isolation layer 33, and the element isolation layer 33 is etched by the etching resist layer serving as an etching mask on the basis of, for example, a dry etching method to form the groove part 41 in the element isolation layer 33 (see FIG. 14A). Further, on the basis of, for example, a sputtering method, the groove part 41 is embedded with, for example, SiN, $SiO_2$, $Al_2O_3$, or $HfO_2$, whereby the insulating material layer 42 can be formed. Alternatively, the groove part 41 is embedded with, for example, Ti, W, Mo, Mn, or Cu, whereby the light shielding material layer 42 can be formed. Then, the etching resist layer is removed. Thus, a structure shown in FIG. 14B can be obtained.

Figure 15A:
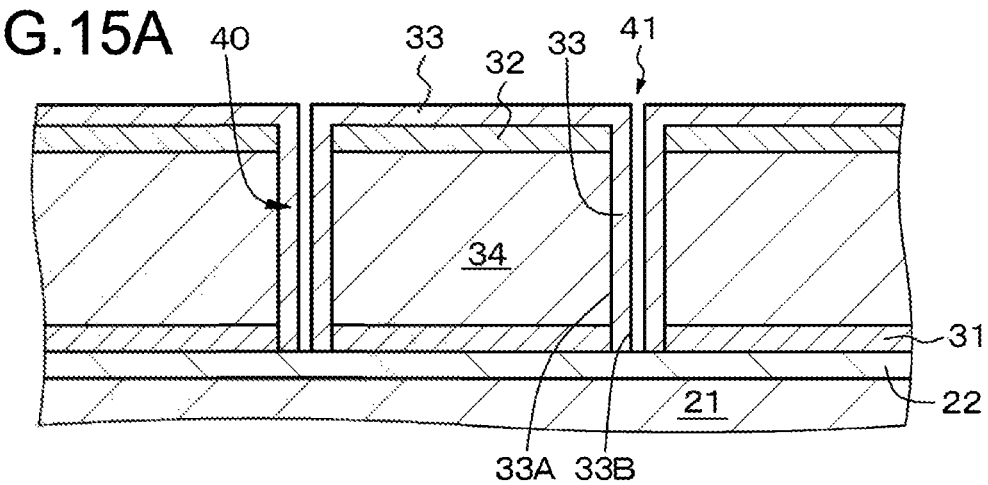
FIGS. 15A and 15B are schematic partial end views of the first compound semiconductor layer or the like for describing a modified example of the method for manufacturing the photoelectric conversion element of the second embodiment.
Figure 15B:
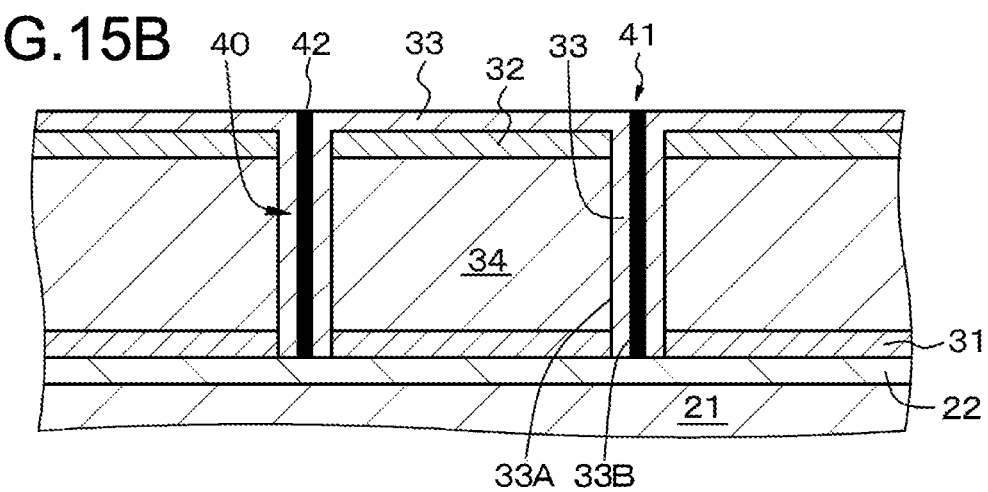

Alternatively, when the element isolation layer (the element isolation layer made of the third compound semiconductor material) 33 is formed inside at least the recess part 40 on the basis of a well-known MOCVD method in the same step as [Step 120] of the first embodiment, the film forming conditions of the element isolation layer 33 are controlled to simultaneously form the groove part 41 in the element isolation layer 33 inside the recess part 40 (see FIG. 15A). Further, the insulating material layer or the light shielding material layer 42 is formed inside the groove 41 on the basis of, for example, a sputtering method. Thus, a structure shown in FIG. 15B can be obtained.

FIG. 2B shows a schematic partial cross-sectional view of a modified example (a photoelectric conversion element 10D) of the photoelectric conversion element of the second embodiment. However, like the modified example of the photoelectric conversion element of the first embodiment shown in FIG. 1B, a second electrode 52 may be formed on the surface on the light incident side of a first compound semiconductor layer 31.

Third Embodiment

A third embodiment is a modification of the photoelectric conversion elements of the first and second embodiments and relates to a method for manufacturing a photoelectric conversion element according to a second aspect of the present technology. Hereinafter, a description will be given of the method for manufacturing the photoelectric conversion element of the third embodiment with reference to FIGS. 16A, 16B, 16C, 17A, and 17B each showing a schematic partial end view of a first compound semiconductor layer or the like.

[Step 300]

On a substrate, a first compound semiconductor layer 31 made of a first compound semiconductor material having a first conductivity type and a photoelectric conversion layer 34 are sequentially formed. Specifically, an InP substrate (film forming substrate) 21 made of InP and having a buffer layer 22 having a thickness of 0.1 µm to 1 µm is prepared.

Figure 16A:
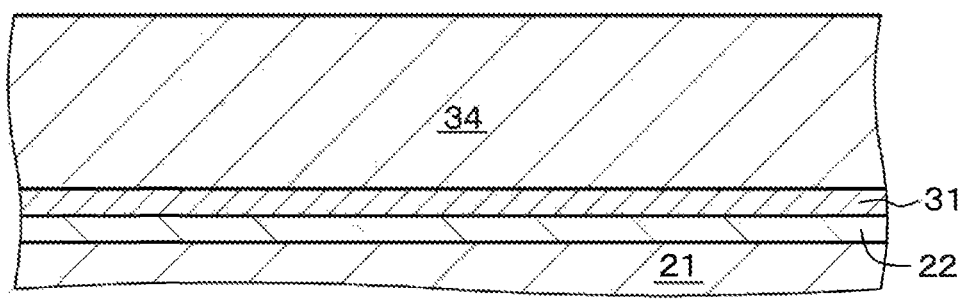
FIGS. 16A, 16B, and 16C are schematic partial end views of a first compound semiconductor layer or the like for describing a method for manufacturing a photoelectric conversion element of a third embodiment.

Further, the first compound semiconductor layer 31 having a thickness of 0.1 µm to 1 µm and the photoelectric conversion layer 34 having a thickness of 3 µm to 5 µm are sequentially formed on the buffer layer 22 on the basis of a well-known MOCVD method (see FIG. 16A).

[Step 310]

Figure 16B:
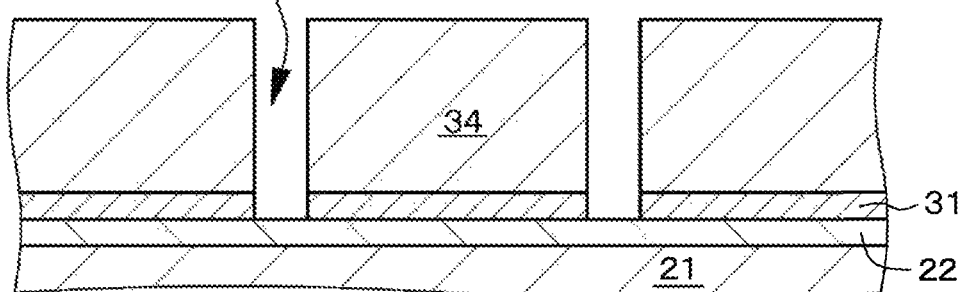
Figure 16C:
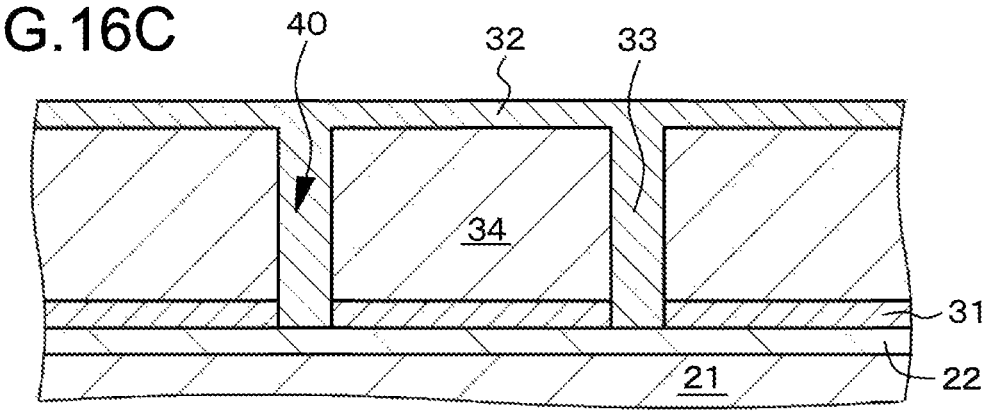

Then, a recess part 40 is formed at least in the photoelectric conversion layer 34 (see FIG. 16B). Specifically, an etching resist layer is formed on the photoelectric conversion layer 34, and the photoelectric conversion layer 34 and the first compound semiconductor layer 31 are etched by the etching resist layer serving as an etching mask on the basis of, for example, a dry etching method or a wet etching method, whereby the recess part 40 can be formed in the photoelectric conversion layer 34 and the first compound semiconductor layer 31. Then, the etching resist layer is removed. Here, the recess part 40 is formed between adjacent photoelectric conversion elements 10A, specifically, for example, at the portion of the photoelectric conversion layer 34 corresponding to the boundary region between the adjacent photoelectric conversion elements 10A. In other words, the recess part 40 is provided in, for example, a parallel cross shape. That is, the photoelectric conversion element 10A is surrounded by the recess part 40. Note that the recess part 40 may be formed in the photoelectric conversion layer 34.

[Step 320]

Next, an element isolation layer 33 (specifically, an element isolation layer 33 made of a third compound semiconductor material having the first conductivity type and different from a material constituting the photoelectric conversion layer 34 in the third embodiment) is formed at least inside the recess part 40, and a second compound semiconductor layer 32 made of a second compound semiconductor material having the first conductivity type is formed so as to cover the photoelectric conversion layer 34. Specifically, the element isolation layer is formed on an entire surface including the recess part 40 on the basis of a well-known MOCVD method (see FIG. 16C). Here, the portion of the element isolation layer formed on the photoelectric conversion layer 34 corresponds to the second compound semiconductor layer 32. The second compound semiconductor layer 32 on the photoelectric conversion layer 34 has a thickness of 0.1 µm to 1 µm. That is, in the third embodiment, the second compound semiconductor layer 32 and the element isolation layer 33 are integrally made of the same compound semiconductor material, and the second compound semiconductor layer (on the photoelectric conversion layer 34) or the element isolation layer 33 (inside the recess part 40) is formed depending on their places to be formed.

Note that the element isolation layer 33 may be formed inside the recess part 40. In this case, the second compound semiconductor layer 32 may only be formed so as to cover the photoelectric conversion layer 34 and the recess part 40. Alternatively, the element isolation layer 33 may be formed on the entire surface including the recess part 40, and the second compound semiconductor layer 32 may be further formed on the element isolation layer 33.

[Step 330]

Figure 17A:
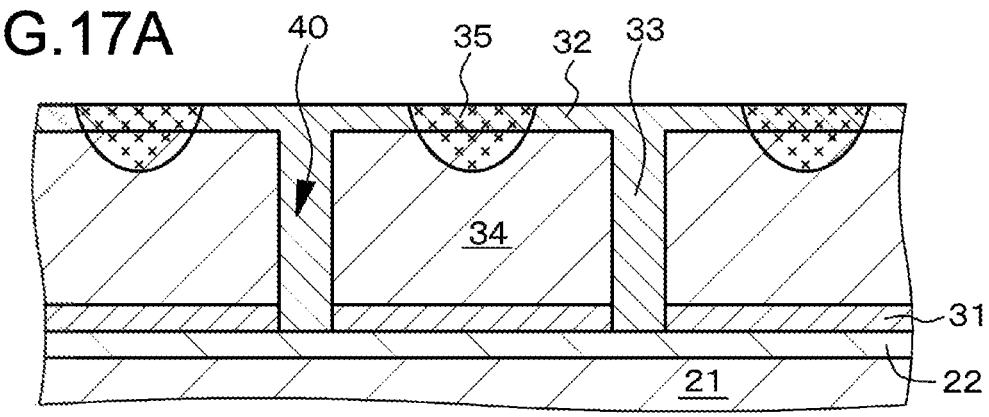
FIGS. 17A and 17B are schematic partial end views of the first compound semiconductor layer or the like for describing the method for manufacturing the photoelectric conversion element of the third embodiment in succession to FIG. 16C.

Then, a second conductivity type region 35 having a second conductivity type different from the first conductivity type and reaching the photoelectric conversion layer 34 is formed at least in a part of the second compound semiconductor layer 32 (see FIG. 17A). Specifically, a mask layer is formed on the second compound semiconductor layer 32 and any impurity (specifically zinc, Zn) having the second conductivity type (p-type) is, for example, vapor-phase diffused or solid-phase diffused, whereby the second conductivity type region 35 can be formed. Then, the mask layer is removed.

[Step 340]

Figure 17B:
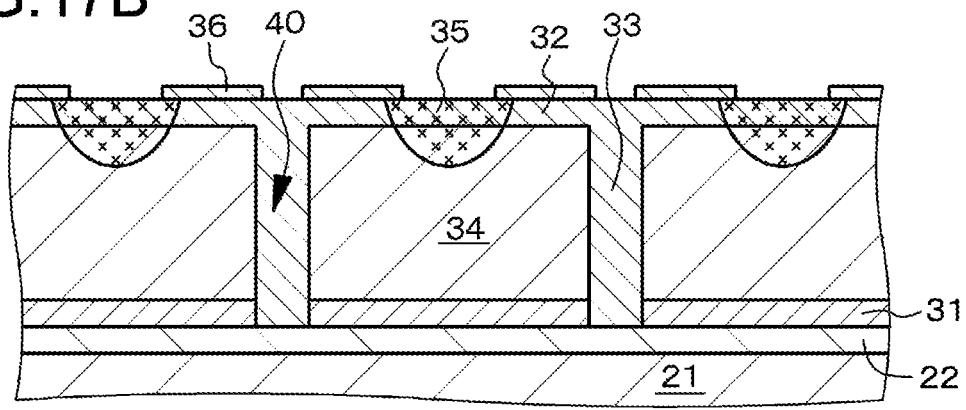

Then, as partially shown in FIG. 17B, the same steps as [Step 140] to [Step 160] of the first embodiment are performed, whereby the photoelectric conversion element and the imaging apparatus of the third embodiment can be obtained.

In the third embodiment as well, a second electrode 52 may be formed on the surface on the light incident side of the first compound semiconductor layer 31 like the modified example of the photoelectric conversion element of the first embodiment. In addition, an insulating material layer or a light shielding material layer 42 may be formed like the second embodiment.

Fourth Embodiment

A fourth embodiment is a modification of the photoelectric conversion elements of the first and second embodiments and relates to a method for manufacturing a photoelectric conversion element according to a third aspect of the present technology. Hereinafter, a description will be given of the method for manufacturing the photoelectric conversion element of the fourth embodiment with reference to FIGS. 18A, 18B, 19A, 19B, 20A, and 20B each showing a schematic partial end view of a first compound semiconductor layer or the like.

[Step 400]

Figure 18A:
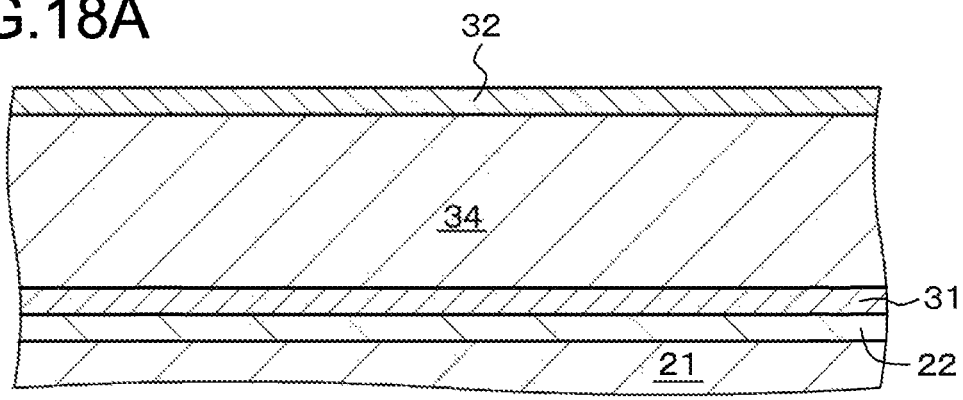
FIGS. 18A and 18B are schematic partial end views of a first compound semiconductor layer or the like for describing a method for manufacturing a photoelectric conversion element of a fourth embodiment.
Figure 18B:
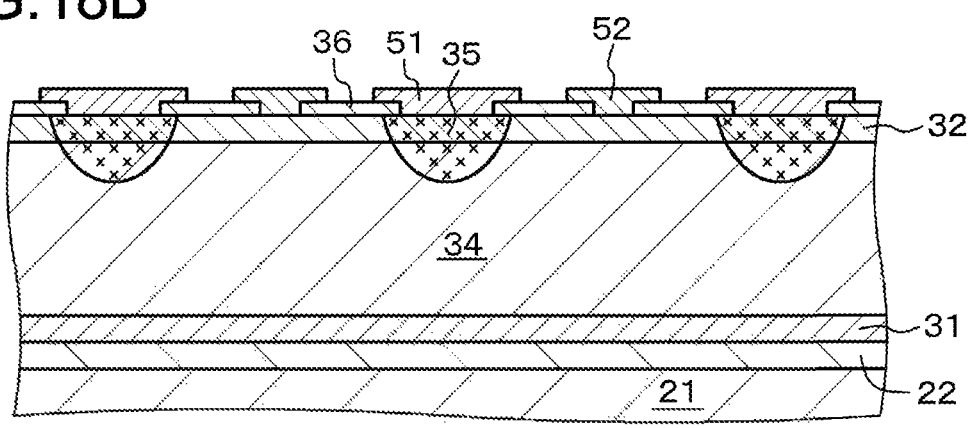

First, like [Step 100] of the first embodiment, a first compound semiconductor layer 31 made of a first compound semiconductor material having a first conductivity type, a photoelectric conversion layer 34, and a second compound semiconductor layer 32 made of a second compound semiconductor material having the first conductivity type are sequentially formed on a substrate (see FIG. 18A).

[Step 410]

Then, like [Step 130] of the first embodiment, a second conductivity type region 35 having a second conductivity type different from the first conductivity type and reaching the photoelectric conversion layer 34 is formed in a part of the second compound semiconductor layer 32.

[Step 420]

Then, like [Step 140] of the first embodiment, a first electrode 51 is formed on the second conductivity type region 35. In addition, a second electrode 52 is formed on the second compound semiconductor layer 32. Thus, a structure shown in FIG. 18B can be obtained.

[Step 430]

Figure 19A:
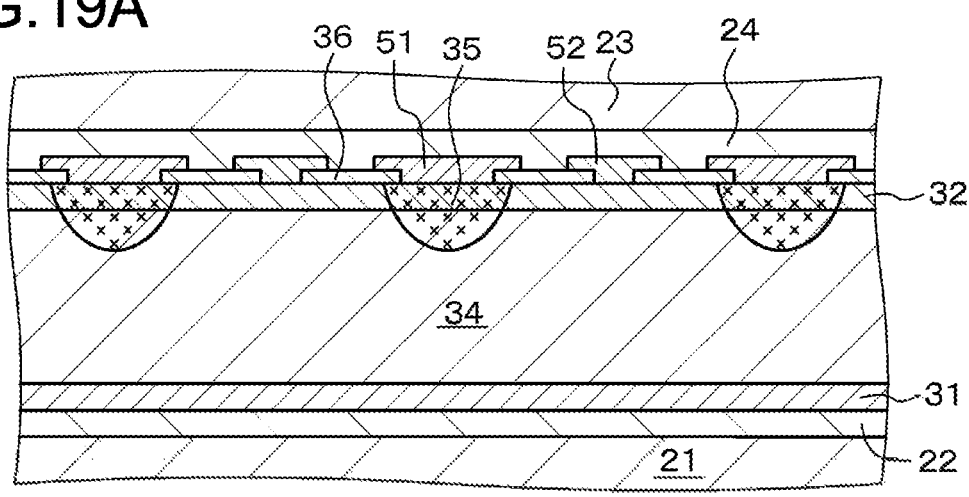
FIGS. 19A and 19B are schematic partial end views of the first compound semiconductor layer or the like for describing the method for manufacturing the photoelectric conversion element of the fourth embodiment in succession to FIG. 18B.
Figure 19B:
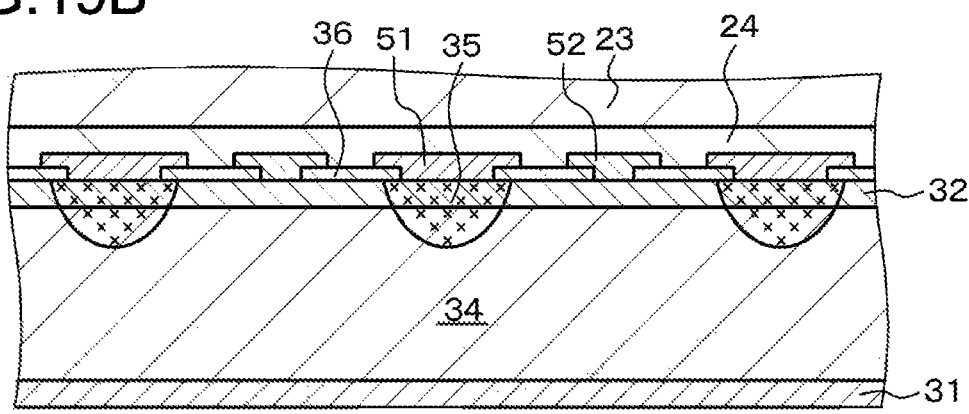

Next, a substrate 21 and a support substrate 23 are bonded together via the photoelectric conversion element and an insulating film 24 on the basis of a well-known method (see FIG. 19A). Then, the substrate 21 and a buffer layer 22 are removed on the basis of a well-known method to expose the first compound semiconductor layer 31 (see FIG. 19B).

[Step 440]

Figure 20A:
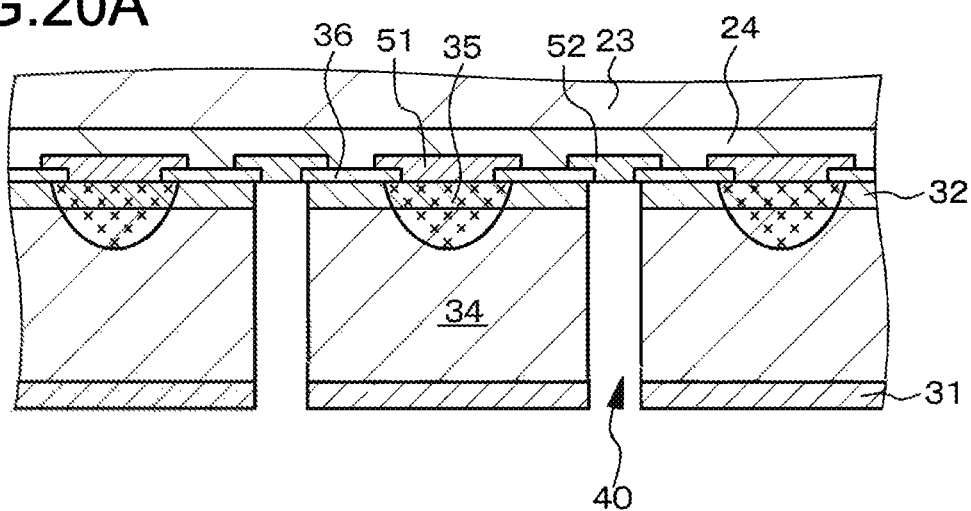
FIGS. 20A and 20B are schematic partial end views of the first compound semiconductor layer or the like for describing the method for manufacturing the photoelectric conversion element of the fourth embodiment in succession to FIG. 19B.

Then, a recess part 40 is formed at least in the photoelectric conversion layer 34 (see FIG. 20A). Specifically, an etching resist layer is formed on the first compound semiconductor layer 31, and the first compound semiconductor layer 31, the photoelectric conversion layer 34, and the second compound semiconductor layer 32 are etched by the etching resist layer serving as an etching mask on the basis of, for example, a dry etching method or a wet etching method, whereby the recess part 40 can be formed in the second compound semiconductor layer 32, the photoelectric conversion layer 34, and the first compound semiconductor layer 31. Then, the etching resist layer is removed. In some cases, the recess part 40 may be formed in the photoelectric conversion layer 34 and the first compound semiconductor layer 31. Here, the recess part 40 is formed between adjacent photoelectric conversion elements 10A, specifically, for example, at the portion of the first compound semiconductor layer 31 or the like corresponding to the boundary region between the adjacent photoelectric conversion elements. In other words, the recess part 40 is provided in, for example, a parallel cross shape. That is, the photoelectric conversion element is surrounded by the recess part 40.

[Step 450]

Figure 20B:
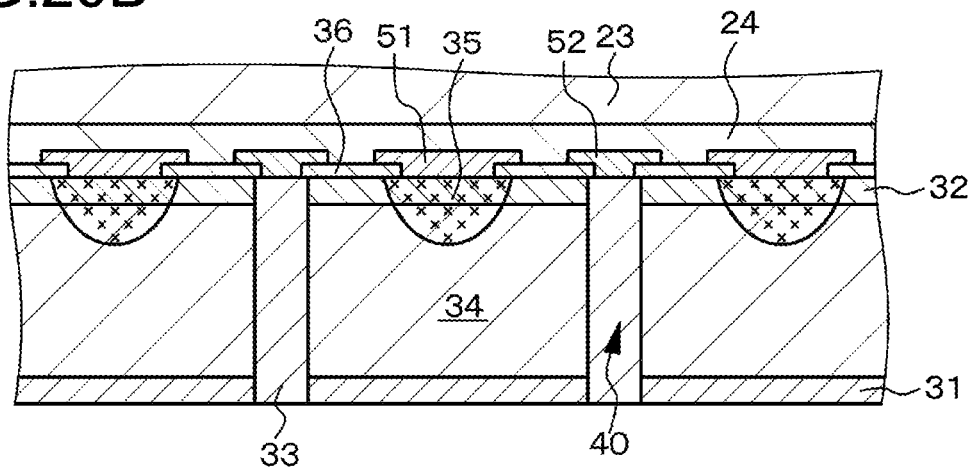

Next, an element isolation layer 33 (specifically, an element isolation layer 33 made of a third compound semiconductor material having the first conductivity type and different from a material constituting the photoelectric conversion layer 34 in the fourth embodiment) is formed at least inside the recess part 40 on the basis of a well-known MOCVD method (see FIG. 20B). Note that the element isolation layer 33 is formed only inside the recess part 40 in the illustrated example. Specifically, for example, a selective growth mask layer may only be formed on the first compound semiconductor layer 31 to prevent the element isolation layer from being undesirably formed on the first compound semiconductor layer 31 and removed after the element isolation layer 33 is formed on the basis of the well-known MOCVD method. Note that the element isolation layer 33 may be formed not only inside the recess part 40 but also on the first compound semiconductor layer 31. Then, dicing is performed to divide the photoelectric conversion elements into a group of photoelectric conversion elements (a group of imaging elements) for an imaging apparatus.

[Step 460]

Then, a flattening film 37 is formed on the exposed first compound semiconductor layer 31, a condensing lens 38 is formed on the flattening film 37, and dicing is performed to divide the photoelectric conversion elements into the group of photoelectric conversion elements (the group of the imaging elements) for the imaging apparatus. Further, the same step as [Step 160] of the first embodiment is performed, whereby the photoelectric conversion element and the imaging apparatus of the fourth embodiment can be obtained.

In the fourth embodiment as well, a second electrode 52 may be formed on the surface on the light incident side of the first compound semiconductor layer 31 like the modified example of the photoelectric conversion element of the first embodiment. In addition, an insulating material layer or a light shielding material layer 42 may be formed like the second embodiment.

In some cases, after [Step 420], the recess part may be formed at least in the second compound semiconductor layer 32 and the photoelectric conversion layer 34 from the side of the second compound semiconductor layer. Specifically, the recess part may be formed in the second compound semiconductor layer 32 and the photoelectric conversion layer 34, or may be formed in the second compound semiconductor layer 32, the photoelectric conversion layer 34, and the first compound semiconductor layer 31. Further, the element isolation layer 33 (specifically the element isolation layer 33 made of the third compound semiconductor material having the first conductivity type and different from the material constituting the photoelectric conversion layer 34) is formed at least inside the recess part 40 on the basis of the well-known MOCVD method and the same steps as [Step 150] and [Step 160] of the first embodiment are performed, whereby the photoelectric conversion element and the imaging apparatus of the fourth embodiment can be obtained.

Fifth Embodiment

A fifth embodiment is a modification of the photoelectric conversion elements of the first and second embodiments and relates to a method for manufacturing a photoelectric conversion element according to a fourth aspect of the present technology. Hereinafter, a description will be given of the method for manufacturing the photoelectric conversion element of the fifth embodiment with reference to FIGS. 21A, 21B, 21C, 22A, 22B, and 22C each showing a schematic partial end view of a first compound semiconductor layer or the like.

[Step 500]

Figure 21A:
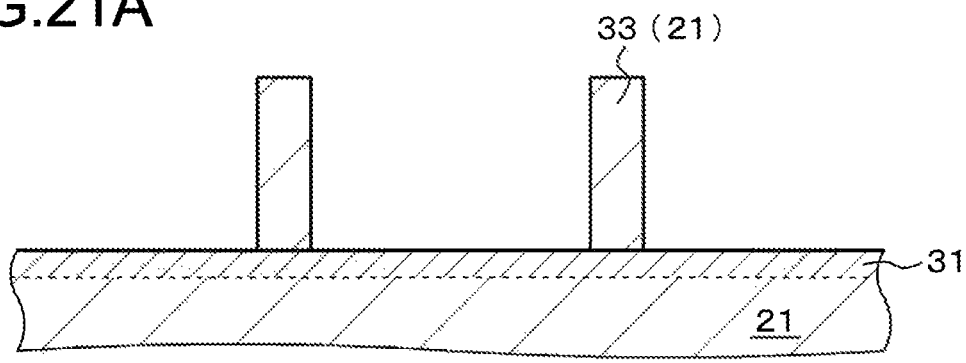
FIGS. 21A, 21B, and 21C are schematic partial end views of a first compound semiconductor layer or the like for describing a method for manufacturing a photoelectric conversion element of a fifth embodiment.
Figure 21B:
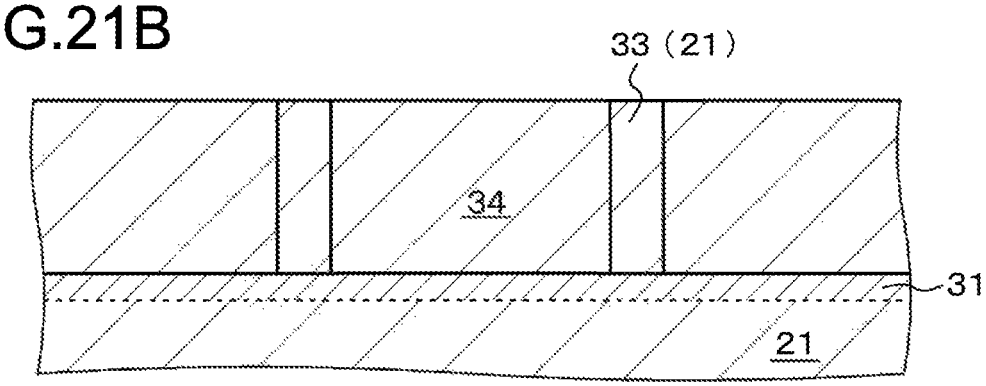
Figure 21C:
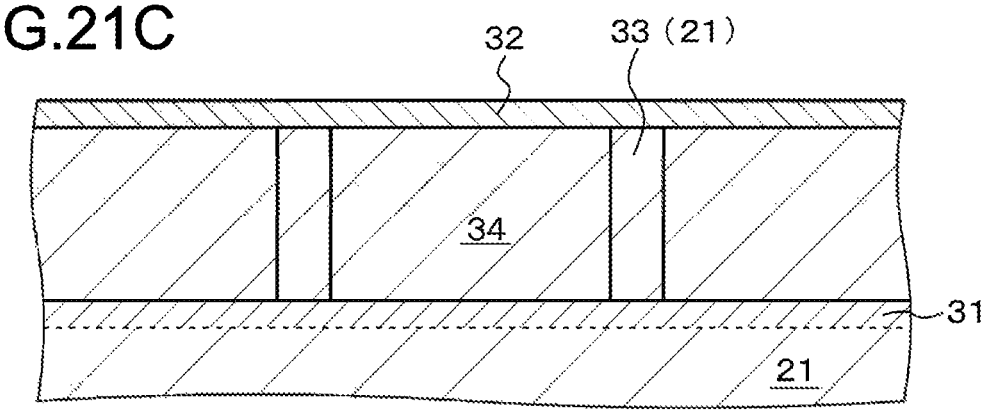

First, an element isolation layer 33 is formed on a substrate 21 having a first conductivity type to obtain a first compound semiconductor layer 31 surrounded by the element isolation layer 33 and constituted by the surface region of the substrate 21 (see FIG. 21A). Specifically, an etching resist layer is formed on the substrate (film forming substrate) 21 made of InP and the substrate 21 is etched by the etching resist layer serving as an etching mask on the basis of, for example, a dry etching method, whereby the element isolation layer 33 constituted by a part of the substrate 21 can be formed.

[Step 510]

Next, a photoelectric conversion layer 34 is formed on the first compound semiconductor layer 31 on the basis of a MOCVD method. Then, flattening processing is performed as required. Thus, a structure shown in FIG. 21B can be obtained. Note that a condition under which the photoelectric conversion layer 34 is not formed on the lateral surface of the element isolation layer 33 is selected.

[Step 520]

Next, a second compound semiconductor layer 32 made of a second compound semiconductor material having the first conductivity type is formed on the photoelectric conversion layer 34 (specifically an entire surface in the fifth embodiment) on the basis of the MOCVD method. Thus, a structure shown in FIG. 21C can be obtained.

[Step 530]

Figure 22A:
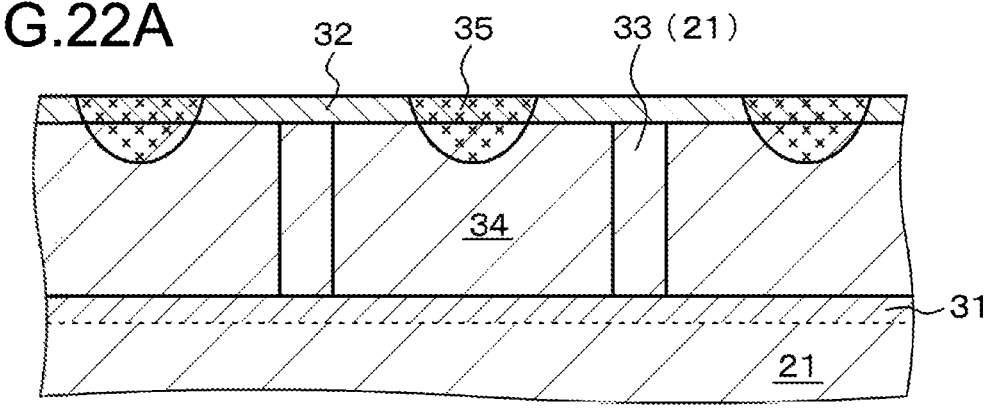
FIGS. 22A, 22B, and 22C are schematic partial end views of the first compound semiconductor layer or the like for describing the method for manufacturing the photoelectric conversion element of the fifth embodiment in succession to FIG. 21C.
Figure 22B:
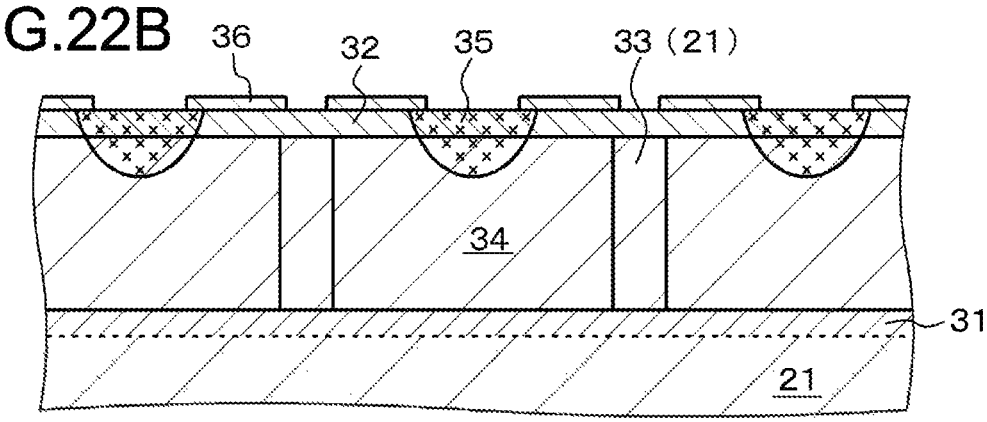
Figure 22C:
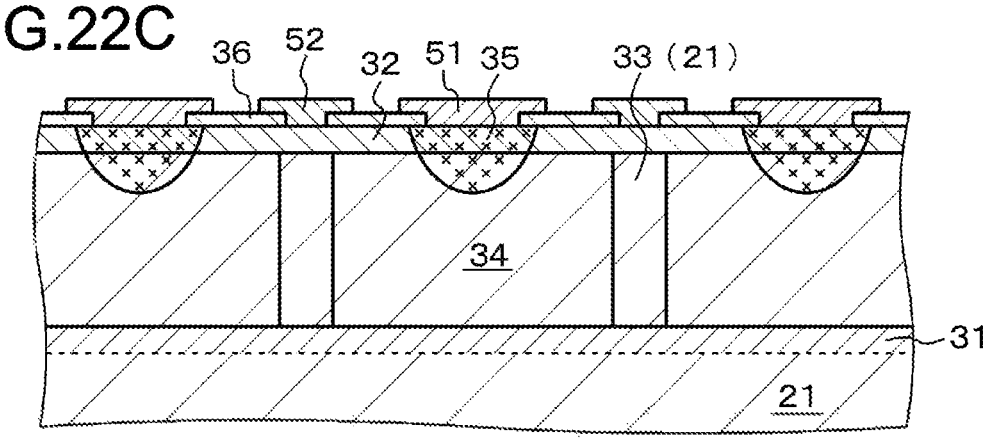

Then, like [Step 130] of the first embodiment, a second conductivity type region 35 having a second conductivity type different from the first conductivity type and reaching the photoelectric conversion layer 34 is formed at least in a part of the second compound semiconductor layer 32 (see FIG. 22A).

[Step 540]

Next, a first electrode 51 is formed on the second conductivity type region 35. In addition, a second electrode 52 electrically connected to the first compound semiconductor layer 31 is formed. Specifically, like [Step 140] of the first embodiment, a covering layer 36 made of SiN is formed on the second conductivity type region 35 and the element isolation layer 33, and then opening parts are formed in the portions of the covering layer 36, in which the first electrode 51 and the second electrode 52 are to be formed, on the basis of a photolithography technique and an etching technique (see FIG. 22B). Further, the first electrode 51 is formed from a position above the second conductivity type region exposed at the bottom part of the opening part to a position above the covering layer 36, and the second electrode 52 is formed from a position above the element isolation layer 33 exposed at the bottom part of the opening part to a position above the covering layer 36. Thus, the photoelectric conversion element having a structure shown in FIG. 22C can be obtained.

[Step 550]

Then, the same steps as [Step 150] and [Step 160] of the first embodiment are performed, whereby the photoelectric conversion element and the imaging apparatus of the fifth embodiment can be obtained.

In the fifth embodiment or sixth and seventh embodiments that will be described later as well, a second electrode 52 may be formed on the surface on the light incident side of the first compound semiconductor layer 31 like the modified example of the photoelectric conversion element of the first embodiment. In addition, an insulating material layer or a light shielding material layer 42 may be formed like the second embodiment.

Sixth Embodiment

A sixth embodiment is a modification of the fifth embodiment. The sixth embodiment is different from the fifth embodiment in the following point. That is, in the fifth embodiment, the condition under which the photoelectric conversion layer 34 is not formed on the lateral surface of the element isolation layer 33 is selected as the film forming condition of the photoelectric conversion layer 34 on the basis of the MOCVD method. On the other hand, in the sixth embodiment, a condition under which a photoelectric conversion layer 34 is formed also on the lateral surface of an element isolation layer 33 is selected as the film forming condition of the photoelectric conversion layer 34 on the basis of a MOCVD method. Hereinafter, a description will be given of a method for manufacturing the photoelectric conversion element of the sixth embodiment with reference to FIGS. 23A, 23B, 23C, 24A, 24B, and 24C each showing a schematic partial end view of a first compound semiconductor layer or the like.

[Step 600]

Figure 23A:
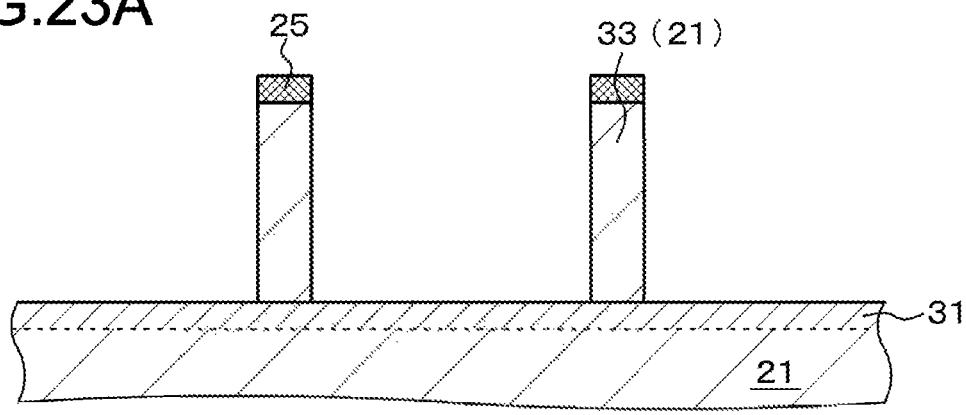
FIGS. 23A, 23B, and 23C are schematic partial end views of a first compound semiconductor layer or the like for describing a method for manufacturing a photoelectric conversion element of a sixth embodiment.
Figure 23B:
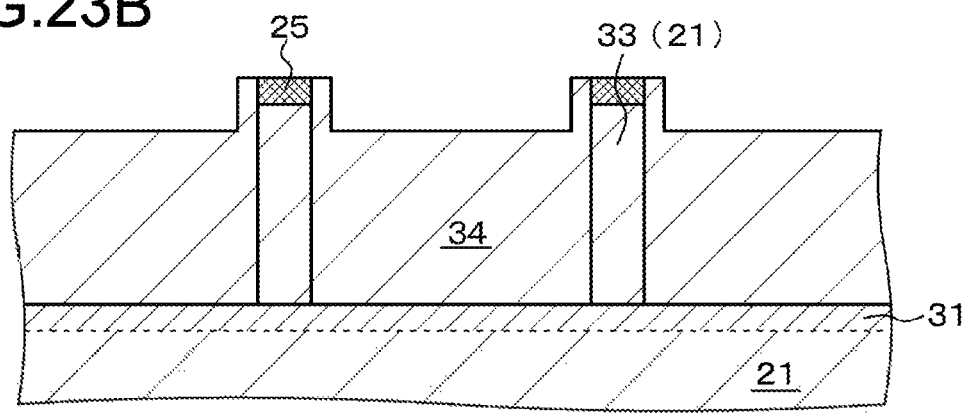
Figure 23C:
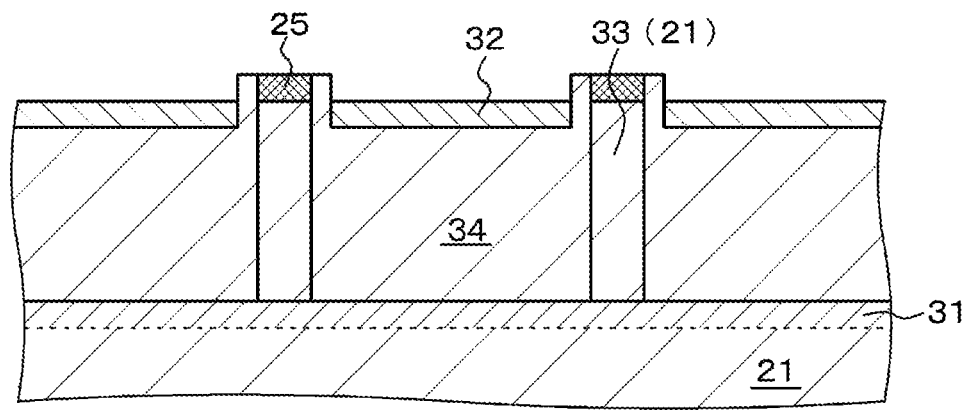

First, an element isolation layer 33 is formed on a substrate 21 made of InP having a first conductivity type to obtain a first compound semiconductor layer 31 surrounded by the element isolation layer 33 and constituted by the surface region of the substrate 21 (see FIG. 23A). Specifically, a hard mask layer 25 is formed on the part of the substrate 21 on which the element isolation layer 33 is to be formed. Further, the substrate 21 is etched by the hard mask layer 25 serving as an etching mask on the basis of, for example, a dry etching method, whereby the element isolation layer 33 constituted by a part of the substrate 21 can be formed.

[Step 610]

Then, a photoelectric conversion layer 34 surrounded by the element isolation layer 33 is formed on the first compound semiconductor layer 31 on the basis of a MOCVD method. Thus, a structure shown in FIG. 23B can be obtained. As a film forming condition on the basis of the MOCVD method, a condition under which the photoelectric conversion layer 34 is formed also on the lateral surface of the element isolation layer 33 is selected. Then, flattening processing may be performed as required.

[Step 620]

Next, a second compound semiconductor layer 32 made of a second compound semiconductor material having the first conductivity type is formed on the photoelectric conversion layer 34 on the basis of the MOCVD method. Thus, a structure shown in FIG. 23C can be obtained. Further, flattening processing is performed. Thus, a structure shown in FIG. 24A can be obtained.

[Step 630]

Figure 24A:
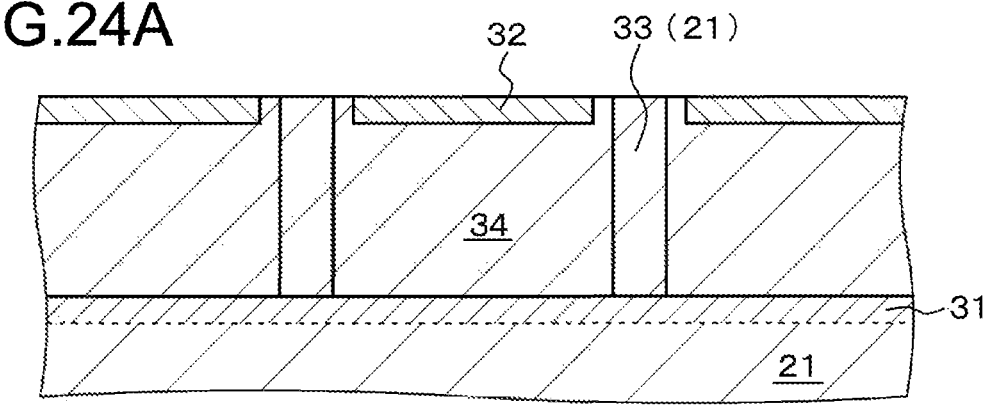
FIGS. 24A, 24B, and 24C are schematic partial end views of the first compound semiconductor layer or the like for describing the method for manufacturing the photoelectric conversion element of the sixth embodiment in succession to FIG. 23C.
Figure 24B:
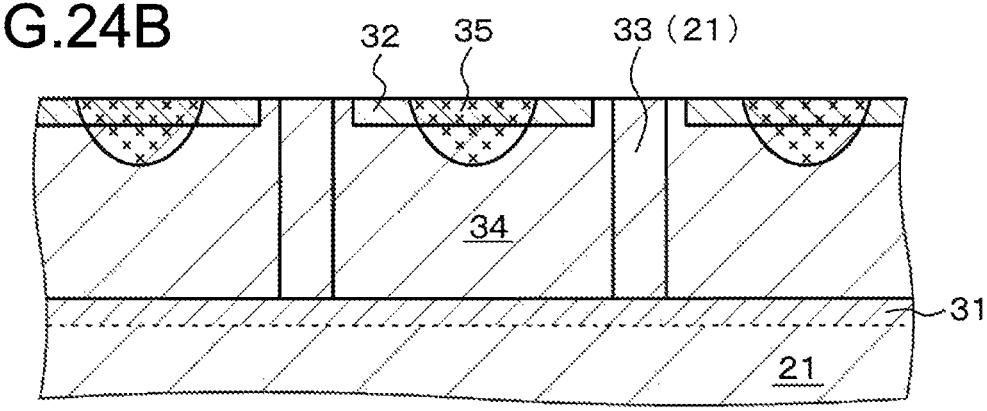
Figure 24C:
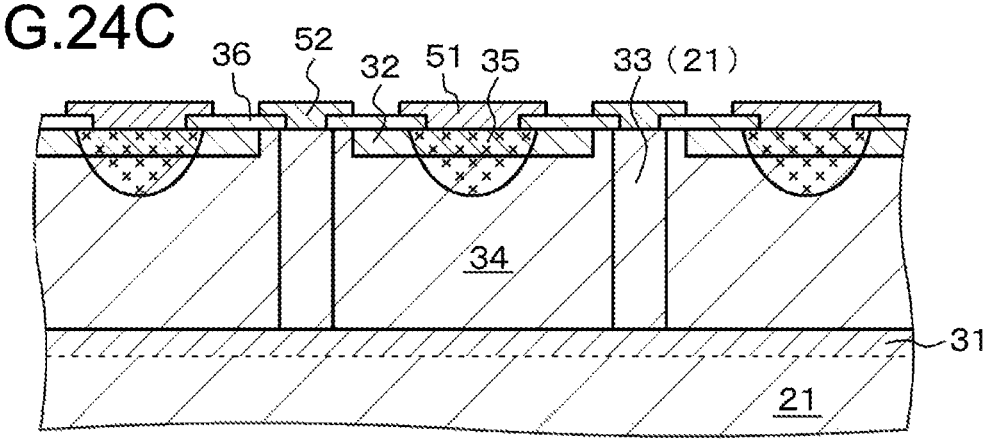

Then, like [Step 130] of the first embodiment, a second conductivity type region 35 having a second conductivity type different from the first conductivity type and reaching the photoelectric conversion layer 34 is formed in a part of the second compound semiconductor layer 32 (see FIG. 24B).

[Step 640]

Next, a first electrode 51 is formed on the second conductivity type region 35. In addition, a second electrode 52 electrically connected to the first compound semiconductor layer 31 is formed. Specifically, the same step as [Step 540] of the fifth embodiment is performed. Thus, a photoelectric conversion element having a structure shown in FIG. 24C can be obtained.

[Step 650]

Then, the same steps as [Step 150] and [Step 160] of the first embodiment are performed, whereby the photoelectric conversion element and the imaging apparatus of the fifth embodiment can be obtained.

Seventh Embodiment

A seventh embodiment is also a modification of the fifth embodiment. The seventh embodiment is different from the fifth embodiment in the following point. That is, in the fifth embodiment, the element isolation layer 33 is constituted by a part of the substrate 21. On the other hand, in the seventh embodiment, an element isolation layer 33 is made of an insulating material layer, or an outer part of the element isolation layer 33 is made of the insulating material layer and the remaining part (core part) thereof is made of a light shielding material layer. Hereinafter, a description will be given of a method for manufacturing the photoelectric conversion element of the seventh embodiment with reference to FIGS. 25A, 25B, 25C, 26A, 26B, and 26C each showing a schematic partial end view of a first compound semiconductor layer or the like.

[Step 700]

Figure 25A:
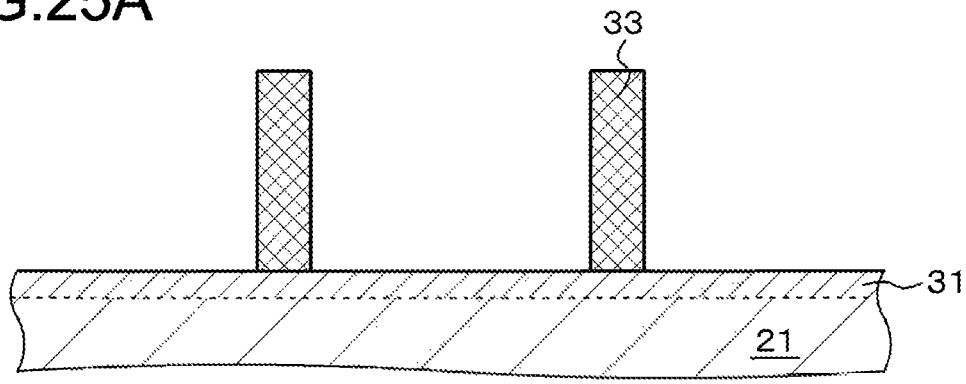
FIGS. 25A, 25B, and 25C are schematic partial end views of a first compound semiconductor layer or the like for describing a method for manufacturing a photoelectric conversion element of a seventh embodiment.
Figure 25B:
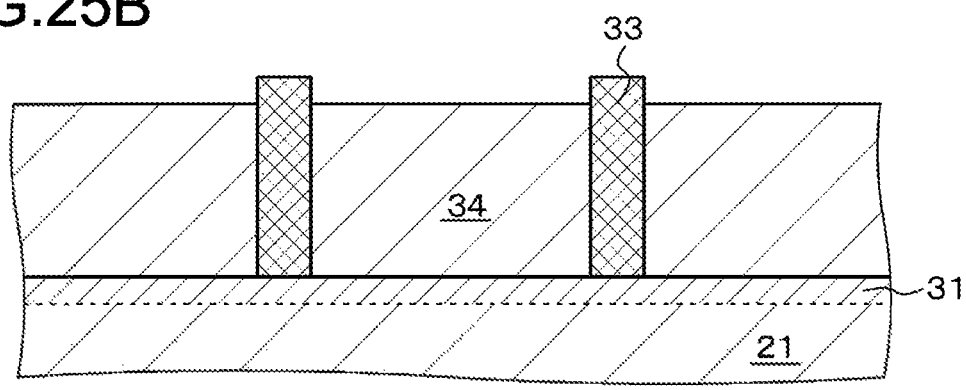
Figure 25C:
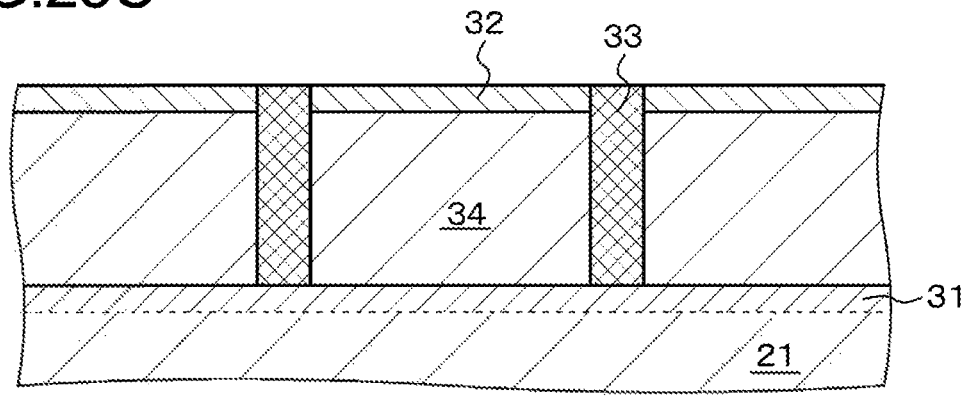

First, an element isolation layer 33 is formed on a substrate 21 having a first conductivity type to obtain a first compound semiconductor layer 31 surrounded by the element isolation layer 33 and constituted by the surface region of the substrate 21 (see FIG. 25A). Specifically, an insulating material layer is formed on the substrate (film forming substrate) 21 made of InP, an etching resist layer is formed on the insulating material layer, and the insulating material layer is etched by the etching resist layer serving as an etching mask on the basis of, for example, a dry etching method, whereby the element isolation layer 33 made of the insulating material layer can be formed.

Alternatively, a sacrificial layer is formed on the substrate (film forming substrate) 21 made of InP, an etching resist layer is formed on the sacrificial layer, and the sacrificial layer is etched by the etching resist layer serving as an etching mask on the basis of, for example, a dry etching method, whereby a groove in which the element isolation layer is to be formed in the sacrificial layer. Further, the groove part is embedded with an insulating material. Alternatively, the lateral surface and the bottom surface of the groove part are covered with the insulating material, and the remaining part of the groove part is embedded with a light shielding material. Further, the insulating material (or the insulating material and the light shielding material) on the top surface of the sacrificial layer is removed, and then the sacrificial layer is removed. Thus, the element isolation layer 33 can be obtained.

[Step 710]

Then, a photoelectric conversion layer 34 surrounded by the element isolation layer 33 is formed on the first compound semiconductor layer 31 on the basis of a MOCVD method. Thus, a structure shown in FIG. 25B can be obtained. Note that flattening processing may be then performed as required.

[Step 720]

Next, a second compound semiconductor layer 32 made of a second compound semiconductor material having a first conductivity type is formed on the photoelectric conversion layer 34 on the basis of the MOCVD method. Thus, a structure shown in FIG. 25C can be obtained.

[Step 730]

Figure 26A:
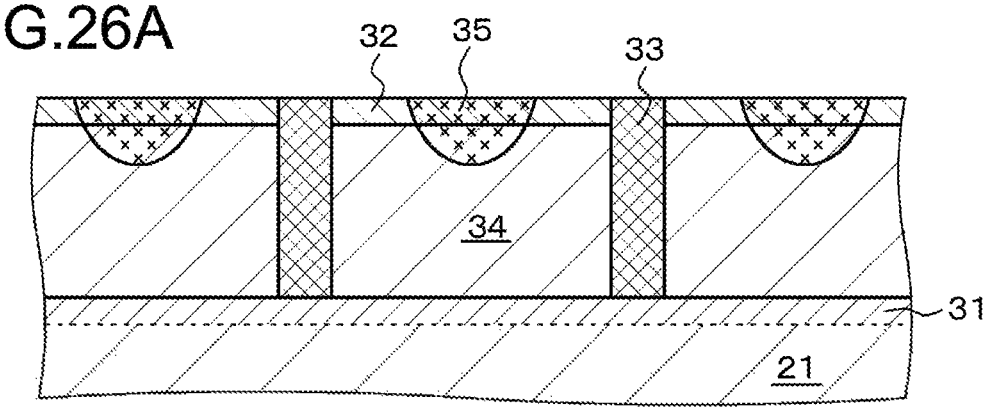
FIGS. 26A, 26B, and 26C are schematic partial end views of the first compound semiconductor layer or the like for describing the method for manufacturing the photoelectric conversion element of the seventh embodiment in succession to FIG. 25C.

Then, like [Step 130] of the first embodiment, a second conductivity region 35 having a second conductivity type different from the first conductivity type and reaching the photoelectric conversion layer 34 is formed in a part of the second compound semiconductor layer 32 (see FIG. 26A).

[Step 740]

Figure 26B:
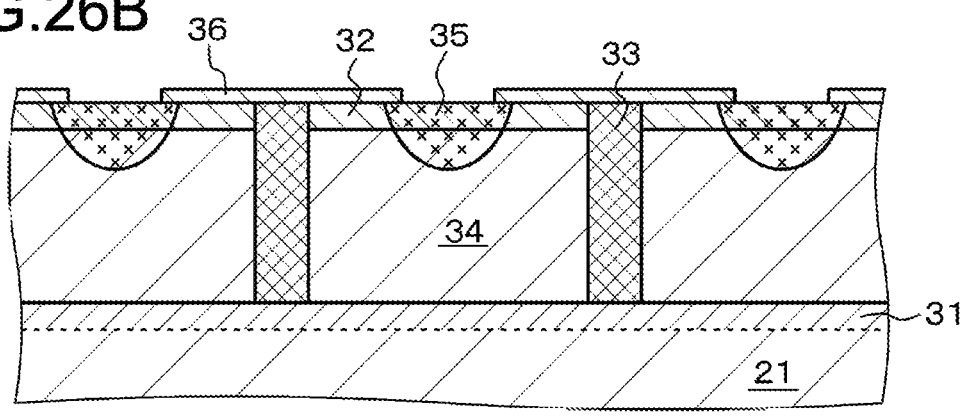
Figure 26C:
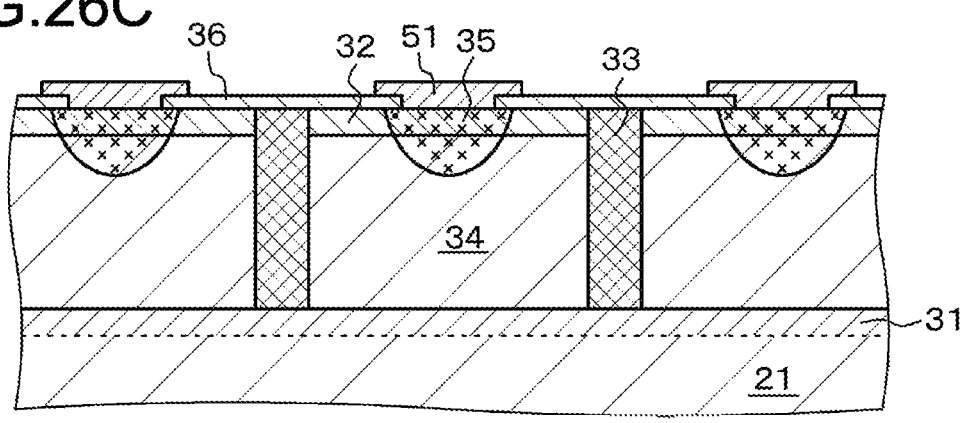

Next, a first electrode 51 is formed on the second conductivity type region 35 (see FIGS. 26B and 26C). Specifically, the same step as [Step 540] of the fifth embodiment is performed, whereby the first electrode 51 can be obtained.

[Step 750]

Then, a second electrode 52 electrically connected to the first compound semiconductor layer 31 is formed. Specifically, in the same step as [Step 150] of the first embodiment, a part of the substrate 21 is removed in its thickness direction, the second electrode 52 made of a transparent conductive material such as ITO and a flattening film 37 are formed on the exposed first compound semiconductor layer 31, and a condensing lens 38 is formed on the flattening film 37. Note that the second electrode 52 can be a solid film. That is, the second electrode 52 can be an electrode common to photoelectric conversion elements. Thus, the photoelectric conversion element and the imaging apparatus of the seventh embodiment can be obtained.

Eighth Embodiment

An eighth embodiment is also a modification of the fifth embodiment. The eighth embodiment is different from the fifth embodiment in the following point. That is, in the fifth embodiment, the element isolation layer 33 is constituted by a part of the substrate 21. On the other hand, in the eighth embodiment, an element isolation layer 33 is made of an insulating material layer 33A formed on a substrate 21 and a polycrystalline material layer 34A formed on the insulating material layer 33A. Hereinafter, a description will be given of a method for manufacturing the photoelectric conversion element of the eighth embodiment with reference to FIGS. 27A, 27B, 27C, 28A, 28B, and 28C each showing a schematic partial end view of a first compound semiconductor layer or the like.

[Step 800]

Figure 27A:
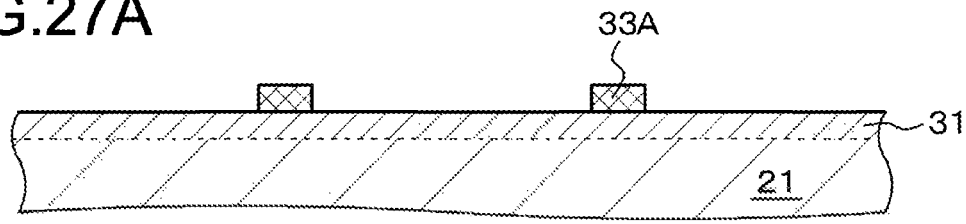
FIGS. 27A, 27B, and 27C are schematic partial end views of a first compound semiconductor layer or the like for describing a method for manufacturing a photoelectric conversion element of an eighth embodiment.
Figure 27B:
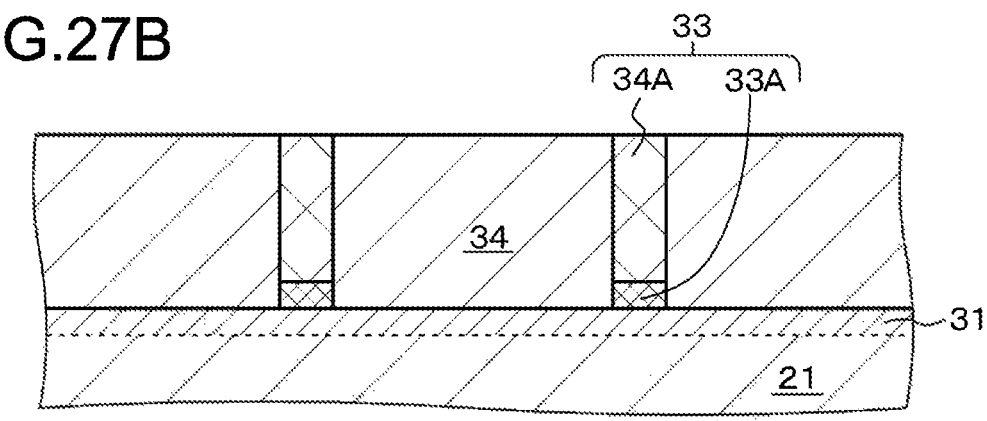
Figure 27C:
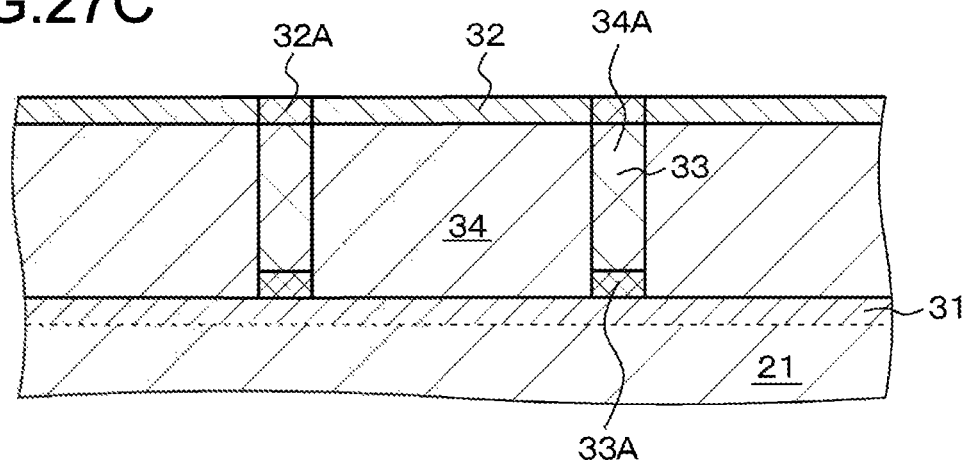

First, an element isolation layer 33 is formed on a substrate 21 having a first conductivity type to obtain a first compound semiconductor layer 31 surrounded by the element isolation layer 33 and constituted by the surface region of the substrate 21 (see FIG. 27A). Specifically, an insulating material layer is formed on the substrate (film forming substrate) 21 made of InP, an etching resist layer is formed on the insulating material layer, and the insulating material layer is etched by the etching resist layer serving as an etching mask on the basis of, for example, a dry etching method, whereby a part of the element isolation layer 33 made of the insulating material layer 33A can be formed.

[Step 810]

Then, a photoelectric conversion layer 34 surrounded by the element isolation layer 33 is formed on the first compound semiconductor layer 31 on the basis of a MOCVD method. Thus, a structure shown in FIG. 27B can be obtained. Here, the portion of the photoelectric conversion layer formed on the insulating material layer 33 becomes polycrystalline, whereby a polycrystalline material layer 34A representing the remaining part of the element isolation layer 33 can be obtained. Thus, the element isolation layer 33 made of the insulating material layer 33A and the polycrystalline material layer 34A formed on the insulating material layer 33A can be obtained. Note that since the polycrystalline material layer 34A is brought into a high resistance state, a carrier hardly flows toward a first electrode 51 or a second electrode 52.

[Step 820]

Next, a second compound semiconductor layer 32 made of a second compound semiconductor material having the first conductivity type is formed on the photoelectric conversion layer 34 and the element isolation layer 33 on the basis of the MOCVD method. Thus, a structure shown in FIG. 27C can be obtained. The portion of the second compound semiconductor layer formed on the element isolation layer 33 becomes polycrystalline, whereby a polycrystalline material layer 32A can be obtained.

[Step 830]

Figure 28A:
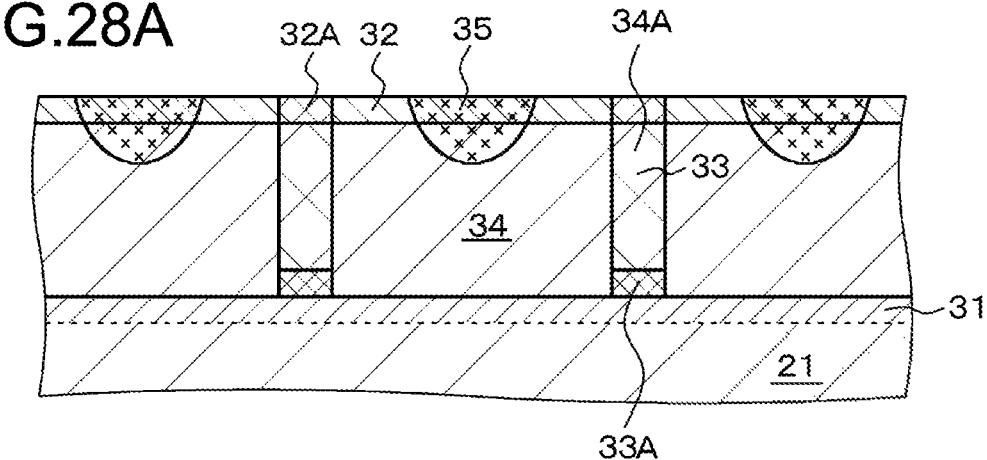
FIGS. 28A, 28B, and 28C are schematic partial end views of the first compound semiconductor layer or the like for describing the method for manufacturing the photoelectric conversion element of the eighth embodiment in succession to FIG. 27C.

Then, like [Step 130] of the first embodiment, a second conductivity type region 35 having a second conductivity type different from the first conductivity type and reaching the photoelectric conversion layer 34 is formed in a part of the second compound semiconductor layer 32 (see FIG. 28A).

[Step 840]

Figure 28B:
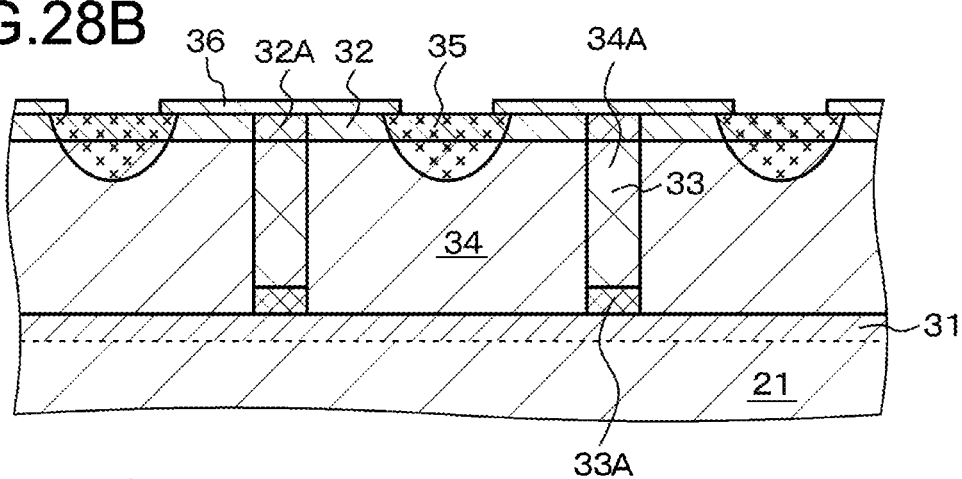
Figure 28C:
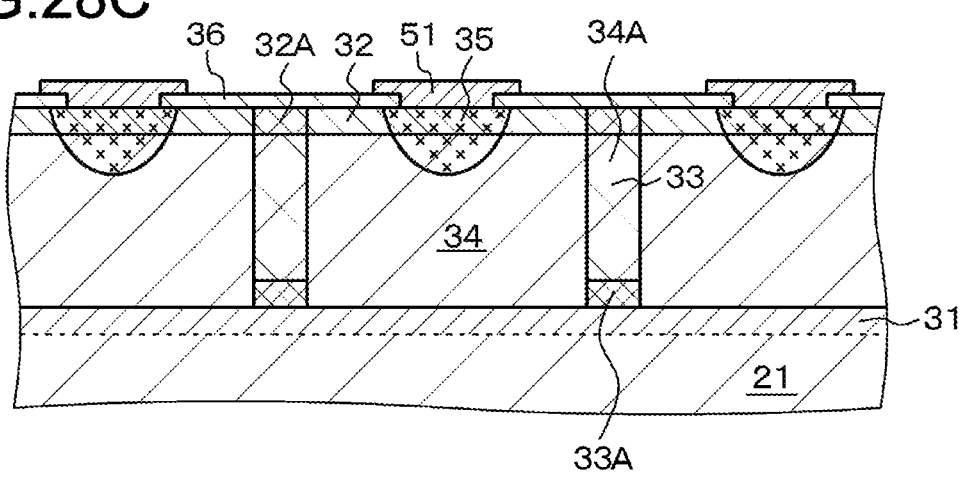

Next, a first electrode 51 is formed on the second conductivity type region 35 (see FIGS. 28B and 28C).

[Step 850]

Then, the same step as [Step 750] of the seventh embodiment is performed, whereby the photoelectric conversion element and the imaging apparatus of the eighth embodiment can be obtained.

Ninth Embodiment

A ninth embodiment is a modification of the eighth embodiment. The eighth embodiment is different from the seventh embodiment in the following point. That is, in the seventh embodiment, a part of the element isolation layer 33 is constituted by the insulating material layer 33A formed on the substrate 21A. On the other hand, in the ninth embodiment, a part of an element isolation layer 33 is constituted by an insulating material layer 33B formed in the surface region of a substrate 21. The element isolation layer 33 is constituted by the insulating material layer 33B formed in the surface region of the substrate 21 and a polycrystalline material layer 34A formed on the insulating material layer 33B. Hereinafter, a description will be given of a method for manufacturing the photoelectric conversion element of the ninth embodiment with reference to FIGS. 29A, 29B, 29C, 30A, 30B, and 30C each showing a schematic partial end view of a first compound semiconductor layer or the like.

[Step 900]

Figure 29A:
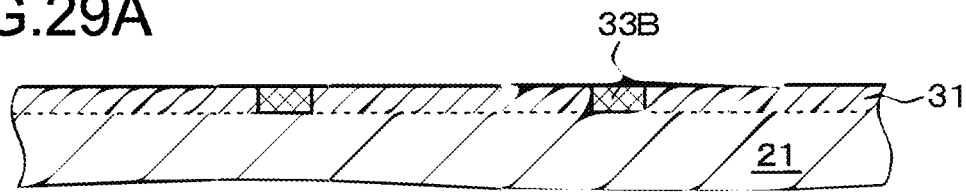
FIGS. 29A, 29B, and 29C are schematic partial end views of a first compound semiconductor layer or the like for describing a method for manufacturing a photoelectric conversion element of a ninth embodiment.
Figure 29B:
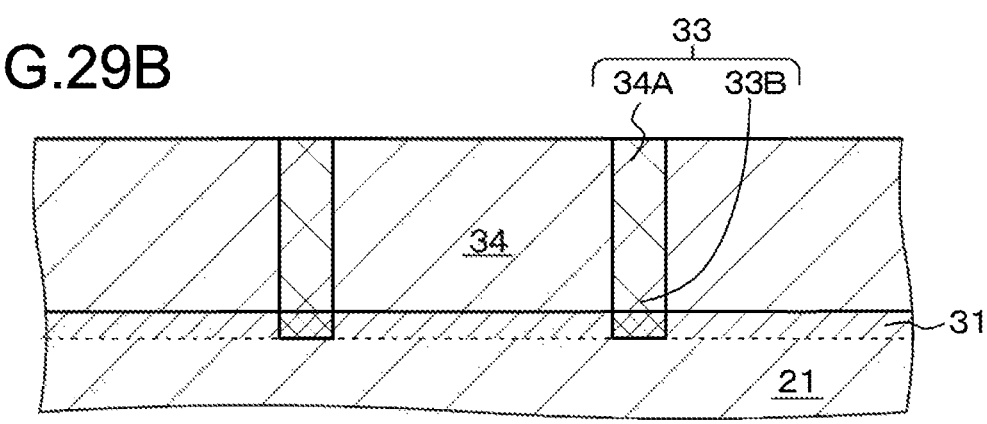
Figure 29C:
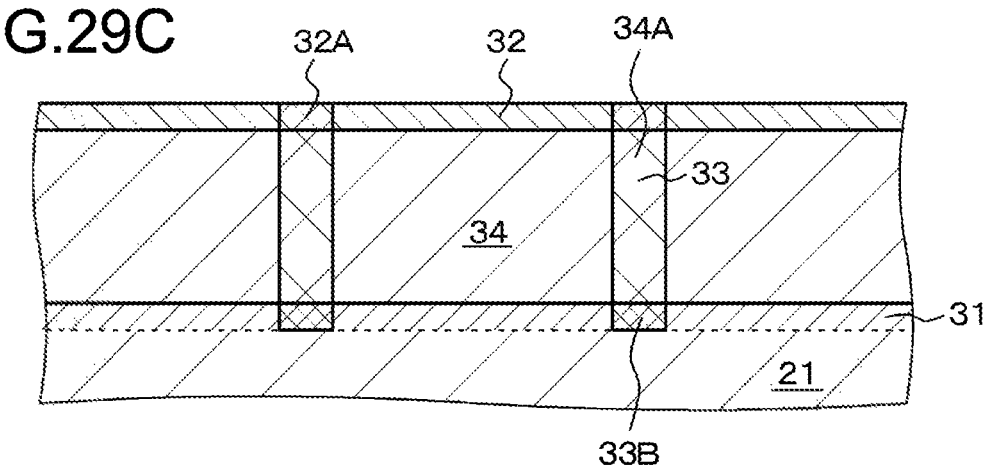

First, an element isolation layer 33 is formed on a substrate 21 having a first conductivity type to obtain a first compound semiconductor layer 31 surrounded by the element isolation layer 33 and constituted by the surface region of the substrate 21 (see FIG. 29A). Specifically, an etching resist layer is formed on the substrate (film forming substrate) 21 made of InP, and the substrate 21 is etched by the etching resist layer serving as an etching mask on the basis of, for example, a dry etching method, whereby a recess part in which the element isolation layer 33 is to be formed can be formed in the substrate 21. Further, the recess part formed in the substrate 21 is embedded with an insulating material layer 33B constituting a part of the element isolation layer 33. Specifically, the insulating material layer is formed on an entire surface including the recess part and the insulating material layer on the substrate 21 is removed, whereby a structure shown in FIG. 29A can be obtained.

[Step 910]

Then, a photoelectric conversion layer 34 surrounded by the element isolation layer 33 is formed on the first compound semiconductor layer 31. Thus, a structure shown in FIG. 29B can be obtained. Here, the portion of the photoelectric conversion layer formed on the insulating material layer 33B becomes polycrystalline, whereby a polycrystalline material layer 34A can be obtained. Thus, the element isolation layer 33 constituted by the insulating material layer 33B and the polycrystalline material layer 34A formed on the insulating material layer 33B can be obtained.

[Step 920]

Next, the same step as [Step 820] of the eighth embodiment (see FIG. 29C), the same steps as [Step 830] and [Step 840] of the eighth embodiment (see FIGS. 30A, 30B, and 30C), and the same step as [Step 850] of the eighth embodiment are performed, whereby the photoelectric conversion element and the imaging apparatus of the ninth embodiment can be obtained.

Tenth Embodiment

A tenth embodiment is a modification of the photoelectric conversion elements of the first and second embodiments and relates to a method for manufacturing a photoelectric conversion element according to a fifth aspect of the present technology. Hereinafter, a description will be given of the method for manufacturing the photoelectric conversion element of the tenth embodiment with reference to FIGS. 31A, 31B, 31C, 32A, 32B, and 32C each showing a schematic partial end view of a first compound semiconductor layer or the like.

[Step 1000]

Figure 31A:
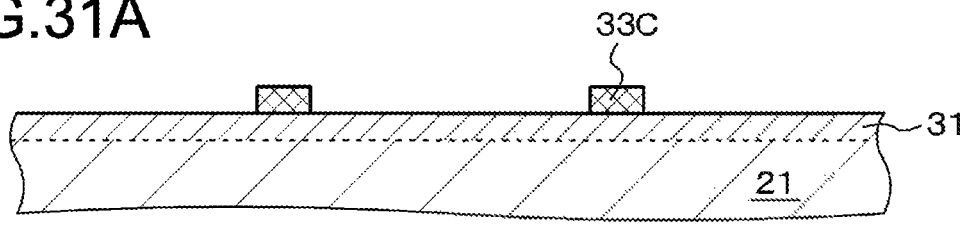
FIGS. 31A, 31B, and 31C are schematic partial end views of a first compound semiconductor layer or the like for describing a method for manufacturing a photoelectric conversion element of a tenth embodiment.

First, an element isolation layer forming region 33C made of an insulating material is formed on a substrate 21 having a first conductivity type to obtain a first compound semiconductor layer 31 surrounded by the element isolation layer forming region 33C and constituted by the surface region of the substrate 21 (see FIG. 31A). Specifically, the same step as [Step 800] of the eighth embodiment is performed.

[Step 1010]

Figure 31B:
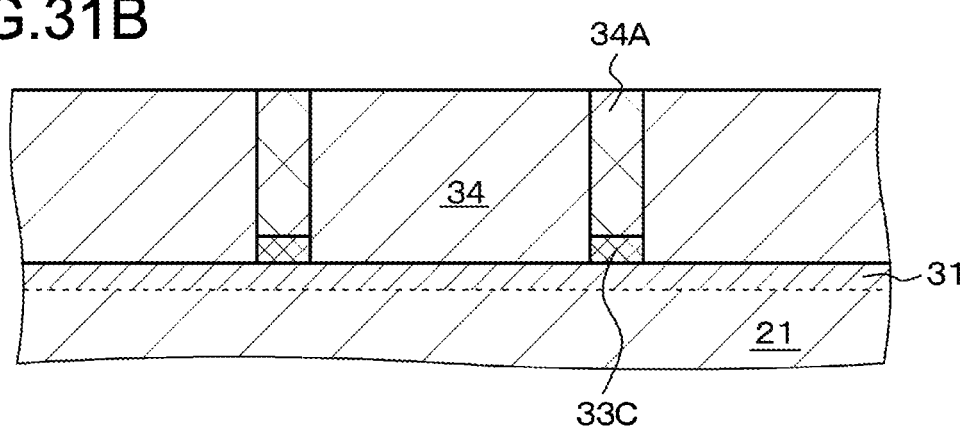

Then, a photoelectric conversion layer 34 is formed on the first compound semiconductor layer 31 and the element isolation layer forming region 33C (see FIG. 31B). Specifically, the same step as [Step 810] of the eighth embodiment is performed. Here, the portion of the photoelectric conversion layer formed on the element isolation layer forming region 33C becomes polycrystalline, whereby a polycrystalline material layer 34A can be obtained.

[Step 1020]

Figure 31C:
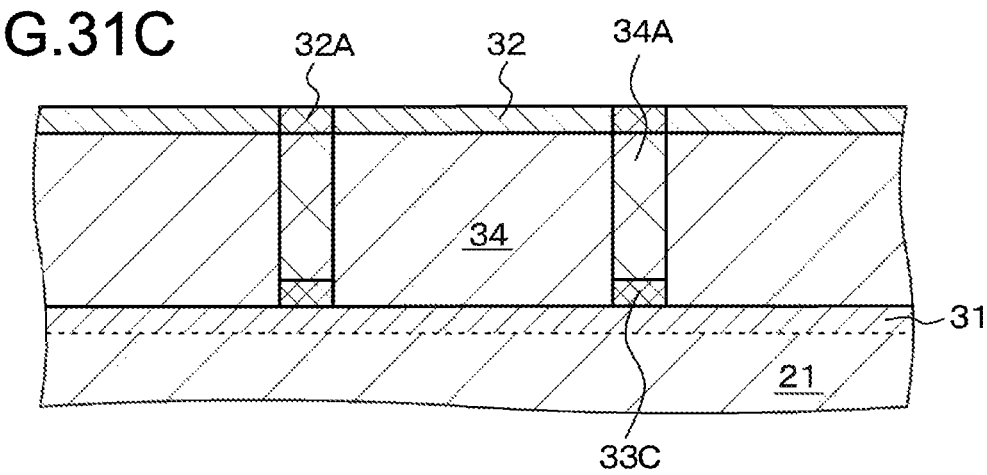

Next, a second compound semiconductor layer 32 made of a second compound semiconductor material having the first conductivity is formed on the photoelectric conversion layer 34 on the basis of a MOCVD method (see FIG. 31C). Specifically, the same step as [Step 820] of the eighth embodiment is performed. The portion of the second compound semiconductor layer formed on the element isolation layer 33 becomes polycrystalline, whereby the polycrystalline material layer 34A can be obtained.

[Step 1030]

Figure 32A:
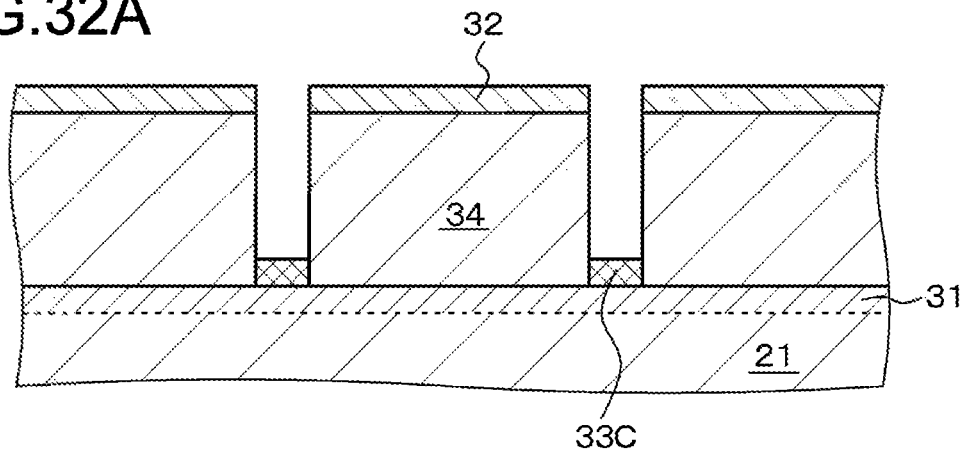
FIGS. 32A, 32B, and 32C are schematic partial end views of the first compound semiconductor layer or the like for describing the method for manufacturing the photoelectric conversion element of the tenth embodiment in succession to FIG. 31C.
Figure 32B:
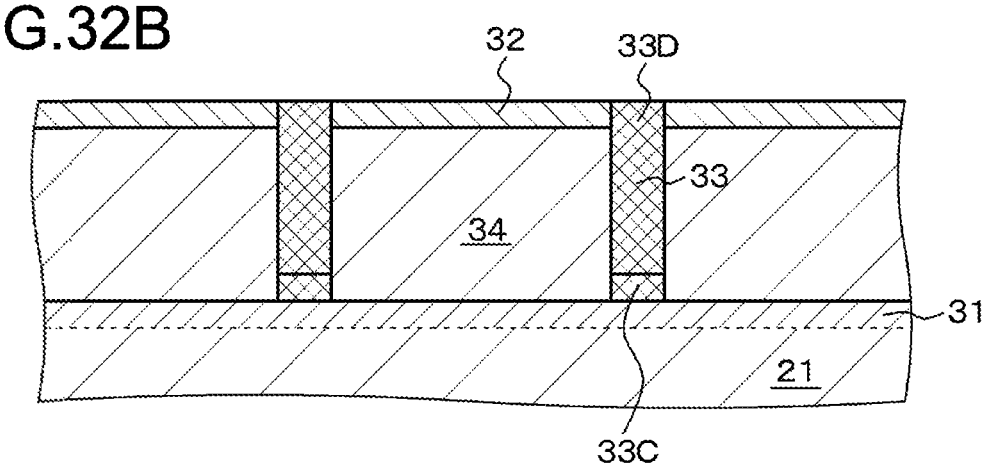
Figure 32C:
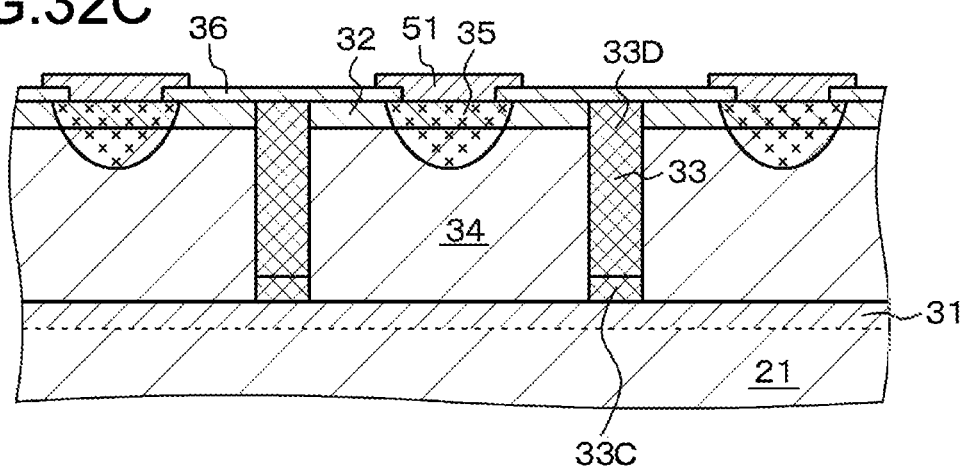

Then, the portions of the second compound semiconductor layer 32 and the photoelectric conversion layer 34, which are positioned above the element isolation layer forming region 33C, are removed (see FIG. 32A), and the removed portions are embedded with an element isolation layer forming material 33D to obtain an element isolation layer 33 (see FIG. 32B). Specifically, an etching resist layer is formed on the second compound semiconductor layer 32, and the second compound semiconductor layer 32 and the photoelectric conversion layer 34 are etched by the etching resist layer serving as an etching mask on the basis of, for example, a wet etching method, whereby the portions of the second compound semiconductor layer 32 and the photoelectric conversion layer 34, which are positioned above the element isolation layer forming region 33C, can be removed. Next, for example, the element isolation layer forming material 33D made of an insulating material is formed on an entire surface on the basis of a CVD method and subjected to flattening processing, whereby the removed portions are embedded with the element isolation layer forming material 33D and the element isolation layer 33 can be obtained. Note that the outside of the element isolation layer 33 may be made of an insulating material and the inside (core part) thereof may be made of a light shielding material.

[Step 1040]

Further, a second conductivity type region 35 having a second conductivity type different from the first conductivity type and reaching the photoelectric conversion layer is formed in the second compound semiconductor layer 32, a first electrode 51 is formed on the second conductivity type region 35 (see FIG. 32C), and a second electrode 51 electrically connected to the first compound semiconductor layer 31 is formed. Specifically, the same steps as [Step 830], [Step 840], and [Step 850] of the eighth embodiment may only be performed. Thus, the photoelectric conversion element and the imaging apparatus of the tenth embodiment can be obtained.

Eleventh Embodiment

An eleventh embodiment is a modification of the tenth embodiment. The eleventh embodiment is different from the tenth embodiment in the following point. That is, in the tenth embodiment, the element isolation layer forming region 33C is formed on the substrate 21. On the other hand, in the eleventh embodiment, an element isolation layer forming region 33C is formed in the surface region of a substrate 21. Hereinafter, a description will be given of a method for manufacturing the photoelectric conversion element of the eleventh embodiment with reference to FIGS. 33A, 33B, 33C, 34A, 34B, and 34C each showing a schematic partial end view of a first compound semiconductor layer or the like.

[Step 1100]

Figure 33A:
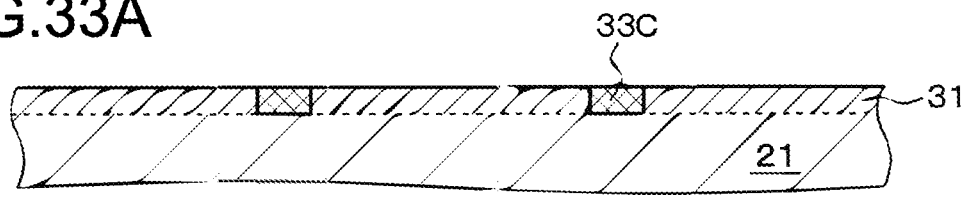
FIGS. 33A, 33B, and 33C are schematic partial end views of a first compound semiconductor layer or the like for describing a method for manufacturing a photoelectric conversion element of an eleventh embodiment.

First, an element isolation layer forming region 33C made of an insulating material is formed on a substrate 21 having a first conductivity type to obtain a first compound semiconductor layer 31 surrounded by the element isolation layer forming region 33C and constituted by the surface region of the substrate 21 (see FIG. 33A). Specifically, the same step as [Step 900] of the ninth embodiment is performed.

[Step 1110]

Figure 33B:
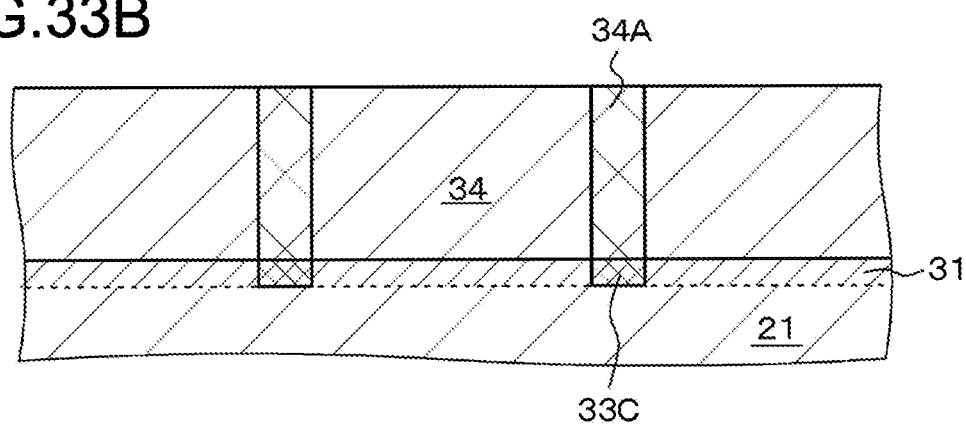

Then, a photoelectric conversion layer 34 is formed on the first compound semiconductor layer 31 and the element isolation layer forming region 33C (see FIG. 33B). Specifically, the same step as [Step 1010] of the tenth embodiment is performed. Here, the portion of the photoelectric conversion layer formed on the element isolation layer forming region 33C becomes polycrystalline, whereby a polycrystalline material layer 34A can be obtained.

[Step 1120]

Figure 33C:
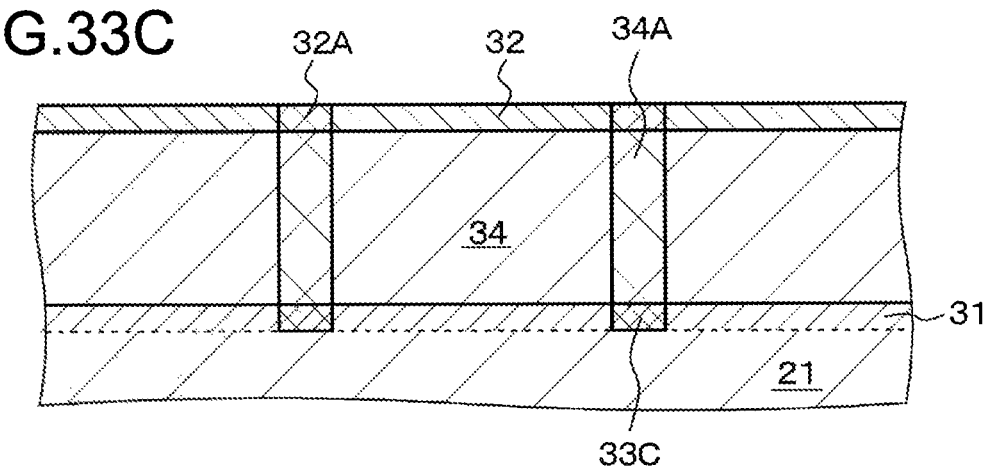

Next, a second compound semiconductor layer 32 made of a second compound semiconductor material having the first conductivity is formed on the photoelectric conversion layer 34 on the basis of a MOCVD method (see FIG. 33C). Specifically, the same step as [Step 1020] of the tenth embodiment is performed. The portion of the second compound semiconductor layer formed on the element isolation layer 33 becomes polycrystalline, whereby the polycrystalline material layer 34A can be obtained.

[Step 1130]

Figure 34A:
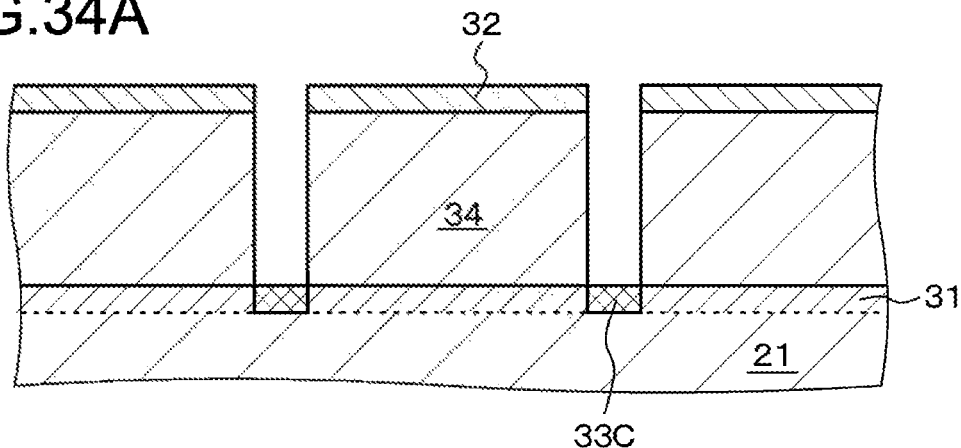
FIGS. 34A, 34B, and 34C are schematic partial end views of the first compound semiconductor layer or the like for describing the method for manufacturing the photoelectric conversion element of the eleventh embodiment in succession to FIG. 33C.
Figure 34B:
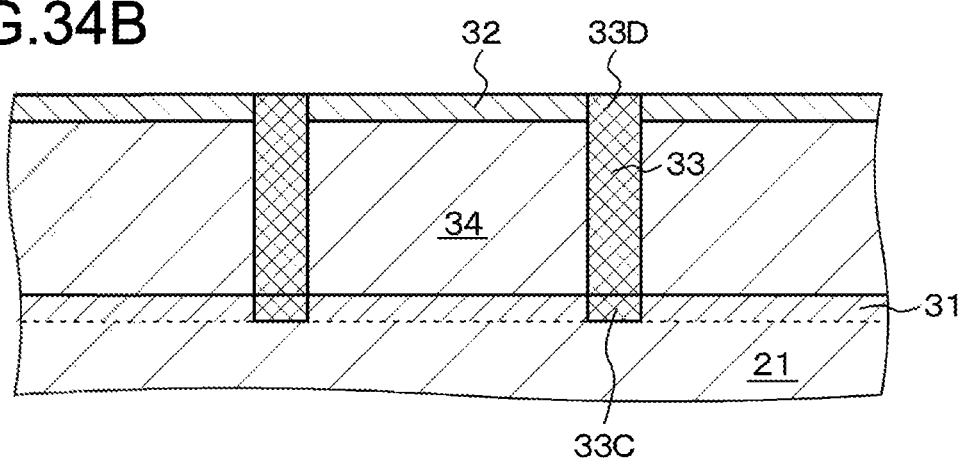
Figure 34C:
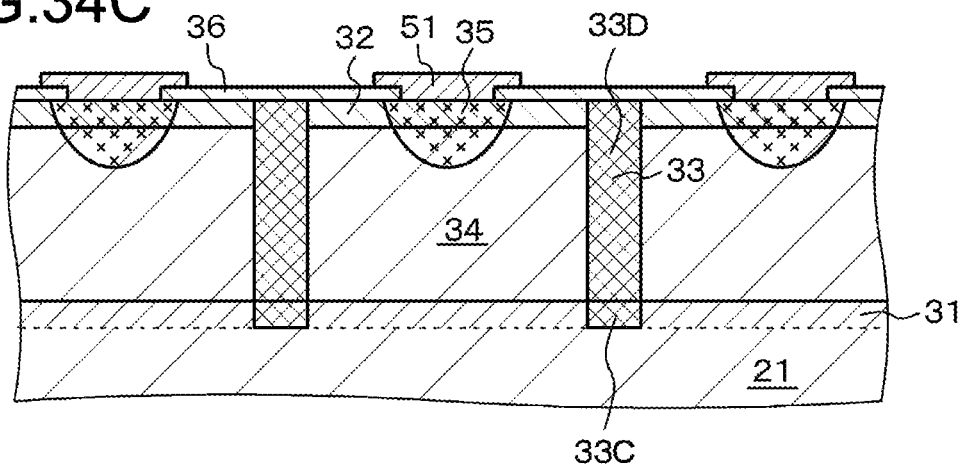

Then, the portions of the second compound semiconductor layer 32 and the photoelectric conversion layer 34, which are positioned above the element isolation layer forming region 33C, are removed (see FIG. 34A), and the removed portions are embedded with an element isolation layer forming material 33D to obtain the element isolation layer 33 (see FIG. 34B). Specifically, the same step as [Step 1030] of the tenth embodiment is performed.

[Step 1140]

Further, a second conductivity type region 35 having a second conductivity type different from the first conductivity type and reaching the photoelectric conversion layer is formed in the second compound semiconductor layer 32, a first electrode 51 is formed on the second conductivity type region 35 (see FIG. 34C), and a second electrode 51 electrically connected to the first compound semiconductor layer 31 is formed. Specifically, the same step as [Step 1040] of the tenth embodiment may only be performed. Thus, the photoelectric conversion element and the imaging apparatus of the eleventh embodiment can be obtained.

Twelfth Embodiment

A twelfth embodiment is a modification of the photoelectric conversion elements of the first and second embodiments and relates to a method for manufacturing a photoelectric conversion element according to a sixth aspect of the present technology. Hereinafter, a description will be given of the method for manufacturing the photoelectric conversion element of the seventh embodiment with reference to FIGS. 35A, 35B, 35C, 36A, 36B, and 36C each showing a schematic partial end view of a first compound semiconductor layer or the like.

[Step 1200]

First, a selective growth blocking part 26 is formed in a substrate 21 having a first conductivity type. Specifically, the same step as [Step 900] of the ninth embodiment is performed. More specifically, an etching resist layer is formed on the substrate (film forming substrate) 21 made of InP, and the substrate 21 is etched by the etching resist layer serving as an etching mask on the basis of, for example, a dry etching method, whereby a recess part in which the selective growth blocking part 26 is to be formed can be formed in the substrate 21. Further, the recess part formed in the substrate 21 is embedded with an insulating material layer constituting the selective growth blocking part 26. Specifically, the insulating material layer is formed on an entire surface including the recess part and removed, whereby a structure shown in FIG. 35A can be obtained.

[Step 1210]

Next, on the basis of a longitudinal-direction selective epitaxial growth method, a photoelectric conversion layer 34 is formed in the region of the substrate 21 positioned between the selective growth blocking parts 26 and corresponding to the first compound semiconductor layer 31 on the basis of a MOCCVD method.

[Step 1220]

Figure 35A:
FIGS. 35A, 35B, and 35C are schematic partial end views of a first compound semiconductor layer or the like for describing a method for manufacturing a photoelectric conversion element of a twelfth embodiment.
Figure 35B:
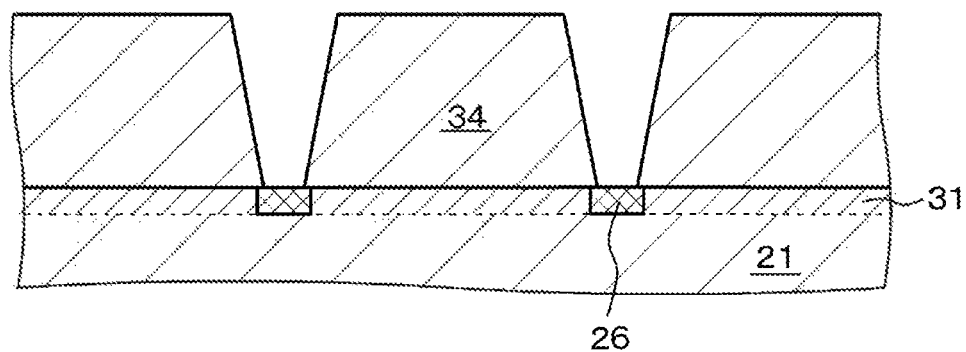
Figure 35C:
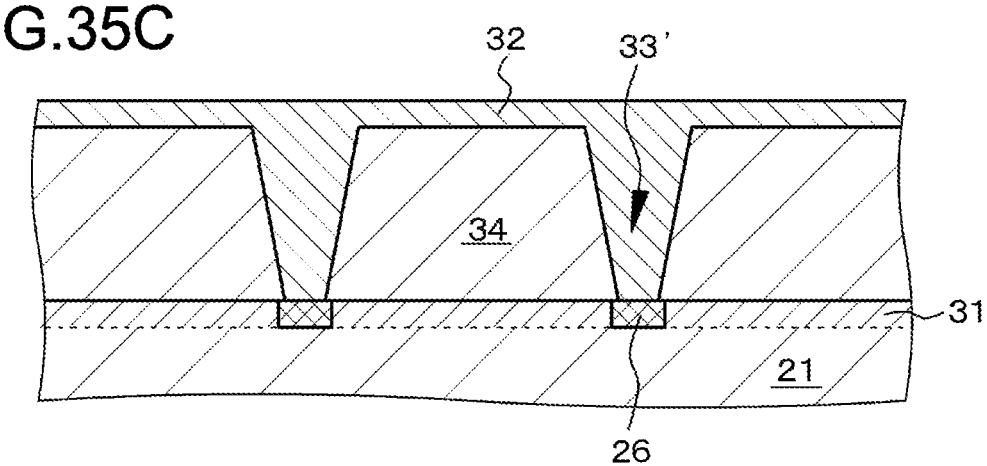
Figure 36A:
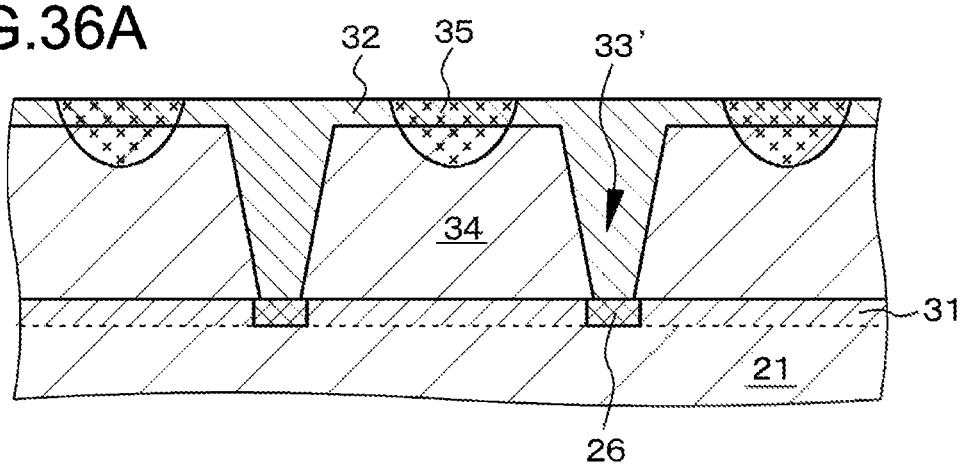
FIGS. 36A, 36B, and 36C are schematic partial end views of the first compound semiconductor layer or the like for describing the method for manufacturing the photoelectric conversion element of the twelfth embodiment in succession to FIG. 35C.
Figure 36B:
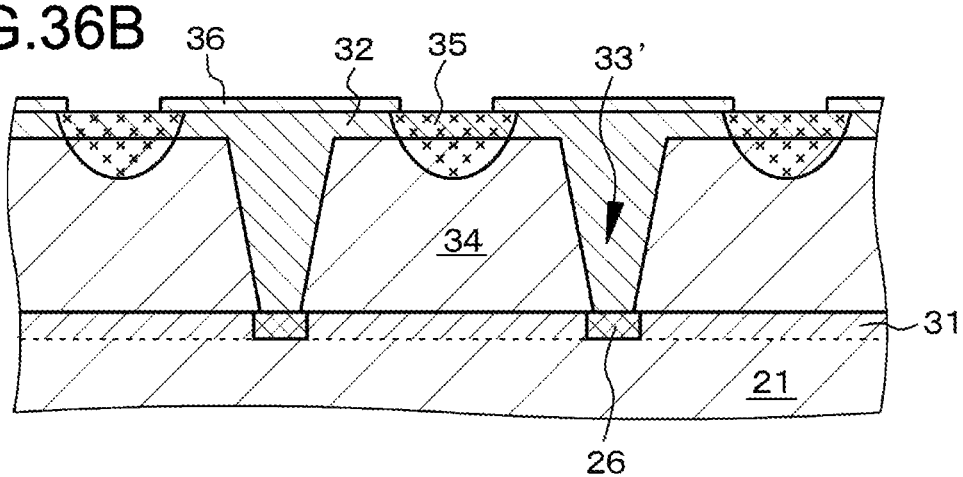
Figure 36C:
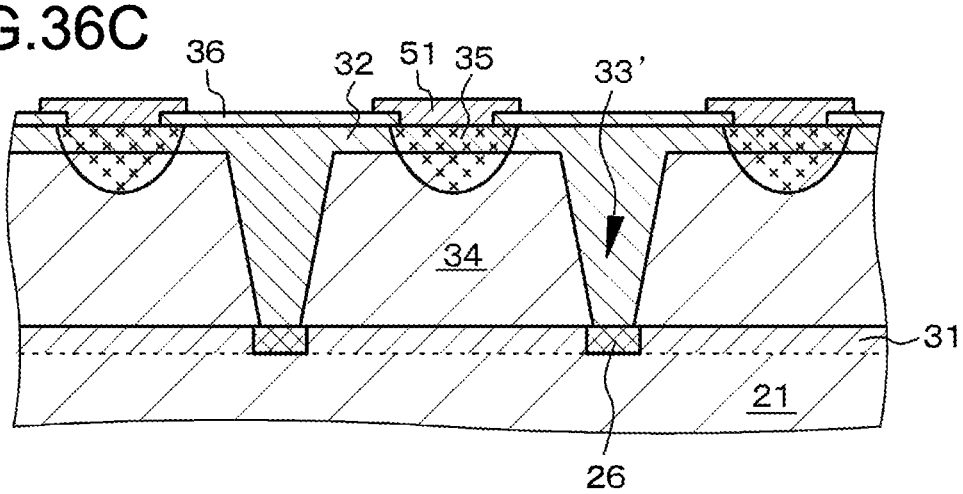

Then, a second compound semiconductor layer 32 made of a second compound semiconductor material having the first conductivity type is formed on an entire surface on the basis of the MOCVD method to obtain an element isolation layer 33' made of a portion of the second compound semiconductor layer, which is positioned above the selective growth blocking part 26 (see FIG. 35C). Note that the formed second compound semiconductor layer 32 may be subjected to flattening processing.

[Step 1230]

Next, a second conductivity type region 35 having a second conductivity type different from the first conductivity type and reaching the photoelectric conversion layer is formed in a part of the second compound semiconductor layer 32 (see FIG. 36A), a first electrode 51 is formed on the second conductivity type region 35 (see FIGS. 36B and 36C), and a second electrode 51 electrically connected to the first compound semiconductor layer 31 is formed. Specifically, the same steps as [Step 830], [Step 840], and [Step 850] of the eighth embodiment may only be performed. Thus, the photoelectric conversion element and the imaging apparatus of the twelfth embodiment can be obtained.

Thirteenth Embodiment

A thirteenth embodiment is a modification of the twelfth embodiment. The thirteenth embodiment is different from the twelfth embodiment in the following point. That is, in the twelfth embodiment, the selective growth blocking part 26 is formed in the surface region of the substrate 21. On the other hand, in the thirteenth embodiment, a selective growth blocking part 26 is formed on a substrate 21. Hereinafter, a description will be given of a method for manufacturing the photoelectric conversion element of the fifth embodiment with reference to FIGS. 37A, 37B, 37C, 38A, 38B, and 38C each showing a schematic partial end view of a first compound semiconductor layer or the like.

[Step 1310]

Figure 37A:
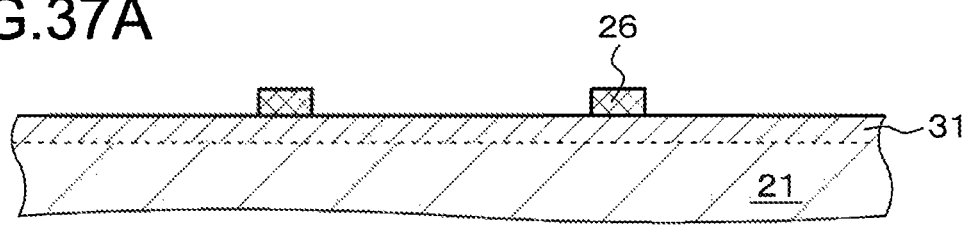
FIGS. 37A, 37B, and 37C are schematic partial end views of a first compound semiconductor layer or the like for describing a method for manufacturing a photoelectric conversion element of a thirteenth embodiment.
Figure 37B:
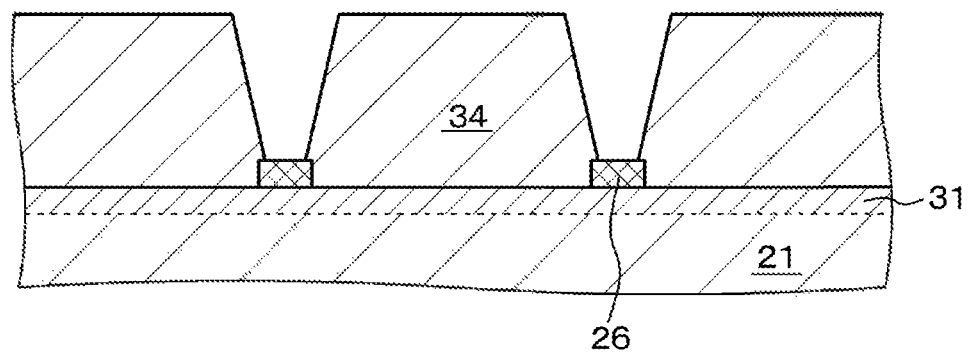
Figure 37C:
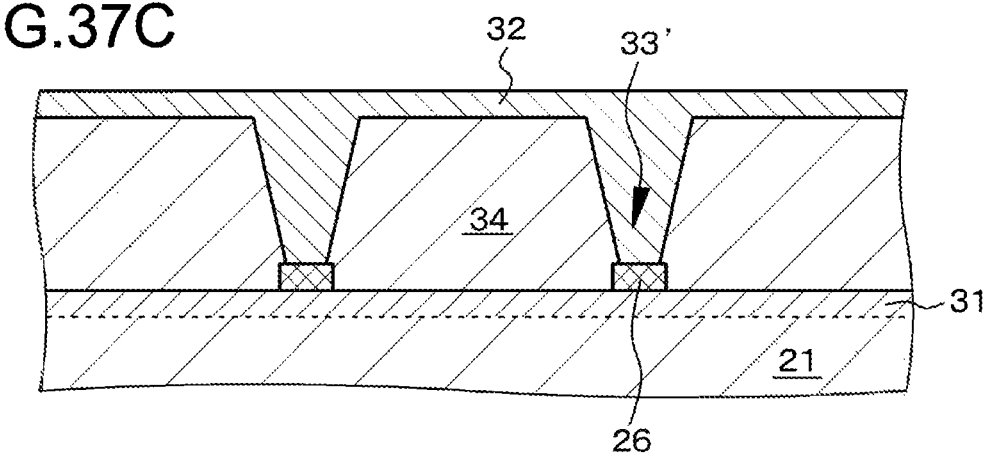
Figure 38A:
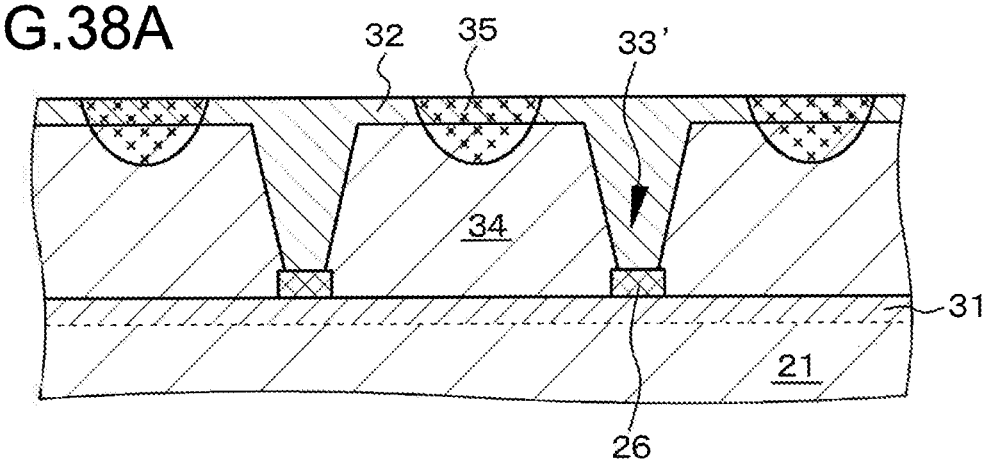
FIGS. 38A, 38B, and 38C are schematic partial end views of the first compound semiconductor layer or the like for describing the method for manufacturing the photoelectric conversion element of the thirteenth embodiment in succession to FIG. 37C.
Figure 38B:
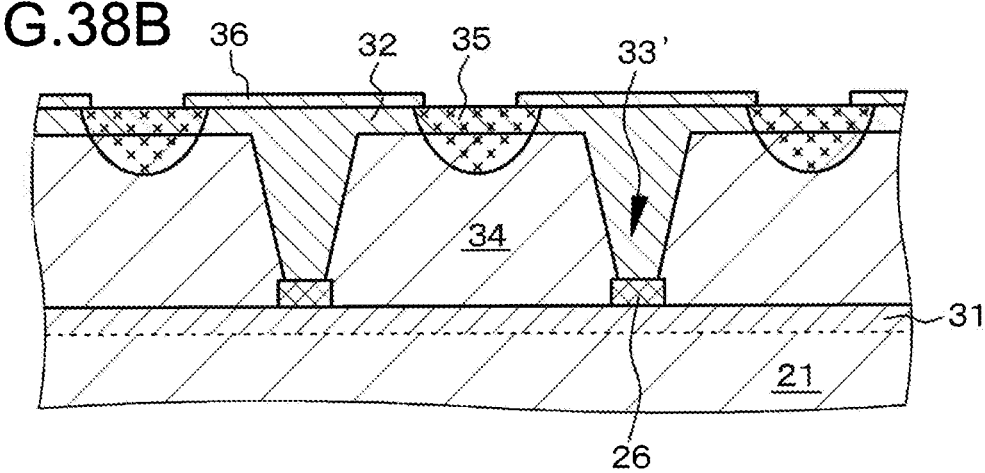
Figure 38C:
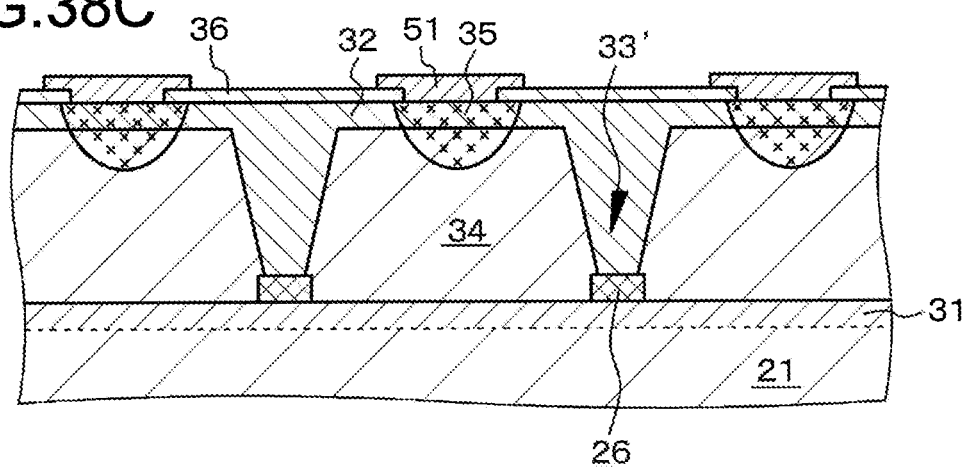

First, a selective growth blocking part 26 is formed in a substrate 21 having a first conductivity type (see FIG. 37A). Specifically, the same step as [Step 800] of the eighth embodiment is performed. More specifically, an insulating material layer is formed on the substrate (film forming substrate) 21 made of InP, an etching resist layer is formed on the insulating material layer, and the insulating material layer is etched by the etching resist layer serving as an etching mask on the basis of, for example, a dry etching method, whereby the selective growth blocking part 26 made of the insulating material can be formed.

[Step 1320]

Then, [Step 1210], [Step 1220], and [Step 1230] of the twelfth embodiment (see FIGS. 37B, 37C, 38A, 38B, and 38C) are performed, whereby the photoelectric conversion element and the imaging apparatus of the thirteenth embodiment can be obtained.

Fourteenth Embodiment

A fourteenth embodiment is a modification of the first to thirteenth embodiments and relates to a photoelectric conversion element having a laminated structure. That is, a photoelectric conversion part is disposed in which a second photoelectric conversion element (imaging element) having sensitivity to visible light is constituted on the light incident side (that will be called "above" for the sake of convenience) of the photoelectric conversion element (an imaging element that will be called a "first photoelectric conversion element" for the sake of convenience) described in each of the first to thirteenth embodiments. Note that a photoelectric conversion layer constituting the first photoelectric conversion element will be called a "first photoelectric conversion part" for the sake of convenience, and the photoelectric conversion part constituting the second photoelectric conversion element will be called a "second photoelectric conversion part" for the sake of convenience. For example, the second photoelectric conversion part is constituted by a first electrode, a second photoelectric conversion layer, and a second electrode laminated together from the side of the first photoelectric conversion element.

Specifically, an imaging element unit can be constituted by the combination of the laminated structure of a second photoelectric conversion part having a red photoelectric conversion part and the first photoelectric conversion part, the laminated structure of a second photoelectric conversion part having a green photoelectric conversion part and the first photoelectric conversion part, and the laminated structure of a second photoelectric conversion part having a blue photoelectric conversion part and the first photoelectric conversion part. In this case, the Bayer arrangement described above or the like can be exemplified as the arrangement of the second photoelectric conversion parts. Alternatively, an imaging element unit can be constituted in which the second photoelectric conversion part having the red photoelectric conversion part, the second photoelectric conversion part having the green photoelectric conversion part, and the second photoelectric conversion part having the blue photoelectric conversion part are laminated on the first photoelectric conversion part. When the second photoelectric conversion part is constituted by, for example, the laminated structure of the red photoelectric conversion part, the green photoelectric conversion part, and the blue photoelectric conversion part as described above, the blue photoelectric conversion part, the green photoelectric conversion part, and the red photoelectric conversion part are preferably arranged in this order from the light incident side or the green photoelectric conversion part, the blue photoelectric conversion part, and the red photoelectric conversion part are preferably arranged in this order from the light incident side in the perpendicular direction of the photoelectric conversion part. This is because light having a shorter wavelength is likely to be more efficiently absorbed on an incident surface side. Since red has the longest wavelength among the three colors, the red photoelectric conversion part is preferably positioned in a lowermost layer when seen from a light incident surface. Here, one pixel is constituted by the combination of the first photoelectric conversion element and the second photoelectric conversion element.

Note that the second photoelectric conversion part can be constituted by one type of a photoelectric conversion part. In this case, for example, the second photoelectric conversion part may only be configured to have sensitivity to entire visible light (white). Alternatively, the second photoelectric conversion part can be constituted by two types of photoelectric conversion parts. In this case, the second photoelectric conversion part may only be constituted by, for example, a photoelectric conversion part having sensitivity to primary colors and a photoelectric conversion part having sensitivity to complementary colors. Alternatively, the second photoelectric conversion part can be constituted by four types of photoelectric conversion parts. In this case, the second photoelectric conversion part may only be constituted by, for example, a red photoelectric conversion part, a green photoelectric conversion part, a blue photoelectric conversion part, and a blue-green photoelectric conversion part having sensitivity to blue-green (emerald-green) light. Instead of the blue-green photoelectric conversion part, the second photoelectric conversion part may be constituted by a photoelectric conversion part (so-called a white pixel) not provided with a color filter.

The first photoelectric conversion element can be the same in size as the second photoelectric conversion element or can be larger in size than the second photoelectric conversion element. In the latter case, specifically, the first photoelectric conversion element can be twice, four times, or m×n times (m and n are positive integers other than one) in a broad sense as large as the second photoelectric conversion element.

The second photoelectric conversion element can be arranged on a side closer to the light incident side than the second photoelectric conversion part and can be configured to further include a filter layer for causing visible light and infrared light to be incident on the first photoelectric conversion element to pass therethrough. Thus, an improvement in the color reproducibility of the second photoelectric conversion element can be attained.

The filter layer has, for example, a structure in which a multiplicity of dielectric films are laminated together. Examples of a dielectric material include, an oxide such as Si, Mg, Al, Hf, Nb, Zr, Sc, Ta, Ga, Zn, Y, B, and Ti, a nitride (such as SiN, AlN, AlGaN, GaN, and BN), and a fluoride. Specifically, $SiO_2$, $TiO_2$, $Nb_2O_5$, $ZrO_2$, $Ta_2O_5$, ZnO, $Al_2O_3$, $HfO_2$, SiN, AlN, or the like can be exemplified. Further, the filter layer can be obtained by alternately laminating together two types or more of dielectric films made of dielectric materials having different refractive indexes among the dielectric materials. In order to obtain desired transmittance, materials, film thicknesses, lamination numbers, or the like constituting the respective dielectric films may be selected appropriately. The thicknesses of the respective dielectric films may be appropriately adjusted depending on use materials or the like. The filter layer can be formed on the basis of a PVD method such as a vacuum vapor deposition method and a sputtering method.

The photoelectric conversion part constituting the second photoelectric conversion element is preferably made of an organic photoelectric conversion material. Further, in this case, the second photoelectric conversion part (second photoelectric conversion layer) can have any of the following four modes.

(1) The second photoelectric conversion part is constituted by a p-type organic semiconductor.

(2) The second photoelectric conversion part is constituted by an n-type organic semiconductor.

(3) The second photoelectric conversion part is constituted by the laminated structure of the p-type organic semiconductor layer and the n-type organic semiconductor layer. The second photoelectric conversion part is constituted by the laminated structure of the mixed layer (bulk-hetero structure) of the p-type organic semiconductor layer/the p-type organic semiconductor and the n-type organic semiconductor/the n-type organic semiconductor layer. The second photoelectric conversion part is constituted by the laminated structure of the mixed layer (bulk-hetero structure) of the p-type organic semiconductor layer/the p-type organic semiconductor and the n-type organic semiconductor. The second photoelectric conversion part is constituted by the laminated structure of the mixed layer (bulk-hetero structure) of the n-type organic semiconductor layer/the p-type organic semiconductor and the n-type organic semiconductor.

(4) The second photoelectric conversion part is constituted by the mixture (bulk-hetero structure) of the p-type organic semiconductor and the n-type organic semiconductor.

However, the lamination order can be arbitrarily changed.

Examples of the p-type organic semiconductor can include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a triallylamine derivative, a carbazole derivative, a perylene derivative, a picene derivative, a chrysene derivative, a fluoranthene derivative, a phthalocyanine derivative, a sub-phthalocyanine derivative, a sub-porphyrazine derivative, a metal complex using a heterocyclic compound as a ligand, a polythiophene derivative, a polybenzothiazole derivative, and a polyfluorene derivative. Examples of the n-type organic semiconductor can include a fullerene and a fullerene derivative, an organic semiconductor having a larger (deeper) HOMO and LUMO than those of the p-type organic semiconductor, and a transparent inorganic metal oxide. Specific examples of the n-type organic semiconductor can include a heterocyclic compound containing a nitrogen atom, an oxygen atom, and a sulfur atom, an organic molecule having, for example, a pyridine derivative, a pyrazine derivative, a pyrimidine derivative, a triadine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzoimidazole derivative, a benzotriazole derivative, a benzoxazole derivative, a carbazole derivative, a benzofuran derivative, a dibenzofuran derivative, a sub-porphyrazine derivative, a polyphenylene vinylene derivative, a polybenzothiazole derivative, a polyfluorene derivative, or the like as a part of a molecular framework, an organic metal complex, and a sub-phthalocyanine derivative. The thickness of the second photoelectric conversion part (that may be called an "organic photoelectric conversion layer") made of an organic photoelectric conversion material is not limited, but the second photoelectric conversion part can have, for example, a thickness of $1\times10^{-8}$ m to $5\times10^{-7}$ m, preferably a thickness of $2.5\times10^{-8}$ m to $3\times10^{-7}$ m, more preferably a thickness of $2.5\times10^{-8}$ m to $2\times10^{-7}$ m, or still more preferably a thickness of $1\times10^{-7}$ m to $1.8\times10^{-7}$ m. Note that an organic semiconductor is often classified as either a p-type or an n-type. The p-type easily transports holes, and the n-type easily transports electrons. Unlike an inorganic semiconductor, the organic semiconductor is not exclusively interpreted as being one having holes or electrons as a thermally-excited majority carrier.

Examples of a material constituting the second photoelectric conversion part (organic photoelectric conversion layer) that photoelectrically converts light having a wavelength of green can include a rhodamine-based pigment, a merocyanine-based pigment, a quinacridone derivative, and a sub-phthalocyanine-based pigment. Examples of a material constituting the second photoelectric conversion part (organic photoelectric conversion layer) that photoelectrically converts blue light can include a coumaric acid pigment, a tris-8-hydroxyquinolialuminium (Alq3), and a merocyanine-based pigment. Examples of a material constituting the second photoelectric conversion part (organic photoelectric conversion layer) that photoelectrically converts red light can include a phthalocyanine-based pigment and a sub-phthalocyanine-based pigment.

A first carrier blocking layer may be provided between the organic photoelectric conversion layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. Examples of a material constituting an electron injection layer can include alkali metal such as lithium (Li), sodium (Na), potassium (K) and a fluoride or an oxide thereof and alkali earth metal such as magnesium (Mg), calcium (Ca) and a fluoride or an oxide thereof.

Examples of a method for forming various organic layers can include a dry film forming method and a wet film forming method. Examples of the dry film forming method can include a vacuum deposition method using resistance heating or high-frequency heating, an EB deposition method, various sputtering methods (such as a magnetron sputtering method, an RF-DC combined bias sputtering method, an ECR sputtering method, a facing target sputtering method, and a high-frequency sputtering method), an ion plating method, a laser ablation method, a molecular beam epitaxy method, and a laser transfer method. In addition, examples of a CVD method can include a plasma CVD method, a thermal CVD method, a MOCVD method, and a photo-induced-CVD method. On the other hand, examples of a wet method can include a spin coat method, an ink jet method, a spray coat method, a stamp method, a micro contact print method, a flexographic printing method, an offset printing method, a gravure printing method, and a dip method. Examples of a patterning method can include chemical etching using a shadow mask, laser transfer, a photolithography technique, or the like, physical etching using ultraviolet rays, laser, or the like. As a technique for flattening various organic layers, a laser flattening method, a reflow method, or the like can be used.

Alternatively, examples of an inorganic-based material constituting the second photoelectric conversion part (second photoelectric conversion layer) can include crystal silicon, amorphous silicon, microcrystal silicon, crystal selenium, amorphous selenium, and a chalcopyrite-based compound such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, a group III-V compound semiconductor such as GaAs, InP, AlGaAs, InGaP, AlGaInP, and InGaAsP, and a compound semiconductor such as CdSe, CdS, In$_2$Se$_3$, In$_2$S$_3$, Bi$_2$Se$_3$, Bi$_2$S$_3$, ZnSe, ZnS, PbSe, and PbS.

In the imaging apparatus of the fourteenth embodiment, the light of blue, green, and red is not dispersed using a color filter, but the second photoelectric conversion part having sensitivity to light having a plurality of types of wavelengths is, for example, laminated to constitute one pixel in a light incident direction within the same pixel, whereby an improvement in sensitivity and an improvement in pixel intensity per unit volume can be attained. In addition, the second photoelectric conversion part (second photoelectric conversion layer) is made of an organic photoelectric conversion material. However, since the organic photoelectric conversion material has a high absorption coefficient, the film thickness of the organic photoelectric conversion layer can be made thinner compared with a conventional Si-based photoelectric conversion layer, whereby the leakage of light from adjacent pixels or the limitation of an incident angle of the light is mitigated. Moreover, a conventional Si-based imaging element causes a false color to perform interpolation processing between the pixels of the three colors to generate a color signal. However, in the imaging apparatus of the fourteenth embodiment, the occurrence of a false color is reduced. Since the organic photoelectric conversion layer itself functions also as a color filter, color separation is made possible without a color filter (on-chip color filter, i.e., OCCF).

However, the color filter may be disposed. Thus, an improvement in color purity can be attained. The color filter separates the colors of red, green, and blue or separates the colors of cyan, magenta, and yellow. The color filter is made of a resin to which a coloring agent made of a desired pigment or dye is added. By the selection of a pigment or dye, the color filter is so adjusted that light transmittance becomes high in the target wavelength regions of red, green, blue, or the like and becomes low in other wavelength regions.

Figure 7:
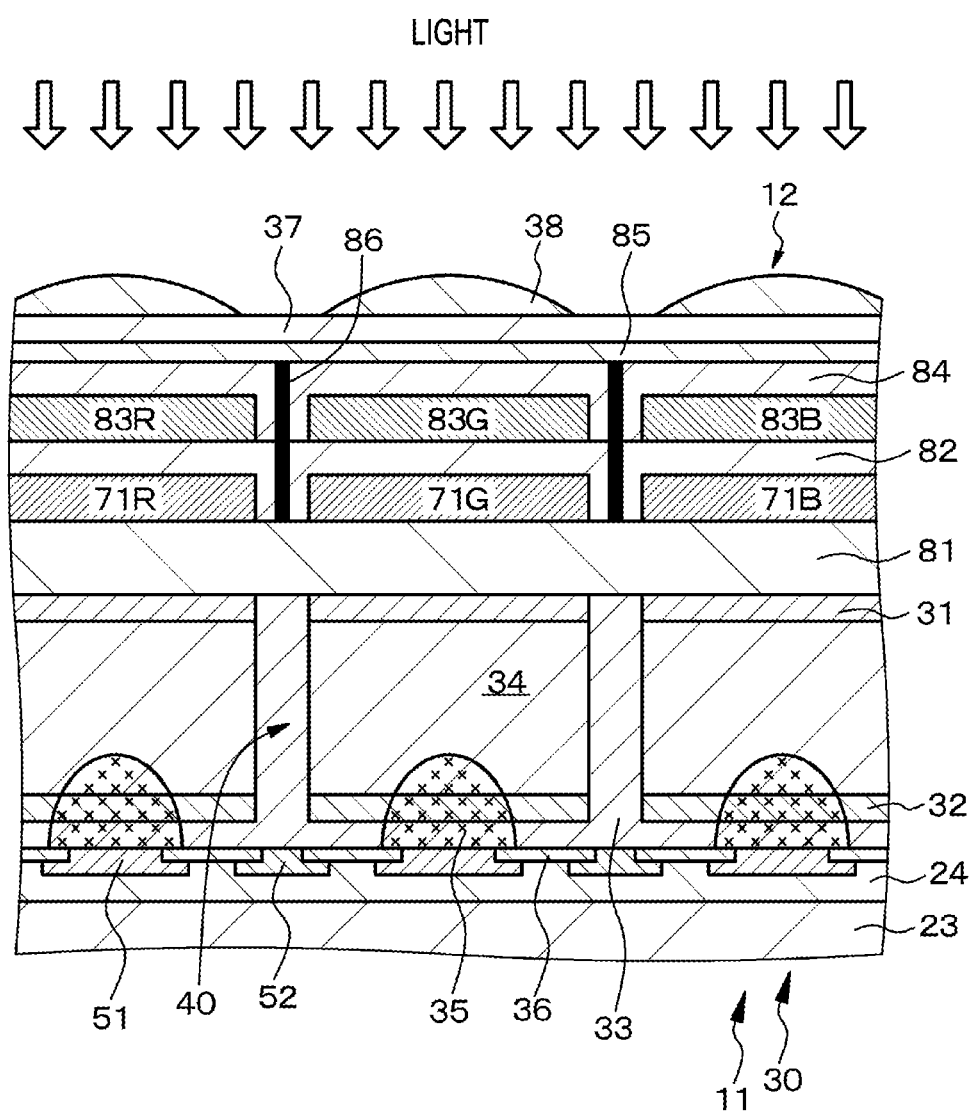
FIG. 7 is a schematic partial cross-sectional view of photoelectric conversion elements constituting an imaging apparatus of a fourteenth embodiment.
Figure 8:
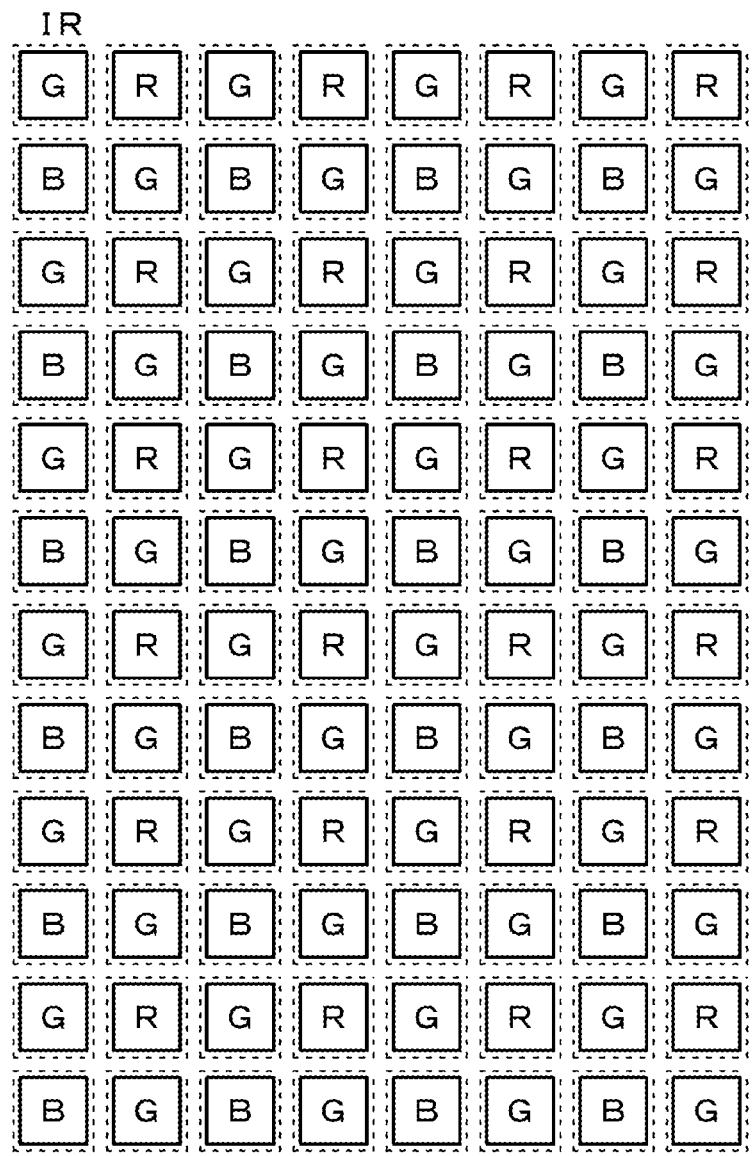
FIG. 8 is a view schematically showing an arrangement example of first imaging elements and second imaging elements in the imaging apparatus of the fourteenth embodiment.
Figure 9:
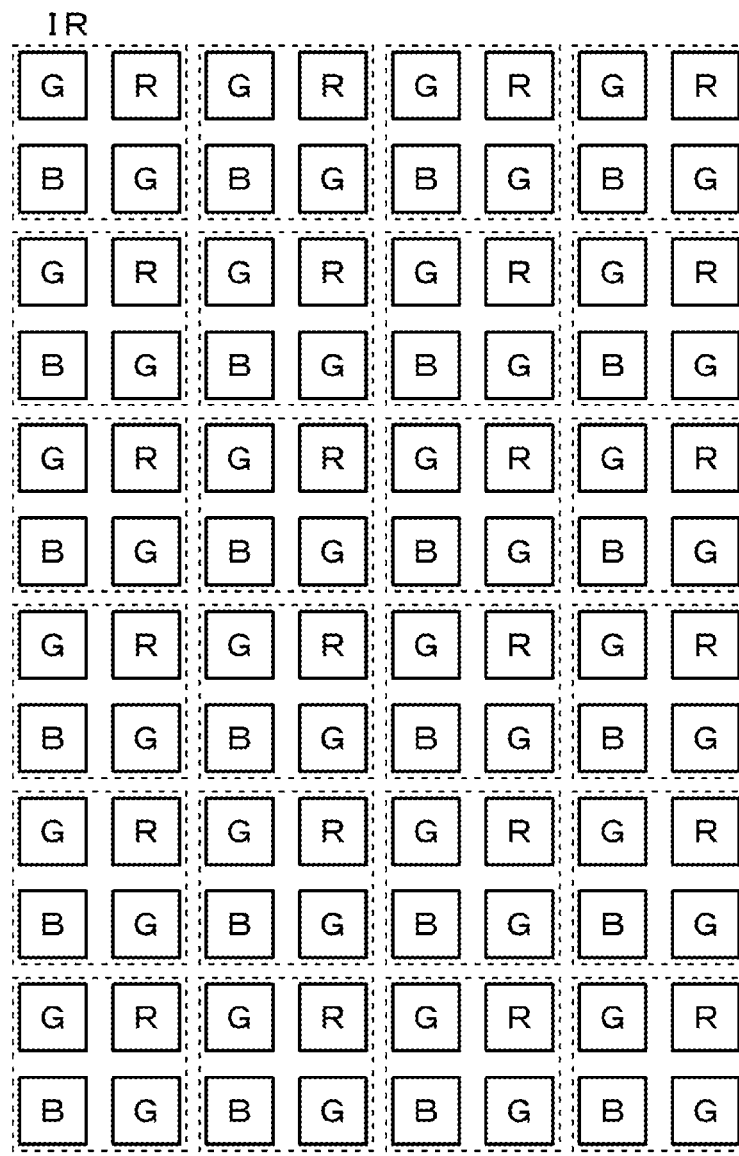
FIG. 9 is a view schematically showing another arrangement example of the first imaging elements and the second imaging elements in the imaging apparatus of the fourteenth embodiment.

FIG. 7 shows a schematic partial cross-sectional view of a photoelectric conversion element constituting the imaging apparatus of the fourteenth embodiment. In addition, FIG. 8 schematically exemplifies the arrangement state of a first photoelectric conversion element 11 and a second photoelectric conversion element 12. Note that in FIG. 8 or FIG. 9 that will be described later, the second photoelectric conversion part having the red photoelectric conversion part is represented by "R," the second photoelectric conversion part having the green photoelectric conversion part is represented by "G," and the second photoelectric conversion part having the blue photoelectric conversion part is represented by "B." However, the arrangement state of the second photoelectric conversion element 12 is not limited to this. In FIGS. 8 and 9, the first photoelectric conversion element is represented by "1R" and displayed by dotted lines.

As shown in the figures, the imaging apparatus of the fourteenth embodiment is constituted by an imaging element unit including the first photoelectric conversion element (the photoelectric conversion element described in each of the first and second embodiments) 11 and the second photoelectric conversion element 12 arranged above the first photoelectric conversion element 11. Further, light is incident on the second photoelectric conversion element 12, and infrared light passing through the second photoelectric conversion element 12 is incident on the first photoelectric conversion element 11. The second photoelectric conversion element 12 includes the second photoelectric conversion part having sensitivity to visible light. The second photoelectric conversion element 12 is arranged on the light incident side and further includes a filter layer 85 for causing visible light and infrared light to be incident on a first imaging element to pass therethrough.

In the imaging apparatus of the fourteenth embodiment, the imaging element unit is constituted by the combination of the laminated structure of a second photoelectric conversion part 71R having the red photoelectric conversion part and a first photoelectric conversion part 30, the laminated structure of a second photoelectric conversion part 71R having the green photoelectric conversion part and the first photoelectric conversion part 30, and the laminated structure of a second photoelectric conversion part 71B having the blue photoelectric conversion part and the first photoelectric conversion part 30. Under the photoelectric conversion parts 71R, 71G, and 71B, the first photoelectric conversion part 30 is disposed. The arrangement of the photoelectric conversion parts 71R, 71G, and 71G is the Bayer arrangement (see FIG. 8).

In the imaging apparatus of the fourteenth embodiment, the second photoelectric conversion element 12 is arranged on a side closer to the light incident side than the second photoelectric conversion parts 71R, 71G, and 71B and further includes a color filter 83 for causing visible light to pass therethrough. Specifically, the color filter 83 is constituted by, for example, an on-chip color filter (OCCF) for separating the colors of red, green, and blue. An imaging element including an on-chip color filter 83R for separating the color of red corresponds to a second imaging element R including a second red photoelectric conversion part having sensitivity to the light of red. In addition, an imaging element including an on-chip color filter 83G for separating the color of green corresponds to a second imaging element G including a second green photoelectric conversion part having sensitivity to the light of green. Moreover, an imaging element including an on-chip color filter 83B for separating the color of blue corresponds to a second imaging element B including a second blue photoelectric conversion part having sensitivity to the light of blue. That is, the second imaging elements are constituted by a plurality of types of (specifically three types of) the photoelectric conversion parts arranged side by side.

In the fourteenth embodiment, the second photoelectric conversion parts 71R, 71G, and 71B have first and second electrodes not shown. The first and second electrodes preferably have a structure that does not shield light incident on the second photoelectric conversion element 12 and light passing through the second photoelectric conversion element 12 to a greater extent. Specifically, the first and second electrodes are made of, for example, ITO. Alternatively, the first and second electrodes have, for example, a wire-grid plane shape.

The second photoelectric conversion parts 71R, 71G, and 71B are formed on a first interlayer insulating layer 81, and the second photoelectric conversion part 30 and the first interlayer insulating layer 81 are covered with a second interlayer insulating layer 82. The color filter 83 is formed on the second interlayer insulating layer 82, and a third interlayer insulating layer 84 is formed on the second interlayer insulating layer 82 and the color filter 83. Moreover, a filter layer 85 is formed on the third interlayer insulating layer 84, a flattening film 37 is formed on the filter layer 85, and an on-chip micro lens 38 is provided on the flattening film 37. In addition, an inter-element light shielding layer 86 is provided between the second photoelectric conversion elements 12.

Since a control unit that controls the operations of the first photoelectric conversion element 11 and the second photoelectric conversion element 12 can have a well-known configuration and a structure, their detailed descriptions will be omitted.

When light containing visible light and infrared light is incident on the second photoelectric conversion element 12, the light first passes through the on-chip micro lens 38 and further passes through the filter layer 85. As described above, the visible light and the infrared light to be incident on the first imaging element pass through the filter layer 85. Further, the light is incident on the color filter 83. After passing through the color filter 83, the light heads for a second photoelectric conversion part 71. Further, the light incident on the second photoelectric conversion part 71 is photoelectrically converted and finally output as an electric signal. Since the second photoelectric conversion part 71 does not have sensitivity to the infrared light, light having a wavelength of 1.0 μm or more has no impact on an image finally obtained on the basis of the second photoelectric conversion element 12. The infrared light passes through the second photoelectric conversion element 12 without being absorbed by the second photoelectric conversion element 12 and heads for the first photoelectric conversion element 11. Further, the light incident on the first photoelectric conversion part 30 is photoelectrically converted and finally output as an electric signal.

In the example shown in FIGS. 7 and 8, the first photoelectric conversion part 30 is disposed under each of the photoelectric conversion parts R(71R), G(71G), and B(71B). Alternatively, the one photoelectric conversion part 30 can be configured to be disposed under the four photoelectric conversion parts 71R, 71G, and 71B. The arrangement state of the first photoelectric conversion element 11 and the second photoelectric conversion element 12 under such a configuration is schematically exemplified in FIG. 9. That is, the first photoelectric conversion element 11 can be twice, four times, or m×n times (m and n are positive integers other than one) in a broad sense as large as the second photoelectric conversion element 12, but the size of the first photoelectric conversion element 11 is not limited to this. In the example shown in FIG. 9, the first photoelectric conversion element 11 is four (2×2) times as large as the second photoelectric conversion element 12.

As described above, the organic photosensitive conversion layer of the second photoelectric conversion part 30 is specifically made of the organic photosensitive conversion layer. More specifically, examples of a material constituting the second photosensitive conversion part (organic photosensitive conversion layer) that photoelectrically convert light having a wavelength of green can include a rhodamine-based pigment, a merocyanine-based pigment, a quinacridone derivative, and a sub-phthalocyanine-based pigment. Examples of a material constituting the second photoelectric conversion part (organic photoelectric conversion layer) that photoelectrically converts blue light can include a coumaric acid pigment, a tris-8-hydroxyquinolialuminium (Alq3), and a merocyanine-based pigment. Examples of a material constituting the second photoelectric conversion part (organic photoelectric conversion layer) that photoelectrically convert red light can include a phthalocyanine-based pigment and a sub-phthalocyanine-based pigment. Note that since the organic photoelectric conversion layer itself functions also as a color filter, it is possible to perform color separation without the need to dispose a color filter. However, demand for the spectral characteristics of blue, green, and red can be mitigated by the use of a color filter.

In the example described above, the one organic photoelectric conversion layer is provided above the first imaging element. Alternatively, an imaging element unit can be constituted in which a second photoelectric conversion part having a red photoelectric conversion part including a red organic photoelectric conversion layer, a second photoelectric conversion part having a green photoelectric conversion part including a green organic photoelectric conversion layer, and a second photoelectric conversion part having a blue photoelectric conversion part including a blue organic photoelectric conversion layer are laminated together on a first photoelectric conversion part.

Figure 3B:
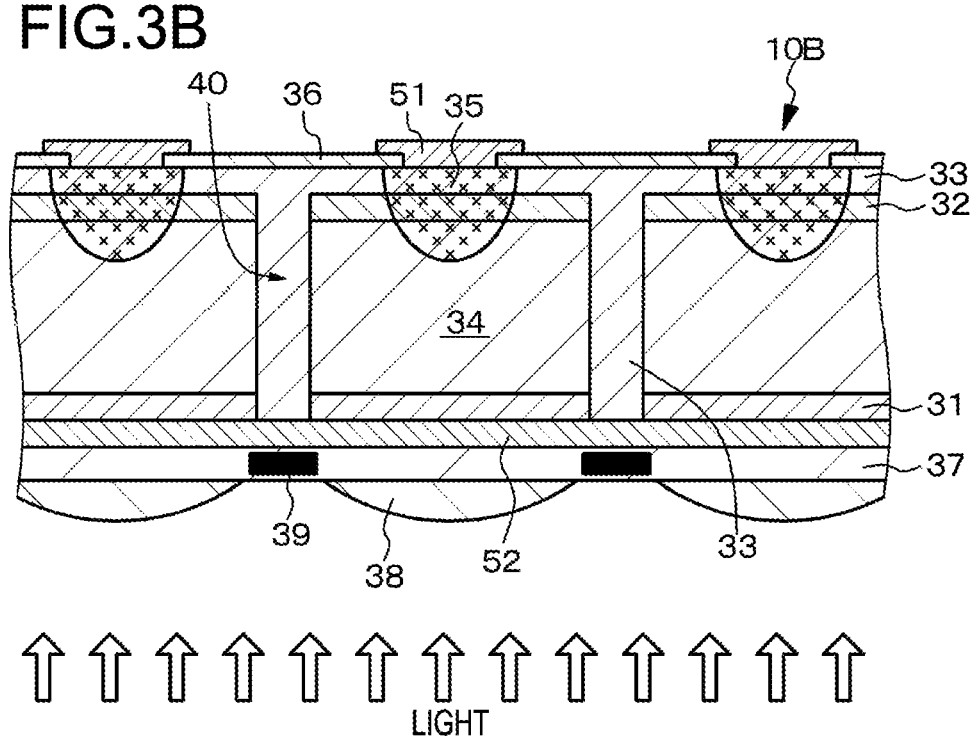

The present technology is described above on the basis of the preferred embodiments but is not limited to the embodiments. The structures, the configurations, the manufacturing conditions, the manufacturing methods, and the used materials of the photoelectric conversion elements, the imaging elements, and the imaging apparatuses are given for exemplification purpose and can be appropriately changed. On the light incident side, an ultraviolet cut filter may be disposed. In addition, as shown in FIGS. 3A and 3B representing the modified examples of the imaging apparatuses described in the first embodiment, a light shielding film 39 can be configured to be formed on the light incident side. Note that here an example shown in FIG. 3A is a modification of the imaging apparatus shown in FIG. 1A, and that an example shown in FIG. 3B is a modification of the imaging apparatus shown in FIG. 1B. In addition, various wiring provided on a side closer to the light incident side than the photoelectric conversion layer can be caused to function as light shielding films. In the embodiments, electrons serve as signal charges, and the conductivity type of the photoelectric conversion layer is the n-type. However, an imaging apparatus using holes as signal charges is also applicable. In this case, each compound semiconductor layer may only be made of a compound semiconductor material having an opposite conductivity type.

Figure 39:
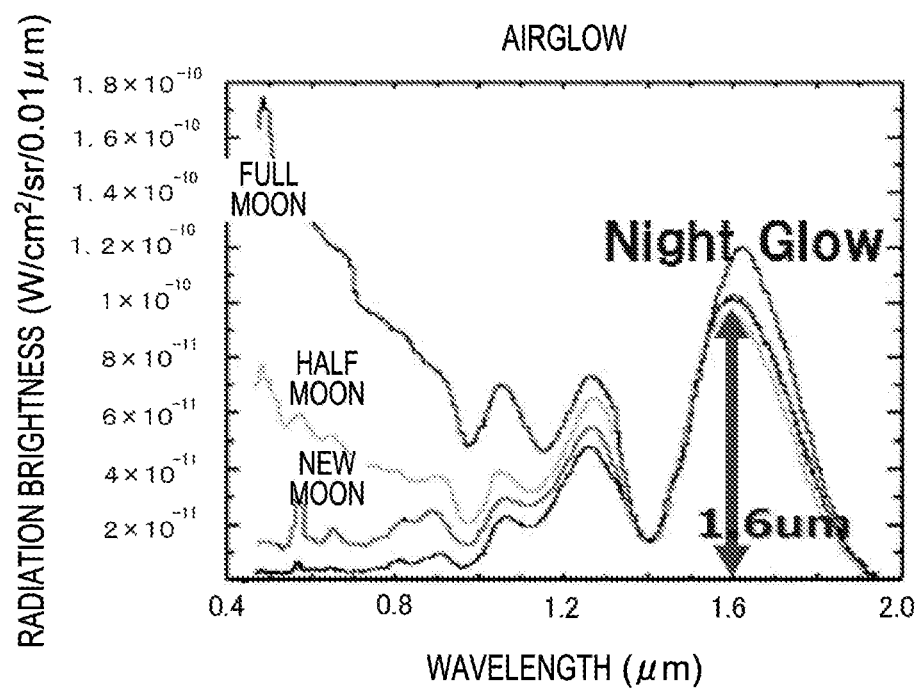
FIG. 39 is a graph showing the spectrum of airglow.

As one of the applied examples of the imaging apparatus of the present technology, infrared light (airglow) having a short wavelength of 1.0 µm or more falls due to the following reasons in new moon and even in moonless night where no light sources exist in surrounding areas. FIG. 39 shows a graph representing the spectrum of airglow.

(1) Recombination of ions generated in a photo-ionization reaction by daytime sunlight (2) Luminescence by cosmic rays radiated to upper atmosphere (3) Chemiluminescence occurring when oxygen or nitrogen reacts with hydroxide ions at several hundred kilometers in the air.

Therefore, when infrared light having a short wavelength of 1.0 µm or more can be detected and made into an image, it is possible to perform imaging even if no illumination light sources exist. The imaging apparatus of the present technology is applicable to such a field.

In a case in which fog rises as a shooting environment, visible light is scattered or reflected diffusely, whereby a subject in the fog may not be imaged. Even in such a case, since infrared light having a short wavelength of 1.0 µm or more is prevented from being scattered or reflected diffusely in fog, it is possible to perform imaging of a subject in the fog. Accordingly, the application of the imaging apparatus of the present technology to, for example, an in-vehicle camera allows an improvement in safety in driving a vehicle even when fog rises.

Figure 40:
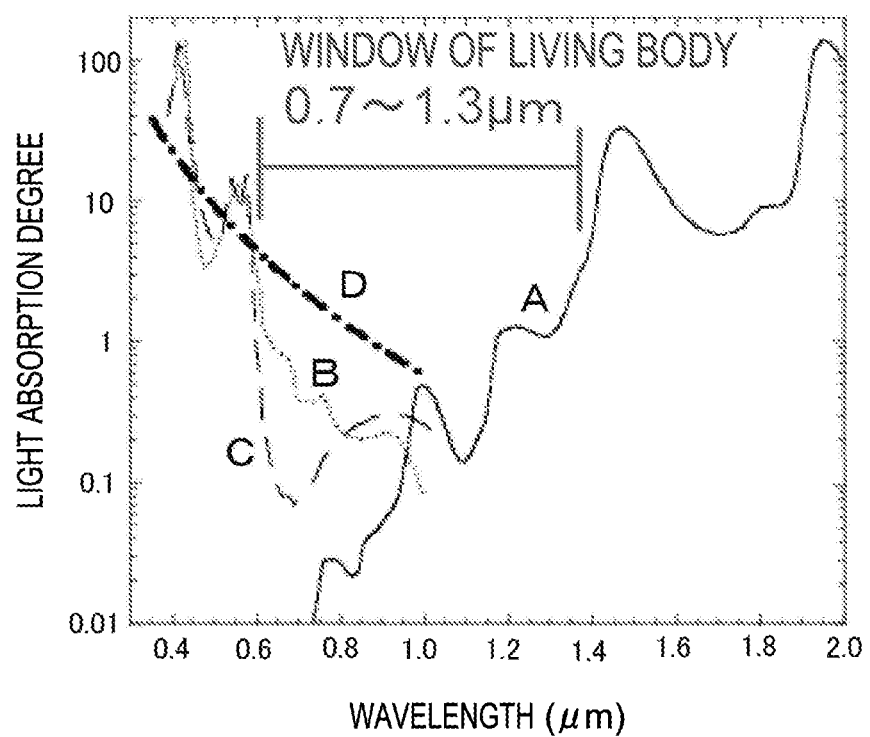
FIG. 40 is a graph of a light absorption spectrum showing so-called the window of a living body.

Moreover, the imaging apparatus of the present technology can be applied to a biosensor. FIG. 40 shows the graph of a light absorption spectrum representing so-called the window of a living body. Infrared light having a wavelength of 0.7 µm to 1.3 µm has a wavelength region called the window of a living body in which the light absorption of tissues or substances relating to living bodies such as water, hemoglobin, and melanin is small. Note that in FIG. 40, the light absorption spectrum of water is represented by "A," the light absorption spectrum of a deoxygenized hemoglobin is represented by "B," the light absorption spectrum of oxygenated hemoglobin is represented by "C," and the light absorption spectrum of melanin is represented by "D." The imaging apparatus of the present technology is useful as a biosensor for brain function examination, vein authentication, iris recognition, or the like in the wavelength region. Note that the characteristics of the filter layer 85 may only be optimized in this case.

Further, according to the imaging apparatus of the fourteenth embodiment, an image of visible light and an image of infrared light can be taken with a single camera (imaging apparatus). Therefore, when the imaging apparatus is applied to, for example, a monitoring camera, it is possible to perform imaging in any environment from a dark environment only under airglow to a daytime bright environment. In addition, when applied to an in-vehicle camera, the imaging apparatus is allowed to take an image of visible light in normal time and take an image of infrared light in a case in which fog rises, i.e., the imaging apparatus is allowed to take measures appropriate to situations to confirm safety on its front side. In addition, the imaging apparatus can simultaneously take an image of visible light and an image of infrared light having a wavelength of 1.0 µm or more. Therefore, in association with an image of visible light, the imaging apparatus can perform biological authentication and obtain an image of biological information on hemoglobin, melanin, or the like, and can be applied to examination for health, medical treatment, or the like. That is, the imaging apparatus can be applied to a camera for use in acquiring biological information.

Moreover, in the cases of the above embodiments, the imaging apparatus is applied to a CMOS imaging apparatus in which unit pixels that detect signal charges corresponding to incident light amounts as physical amounts are arranged in a matrix form. However, the imaging apparatus can be applied not only to the CMOS imaging apparatus but also to a CCD imaging apparatus. In the latter case, signal charges are transferred in an orthogonal direction by an orthogonal transfer register having a CCD structure, transferred in a horizontal direction by a horizontal transfer register, and amplified, whereby a pixel signal (image signal) is output. Further, the imaging apparatus is not limited to an entire column-type imaging apparatus in which pixels are formed in a two-dimensional matrix form and a column signal processing circuit is arranged for each column of pixels. Moreover, a selective transistor can be omitted in some cases.

Moreover, the photoelectric conversion element, the imaging element, and the imaging apparatus of the present technology are applicable not only to an imaging apparatus that detects the distribution of incident light amounts of infrared light or infrared light and visible light to be taken as an image but also to an imaging apparatus that takes the distribution of the incident amounts of particles or the like as an image. Further, in a broader sense, the imaging apparatus is applicable to an entire imaging apparatus (physical amount distribution detection apparatus) such as a finger print detection sensor that detects the distribution of other physical amounts such as pressure and capacitance to be taken as an image, and applicable to the imaging of veins or iris as described above.

Moreover, the imaging apparatus is not limited to an imaging apparatus that sequentially scans each unit pixel in an imaging region on a unit-by-unit basis to read a pixel signal from each unit pixel. The imaging apparatus is also applicable to an X-Y address type imaging apparatus that selects any pixel on a pixel-by-pixel basis and reads a pixel signal on a pixel-by-pixel basis from the selected pixel. The imaging apparatus may have a one-chip shape or may have a module shape having an imaging function in which an imaging region and a driving circuit or an optical system are packaged together.

Figure 10:
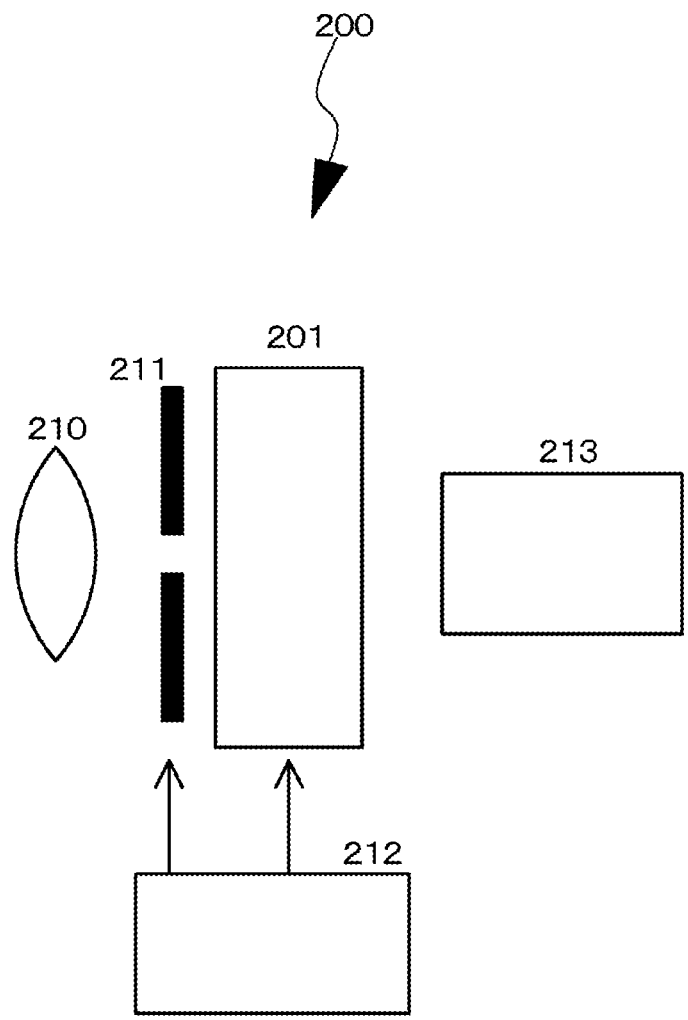
FIG. 10 is a conceptual diagram of an example in which an imaging apparatus of the present technology is used in an electronic apparatus (camera).

FIG. 10 shows, as a conceptual view, an example in which an imaging apparatus 201 constituted by the imaging apparatus of the present technology is used in an electronic apparatus (camera) 200. The electronic apparatus 200 has an imaging apparatus 201, an optical lens 210, a shutter apparatus 211, a driving circuit 212, and a signal processing circuit 213. The optical lens 210 forms an image of image light (incident light) from a subject on the imaging surface of the imaging apparatus 201. Thus, signal charges are accumulated in the imaging apparatus 201 for a certain period of time. The shutter apparatus 211 controls a light irradiation period and a light shielding period with respect to the imaging apparatus 201. The driving circuit 212 supplies a driving signal for controlling the transfer operation or the like of the imaging apparatus 201 and the shutter operation of the shutter apparatus 211. The imaging apparatus 201 transfers a signal on the basis of a driving signal (timing signal) supplied from the driving circuit 212. The signal processing circuit 213 performs various signal processing. A video signal after signal processing is stored in a storage medium such as a memory or output to a monitor. In the electronic apparatus 200, a pixel size can be made fine in the imaging apparatus 201. In addition, transfer efficiency is improved. Therefore, the electronic apparatus 200 with an improvement in pixel characteristics can be obtained. The electronic apparatus 200 to which the imaging apparatus 201 is applicable is not limited to a camera, but the imaging apparatus 201 is also applicable to an imaging apparatus such as a camera module for a mobile apparatus such as a digital still camera and a portable telephone.

The technology (present technology) according to the present disclosure can be applied to various products. For example, the technology according to the present disclosure may be realized as a device mounted on any kind of movable objects such as a car, an electric car, a hybrid electric car, a motorcycle, a bicycle, a personal mobility, an aircraft, a drone, a ship, and a robot.

Figure 41:
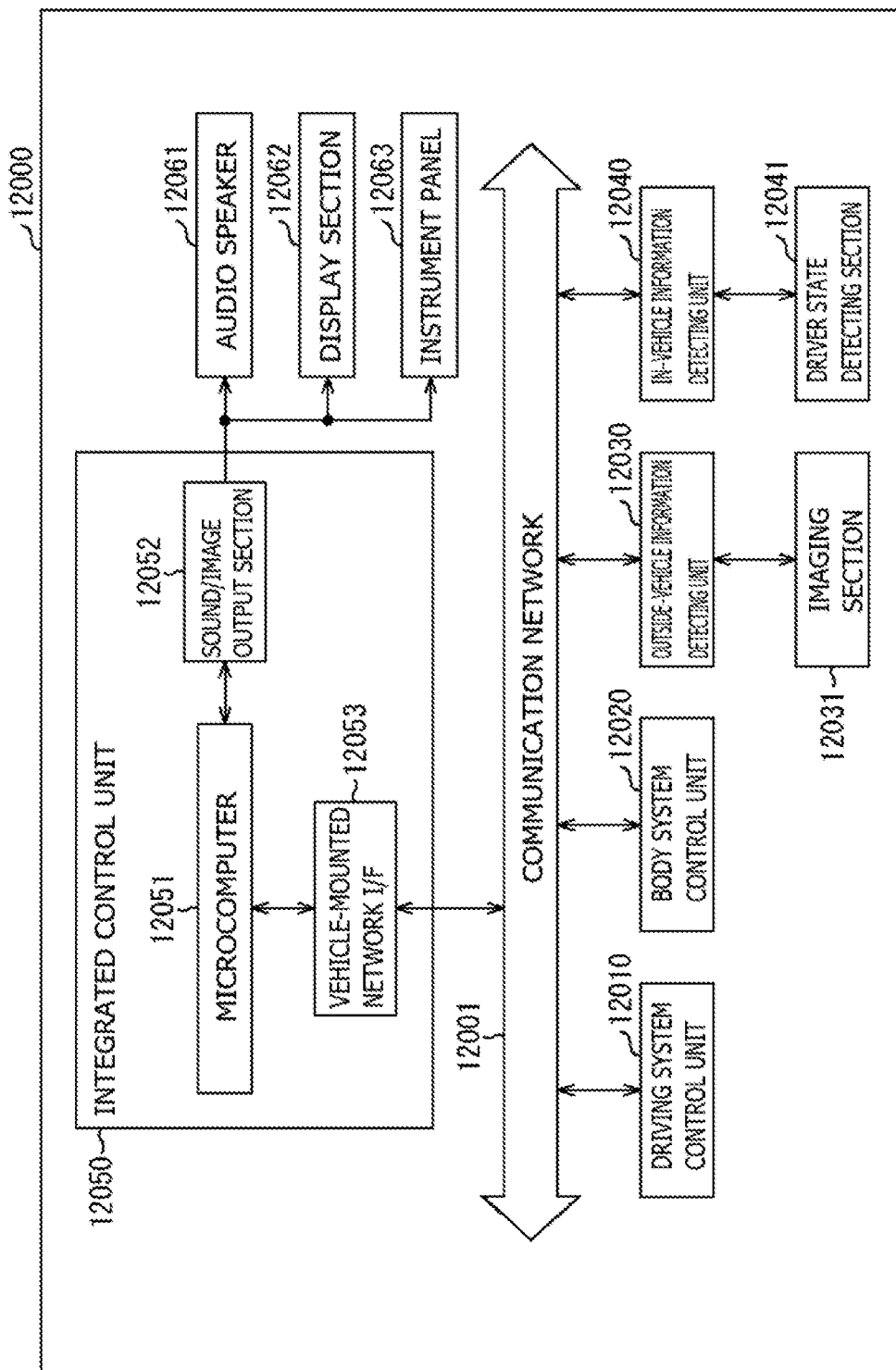
FIG. 41 is a block diagram depicting an example of schematic configuration of a vehicle control system.

FIG. 41 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 41, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 41, an audio speaker 12061, a display section 12062, and an instrument panel 12063 are illustrated as the output device. The display section 12062 may, for example, include at least one of an on-board display and a head-up display.

Figure 42:
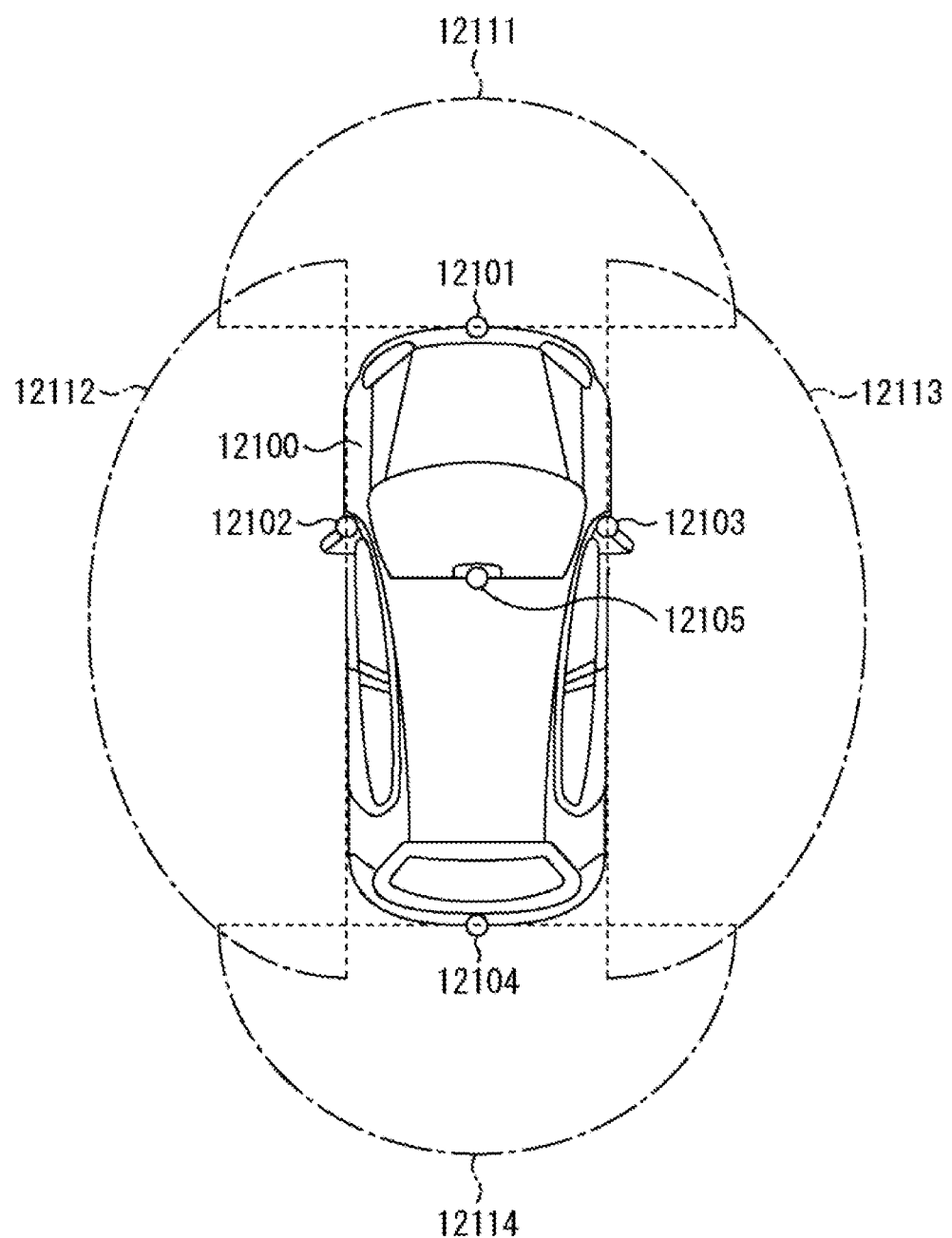
FIG. 42 is a diagram of assistance in explaining an example of installation positions of an outside-vehicle information detecting section and an imaging section.

FIG. 42 is a diagram depicting an example of the installation position of the imaging section 12031.

In FIG. 42, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 42 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Moreover, the technology according to the present disclosure (present technology) may be applied to various products. For example, the technology according to the present disclosure may be applied to an endoscopic surgery system.

Figure 43:
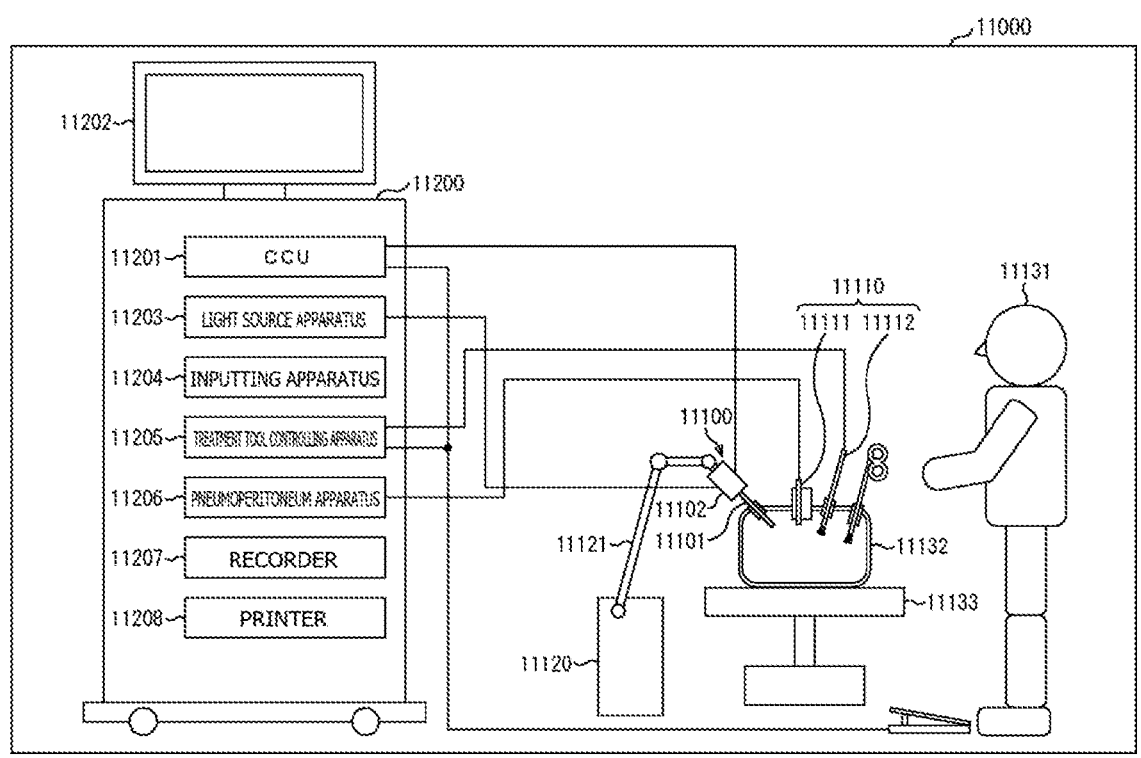
FIG. 43 is a view depicting an example of a schematic configuration of an endoscopic surgery system.

FIG. 43 is a view depicting an example of a schematic configuration of an endoscopic surgery system to which the technology according to an embodiment of the present disclosure (present technology) can be applied.

In FIG. 43, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 44:
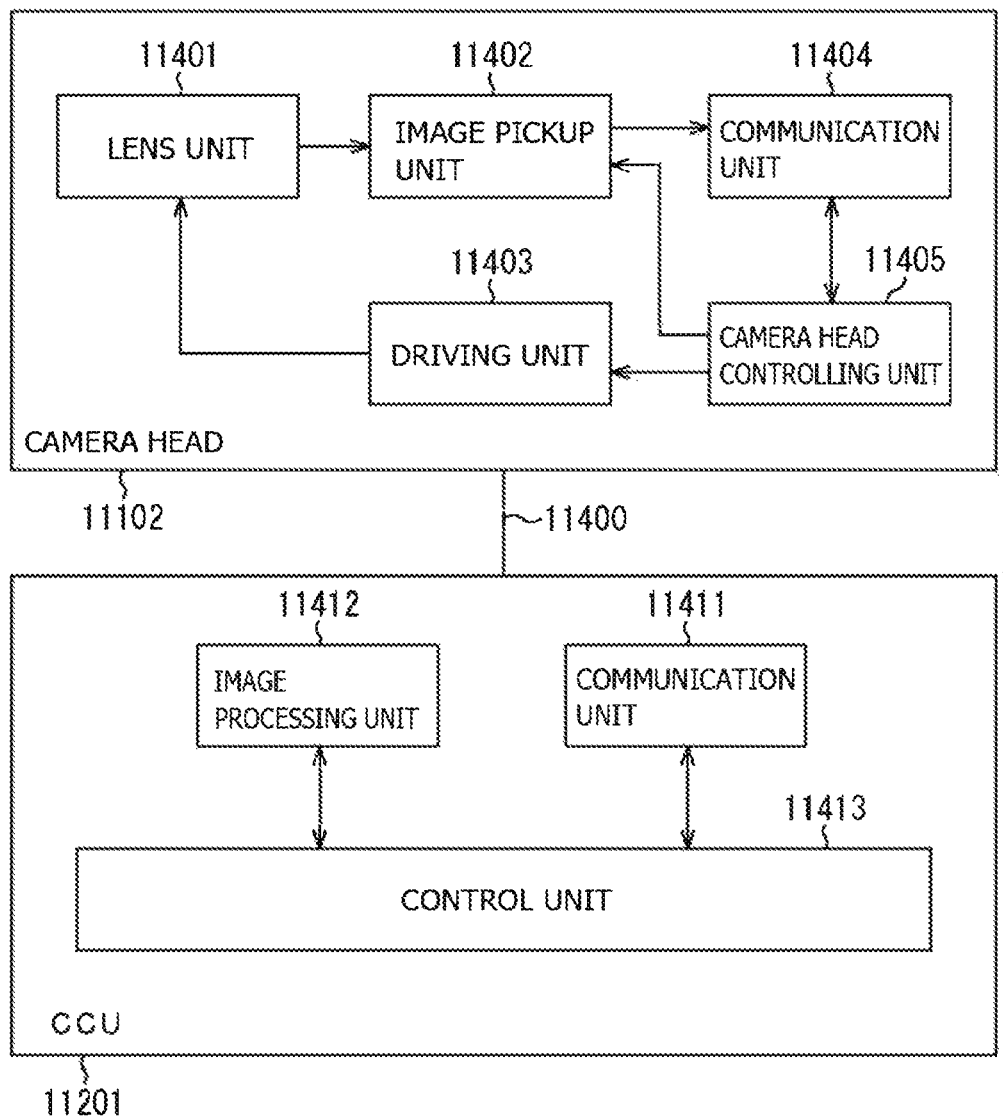
FIG. 44 is a block diagram depicting an example of a functional configuration of a camera head and a camera control unit (CCU).

FIG. 44 is a block diagram depicting an example of a functional configuration of the camera head 11102 and the CCU 11201 depicted in FIG. 43.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that, here, while the endoscopic surgery system has been described as an example, the technology according to the present disclosure may be applied to another system, for example, a microscope surgery system or the like.

Note that the present technology can also employ the following configurations.

[A01] <<Photoelectric Conversion Element>>

A photoelectric conversion element including:

a first compound semiconductor layer made of a first compound semiconductor material having a first conductivity type;

a photoelectric conversion layer formed on the first compound semiconductor layer;

a second compound semiconductor layer covering the photoelectric conversion layer and made of a second compound semiconductor material having the first conductivity type;

a second conductivity type region formed at least in a part of the second compound semiconductor layer, having a second conductivity type different from the first conductivity type, and reaching the photoelectric conversion layer;

an element isolation layer surrounding a lateral surface of the photoelectric conversion layer;

a first electrode formed on the second conductivity type region; and a second electrode electrically connected to the first compound semiconductor layer.

[A02] The photoelectric conversion element according to [A01], in which the second electrode is formed on a same side as the first electrode.

[A03] The photoelectric conversion element according to [A01], in which the second electrode is formed on a surface on a light incident side of the first compound semiconductor layer.

[A04] The photoelectric conversion element according to any one of [A01] to [A03], in which the first compound semiconductor layer, the second compound semiconductor layer, and the element isolation layer are made of a same material.

[A05] The photoelectric conversion element according to [A04], in which the first compound semiconductor layer, the second compound semiconductor layer, the element isolation layer, and the photoelectric conversion layer are made of a group III-V compound semiconductor material.

[A06] The photoelectric conversion element according to [A05], in which the photoelectric conversion layer is made of InGaAs, and the first compound semiconductor layer, the second compound semiconductor layer, and the element isolation layer are made of InP.

[A07] The photoelectric conversion element according to any one of [A04] to [A06], in which a compound semiconductor material constituting the element isolation layer has wider band gap energy than a material constituting the photoelectric conversion layer.

[A08] The photoelectric conversion element according to any one of [A04] to [A07], in which the element isolation layer has a higher impurity concentration than the photoelectric conversion layer.

[A09] The photoelectric conversion element according to any one of [A04] to [A08], in which a portion of the element isolation layer, which is held in contact with the lateral surface of the photoelectric conversion layer, is made of a third compound semiconductor material, and a remaining portion thereof is made of a light shielding material.

[A10] The photoelectric conversion element according to any one of [A01] to [A09], in which light is incident via the first compound semiconductor layer.

[B01] <<Imaging Apparatus>>

An imaging apparatus including:

a plurality of photoelectric conversion elements each of which is the photoelectric conversion element according to any one of [A01] to [A10], the plurality of photoelectric conversion elements being arranged in a two-dimensional matrix form.

[B02] The imaging apparatus according to [B01], further including:

a driving substrate, in which a first electrode constituting each of the photoelectric conversion elements is connected to a first electrode connection part provided on the driving substrate.

[B03] The imaging apparatus according to [B02], in which a second electrode constituting each of the photoelectric conversion elements is connected to a second electrode connection part provided on the driving substrate.

[C01] <<Method for Manufacturing Photoelectric Conversion Element . . . First Aspect>>

A method for manufacturing a photoelectric conversion element, including the steps of:

(A) sequentially forming, on a substrate, a first compound semiconductor layer made of a first compound semiconductor material having a first conductivity type, a photoelectric conversion layer, and a second compound semiconductor layer made of a second compound semiconductor material having the first conductivity type;

(B) forming a recess part at least in the second compound semiconductor layer and the photoelectric conversion layer;

(C) forming an element isolation layer at least inside the recess part;

(D) forming a second conductivity at least in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

[C02] <<Method for Manufacturing Photoelectric Conversion Element . . . Second Aspect>>

A method for manufacturing a photoelectric conversion element, including the steps of:

(A) sequentially forming, on a substrate, a first compound semiconductor layer made of a first compound semiconductor material having a first conductivity type and a photoelectric conversion layer;

(B) forming a recess part at least in the photoelectric conversion layer;

(C) forming an element isolation layer at least inside the recess part and further forming a second compound semiconductor layer made of a second compound semiconductor material having the first conductivity type so as to cover the photoelectric conversion layer;

(D) forming a second conductivity at least in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

[C03] <<Method for Manufacturing Photoelectric Conversion Element . . . Third Aspect>>

A method for manufacturing a photoelectric conversion element, including the steps of:

(A) sequentially forming, on a substrate, a first compound semiconductor layer made of a first compound semiconductor material having a first conductivity type, a photoelectric conversion layer, and a second compound semiconductor layer made of a second compound semiconductor material having the first conductivity type;

(B) forming a second conductivity type region in a part of the second compound semiconductor layer, the second conductivity type region having a second conductivity type different from the first conductivity type and reaching the photoelectric conversion layer;

(C) forming a first electrode on the second conductivity type region;

(D) forming a recess part at least in the photoelectric conversion layer; and (E) forming an element isolation layer at least inside the recess part.

[C04] <<Method for Manufacturing Photoelectric Conversion Element . . . Fourth Aspect>>

A method for manufacturing a photoelectric conversion element, including the steps of:

(A) forming an element isolation layer on a substrate having a first conductivity type to obtain a first compound semiconductor layer surrounded by the element isolation layer and constituted by a surface region of the substrate;

(B) forming a photoelectric conversion layer surrounded by the element isolation layer on the first compound semiconductor layer;

(C) forming a second compound semiconductor layer made of a second compound semiconductor material having the first conductivity type on the photoelectric conversion layer;

(D) forming a second conductivity at least in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

[C05] <<Method for Manufacturing Photoelectric Conversion Element . . . Fifth Aspect>>

A method for manufacturing a photoelectric conversion element, including the steps of:

(A) forming an element isolation layer forming region on a substrate having a first conductivity type to obtain a first compound semiconductor layer surrounded by the element isolation layer forming region and constituted by a surface region of the substrate;

(B) forming a photoelectric conversion layer on the first compound semiconductor layer and the element isolation layer forming region;

(C) forming a second compound semiconductor layer made of a second compound semiconductor material having the first conductivity on the photoelectric conversion layer;

(D) removing portions of the second compound semiconductor layer and the photoelectric conversion layer, which are positioned above the element isolation layer forming region, and embedding an element isolation layer forming material in the removed portions to obtain an element isolation layer;

(E) forming a second conductivity type region in the second compound semiconductor layer, the second conductivity type region having a second conductivity type different from the first conductivity type and reaching the photoelectric conversion layer; and (F) forming a first electrode on the second conductivity type region and forming a second electrode electrically connected to the first compound semiconductor layer.

[C06] <<Method for Manufacturing Photoelectric Conversion Element . . . Sixth Aspect>>

A method for manufacturing a photoelectric conversion element, including the steps of:

(A) forming selective a growth blocking part in a substrate having a first conductivity type;

(B) forming, on the basis of a longitudinal-direction selective epitaxial growth method, a photoelectric conversion layer in a region of the substrate, the region being positioned between the selective growth blocking part and the selective growth blocking part and corresponding to the first compound semiconductor layer;

(C) forming a second compound semiconductor layer made of a second compound semiconductor material having the first conductivity type on an entire surface to obtain an element isolation layer made of a portion of the second compound semiconductor layer, the portion being positioned above the selective growth blocking part;

(D) forming a second conductivity type region in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

[C07] The method for manufacturing the photoelectric conversion element according to any one of [C01] to [C03], in which the element isolation layer is made of a third compound semiconductor material having the first conductivity type, the method further including the step of embedding an insulating material or a light shielding material in a groove part after forming the groove part in the element isolation layer formed inside the recess part.

[C08] The method for manufacturing the photoelectric conversion element according to any one of [C01] to [C07], in which the substrate is finally removed.

REFERENCE SIGNS LIST 10A, 10B, 10C, 10D photoelectric conversion element (imaging element)
11 first photoelectric conversion element
12 second photoelectric conversion element
21 substrate (film forming substrate)
22 buffer layer
23 support substrate
24 insulating film
25 hard mask layer
30 first photoelectric conversion part
31 first compound semiconductor layer
34 photoelectric conversion layer
32 second compound semiconductor layer
32A, 34A polycrystalline material 33, 33' element isolation layer
33A, 33B insulating material layer
33C element isolation layer forming region
33D element isolation layer forming material
35 second conductivity type region
36 covering layer
36A, 36B opening part
37 flattening film
38 condensing lens (on-chip micro lens, OCL)
39 light shielding film
40 recess part
41 groove part
42 insulating material layer or light shielding material layer
51 first electrode
52 second electrode
60 driving substrate
61 first electrode connection part
62 second electrode connection part
71R, 71G, 71B second photoelectric conversion part
81 first interlayer insulating layer
82 second interlayer insulating layer
83, 83R, 83G, 83B color filter
84 third interlayer insulating layer
85 filter layer
86 inter-pixel light shielding layer
100 imaging apparatus
101 imaging element
111 imaging region
112 vertical driving circuit
113 column signal processing circuit
114 horizontal driving circuit
115 output circuit
116 driving control circuit
118 horizontal signal line
200 electronic apparatus (camera)
201 imaging apparatus
210 optical lens
211 shutter apparatus
212 driving circuit
213 signal processing circuit
R second photoelectric conversion part having red photoelectric conversion part
G second photoelectric conversion part having green photoelectric conversion part
B second photoelectric conversion part having blue photoelectric conversion part
IR first photoelectric conversion part

What is claimed is:

1. A photoelectric conversion element, comprising:
a first compound semiconductor layer made of a first compound semiconductor material having a first conductivity type;
a photoelectric conversion layer formed on the first compound semiconductor layer;
a second compound semiconductor layer covering the photoelectric conversion layer and made of a second compound semiconductor material having the first conductivity type;
a second conductivity type region formed at least in a part of the second compound semiconductor layer, having a second conductivity type different from the first conductivity type, and reaching the photoelectric conversion layer;
an element isolation layer surrounding a lateral surface of the photoelectric conversion layer;
a first electrode formed on the second conductivity type region; and
a second electrode electrically connected to the first compound semiconductor layer,
wherein the second electrode is formed on a surface on a light incident side of the first compound semiconductor layer.

2. A photoelectric conversion element, comprising:
a first compound semiconductor layer made of a first compound semiconductor material having a first conductivity type;
a photoelectric conversion layer formed on the first compound semiconductor layer;
a second compound semiconductor layer covering the photoelectric conversion layer and made of a second compound semiconductor material having the first conductivity type;
a second conductivity type region formed at least in a part of the second compound semiconductor layer, having a second conductivity type different from the first conductivity type, and reaching the photoelectric conversion layer;
an element isolation layer surrounding a lateral surface of the photoelectric conversion layer;
a first electrode formed on the second conductivity type region; and
a second electrode electrically connected to the first compound semiconductor layer,
wherein the first compound semiconductor layer, the second compound semiconductor layer and the element isolation layer are made of a same material.

3. The photoelectric conversion element according to claim 2, wherein the second electrode is formed on a same side as the first electrode.

4. The photoelectric conversion element according to claim 2, wherein the first compound semiconductor layer, the second compound semiconductor layer, the element isolation layer, and the photoelectric conversion layer are made of a group III-V compound semiconductor material.

5. The photoelectric conversion element according to claim 4, wherein the photoelectric conversion layer is made of InGaAs, and the first compound semiconductor layer, the second compound semiconductor layer, and the element isolation layer are made of InP.

6. The photoelectric conversion element according to claim 2, wherein a compound semiconductor material constituting the element isolation layer has wider band gap energy than a material constituting the photoelectric conversion layer.

7. The photoelectric conversion element according to claim 2, wherein the element isolation layer has a higher impurity concentration than the photoelectric conversion layer.

8. The photoelectric conversion element according to claim 2, wherein a portion of the element isolation layer, which is held in contact with the lateral surface of the photoelectric conversion layer, is made of a third compound semiconductor material, and a remaining portion thereof is made of a light shielding material.

9. A photoelectric conversion element comprising:
a first compound semiconductor layer made of a first compound semiconductor material having a first conductivity type;
a photoelectric conversion layer formed on the first compound semiconductor layer;
a second compound semiconductor layer covering the photoelectric conversion layer and made of a second compound semiconductor material having the first conductivity type;

a second conductivity type region formed at least in a part of the second compound semiconductor layer, having a second conductivity type different from the first conductivity type, and reaching the photoelectric conversion layer;

an element isolation layer surrounding a lateral surface of the photoelectric conversion layer;

a first electrode formed on the second conductivity type region; and a second electrode electrically connected to the first compound semiconductor layer, wherein light is incident via the first compound semiconductor layer.

10. An imaging apparatus comprising:

a plurality of photoelectric conversion elements each of which is the photoelectric conversion element according to claim 9, the plurality of photoelectric conversion elements being arranged in a two-dimensional matrix form.

11. The imaging apparatus according to claim 10, further comprising:

a driving substrate, wherein a first electrode constituting each of the photoelectric conversion elements is connected to a first electrode connection part provided on the driving substrate.

12. The imaging apparatus according to claim 11, wherein a second electrode constituting each of the photoelectric conversion elements is connected to a second electrode connection part provided on the driving substrate.

13. A method for manufacturing a photoelectric conversion element, comprising the steps of:

(A) forming a plurality of selective growth blocking parts in a substrate having a first conductivity type;

(B) forming, on a basis of a longitudinal-direction selective epitaxial growth method, a photoelectric conversion layer in a region of the substrate, the region being positioned between a first one of the selective growth blocking parts and a second one of the selective growth blocking parts and corresponding to the first compound semiconductor layer;

(C) forming a second compound semiconductor layer made of a second compound semiconductor material having the first conductivity type on an entire surface to obtain an element isolation layer made of a portion of the second compound semiconductor layer, the portion being positioned above the first and second selective growth blocking parts;

(D) forming a second conductivity type region in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer.

14. A method for manufacturing a photoelectric conversion element, comprising the steps of:

(A) sequentially forming, on a substrate, a first compound semiconductor layer made of a first compound semiconductor material having a first conductivity type, a photoelectric conversion layer, and a second compound semiconductor layer made of a second compound semiconductor material having the first conductivity type;

(B) forming a recess part at least in the second compound semiconductor layer and the photoelectric conversion layer;

(C) forming an element isolation layer at least inside the recess part;

(D) forming a second conductivity type region at least in a part of the second compound semiconductor layer, the second conductivity type region having a second conductivity type different from the first conductivity type and reaching the photoelectric conversion layer; and (E) forming a first electrode on the second conductivity type region and forming a second electrode electrically connected to the first compound semiconductor layer, wherein the element isolation layer is made of a third compound semiconductor material having the first conductivity type, the method further comprising the step of embedding an insulating material or a light shielding material in a groove part after forming the groove part in the element isolation layer formed inside the recess part.

* * * * *